(12) United States Patent
Yamazaki et al.

(10) Patent No.: US 10,504,925 B2
(45) Date of Patent: Dec. 10, 2019

(54) SEMICONDUCTOR DEVICE AND METHOD FOR MANUFACTURING SEMICONDUCTOR DEVICE

(71) Applicant: Semiconductor Energy Laboratory Co., Ltd., Atsugi-shi, Kanagawa-ken (JP)

(72) Inventors: Shunpei Yamazaki, Tokyo (JP); Katsuaki Tochibayashi, Kanagawa (JP); Kenichi Shiohama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/667,863

(22) Filed: Aug. 3, 2017

(65) Prior Publication Data

US 2018/0040641 A1    Feb. 8, 2018

(30) Foreign Application Priority Data

Aug. 8, 2016    (JP) .................. 2016-155376

(51) Int. Cl.
*H01L 29/10* (2006.01)
*H01L 29/12* (2006.01)
(Continued)

(52) U.S. Cl.
CPC .......... *H01L 27/1225* (2013.01); *H01L 21/44* (2013.01); *H01L 21/467* (2013.01);
(Continued)

(58) Field of Classification Search
CPC . H01L 29/22; H01L 29/247; H01L 29/78606; H01L 29/78648; H01L 29/7869; H01L 29/78693; H01L 29/78696
See application file for complete search history.

(56) References Cited

U.S. PATENT DOCUMENTS 8,384,080 B2    2/2013    Taniguchi et al.
8,547,771 B2    10/2013   Koyama
(Continued)

FOREIGN PATENT DOCUMENTS

JP    2011-124360 A    6/2011
JP    2011-138934 A    7/2011
JP    2012-257187 A    12/2012

*Primary Examiner* — Meiya Li
(74) *Attorney, Agent, or Firm* — Fish & Richardson P.C.

(57) ABSTRACT

A semiconductor device having favorable reliability which is capable of retaining data for a long time is provided. The semiconductor device includes a first gate electrode, a first gate insulator over the first gate electrode, a first oxide over the first gate insulator, a second oxide and a third oxide over the first oxide, a first conductor over the second oxide, a second conductor over the third oxide, a fourth oxide over the first oxide, the first conductor, and the second conductor, a second gate insulator over the fourth oxide, and a second gate electrode over the second gate insulator. The first conductor is in contact with a top surface of the second oxide, a side surface of the second oxide that faces the third oxide, and part of a top surface of the first oxide. The second conductor is in contact with a top surface of the third oxide, a side surface of the third oxide that faces the second oxide, and part of the top surface of the first oxide. The fourth oxide is in contact with part of the top surface of the first oxide between the first conductor and the second conductor.

8 Claims, 22 Drawing Sheets

(51) Int. Cl.
- *H01L 27/12* (2006.01)
- *H01L 21/44* (2006.01)
- *H01L 21/467* (2006.01)
- *H01L 21/477* (2006.01)
- *H01L 29/24* (2006.01)
- *H01L 29/66* (2006.01)
- *H01L 29/786* (2006.01)
- *H01L 29/45* (2006.01)
- *H01L 29/423* (2006.01)

(52) U.S. Cl.
CPC ........ *H01L 21/477* (2013.01); *H01L 27/1207* (2013.01); *H01L 27/1259* (2013.01); *H01L 29/1054* (2013.01); *H01L 29/24* (2013.01); *H01L 29/45* (2013.01); *H01L 29/66969* (2013.01); *H01L 29/7869* (2013.01); *H01L 29/78618* (2013.01); *H01L 29/78645* (2013.01); *H01L 29/78648* (2013.01); *H01L 29/78696* (2013.01); H01L 29/4238 (2013.01); H01L 29/42376 (2013.01)

(56) References Cited

U.S. PATENT DOCUMENTS

| | | | |
|---|---|---|---|
| 8,692,252 B2 | 4/2014 | Takata et al. |
| 8,995,174 B2 | 3/2015 | Koyama |
| 9,006,736 B2 | 4/2015 | Sasagawa et al. |
| 9,166,060 B2 | 10/2015 | Yamazaki et al. |
| 9,209,307 B2 | 12/2015 | Yamazaki et al. |
| 9,281,409 B2 | 3/2016 | Yamazaki et al. |
| 9,324,876 B2 | 4/2016 | Kobayashi et al. |
| 9,343,579 B2 | 5/2016 | Yamazaki et al. |
| 9,349,875 B2 | 5/2016 | Tsubuku et al. |
| 9,368,607 B2 | 6/2016 | Yamazaki et al. |
| 9,397,153 B2 | 7/2016 | Tanaka et al. |
| 9,401,432 B2 | 7/2016 | Kobayashi et al. |
| 9,419,145 B2 | 8/2016 | Sasagawa et al. |
| 9,450,080 B2 | 9/2016 | Yamazaki et al. |
| 9,455,337 B2 | 9/2016 | Hodo et al. |
| 9,461,179 B2 | 10/2016 | Kobayashi et al. |
| 9,472,678 B2 | 10/2016 | Yamazaki et al. |
| 9,496,411 B2 | 11/2016 | Yamazaki et al. |
| 9,666,724 B2 | 5/2017 | Yamazaki et al. |
| 9,680,024 B2 | 6/2017 | Yamazaki et al. |
| 9,685,563 B2 | 6/2017 | Tsubuku et al. |
| 9,691,904 B2 | 6/2017 | Sasagawa et al. |
| 9,705,004 B2 | 7/2017 | Kobayashi et al. |
| 9,711,656 B2 | 7/2017 | Yamazaki et al. |
| 9,722,088 B2 | 8/2017 | Hanaoka et al. |
| 9,768,317 B2 | 9/2017 | Ito et al. |
| 9,799,775 B2 | 10/2017 | Kobayashi et al. |
| 2014/0151685 A1* | 6/2014 | Tokunaga ......... H01L 29/78648 257/43 |
| 2015/0155362 A1 | 6/2015 | Nakazawa et al. |
| 2015/0179803 A1 | 6/2015 | Yamazaki et al. |
| 2015/0280691 A1 | 10/2015 | Koyama |
| 2015/0325708 A1 | 11/2015 | Yakubo et al. |
| 2016/0181438 A1 | 6/2016 | Yamazaki et al. |
| 2016/0329436 A1 | 11/2016 | Kobayashi et al. |
| 2017/0012135 A1 | 1/2017 | Tanaka et al. |
| 2017/0033230 A1 | 2/2017 | Yamazaki et al. |
| 2017/0125553 A1 | 5/2017 | Yamazaki et al. |
| 2017/0229486 A1 | 8/2017 | Matsuda et al. |
| 2017/0236842 A1 | 8/2017 | Matsuda et al. |
| 2017/0236941 A1 | 8/2017 | Yamazaki et al. |
| 2017/0271523 A1 | 9/2017 | Hanaoka et al. |
| 2017/0278978 A1 | 9/2017 | Yamazaki et al. |
| 2017/0317111 A1 | 11/2017 | Ando et al. |
| 2018/0033807 A1 | 2/2018 | Matsuda et al. |

* cited by examiner

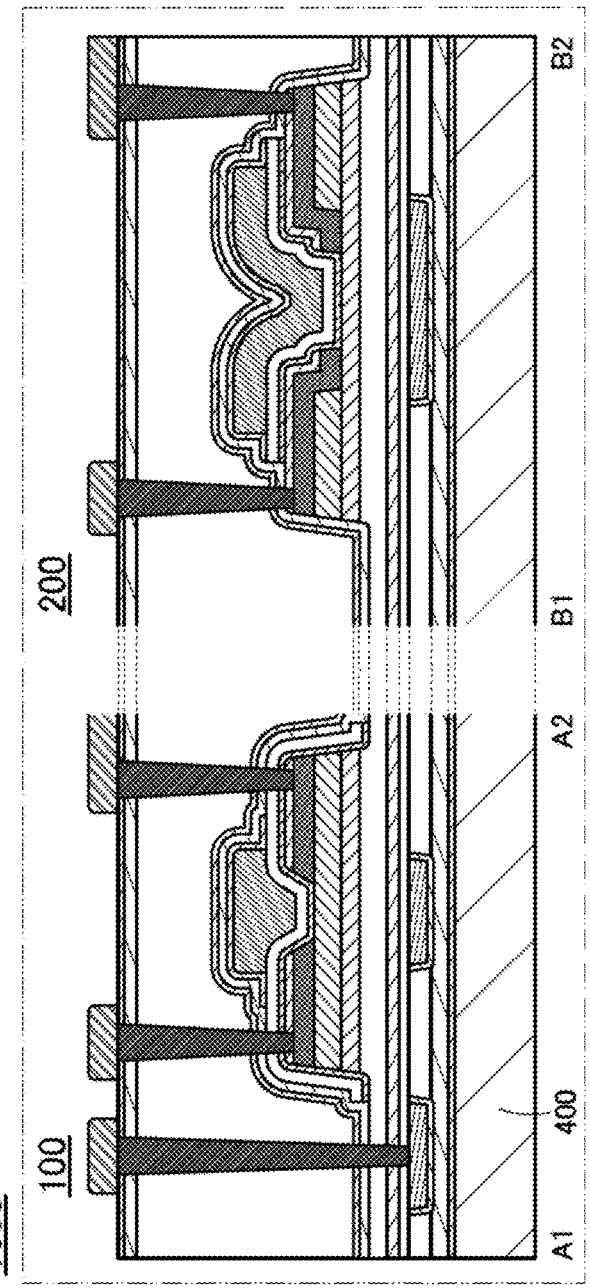
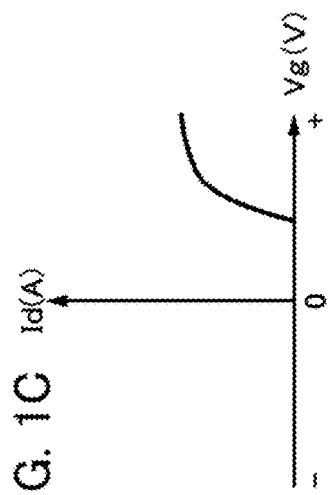
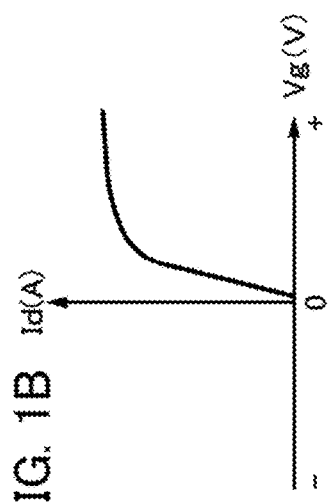
FIG. 1A
FIG. 1B
FIG. 1C

FIG. 6A
100
FIG. 6B
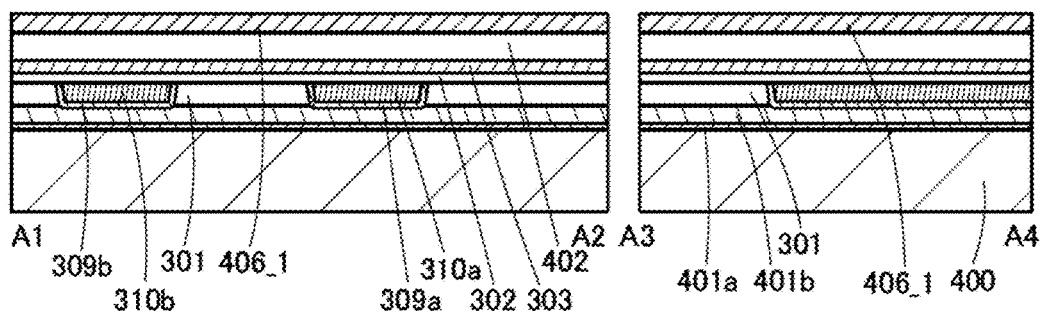
FIG. 6C
200
FIG. 6D
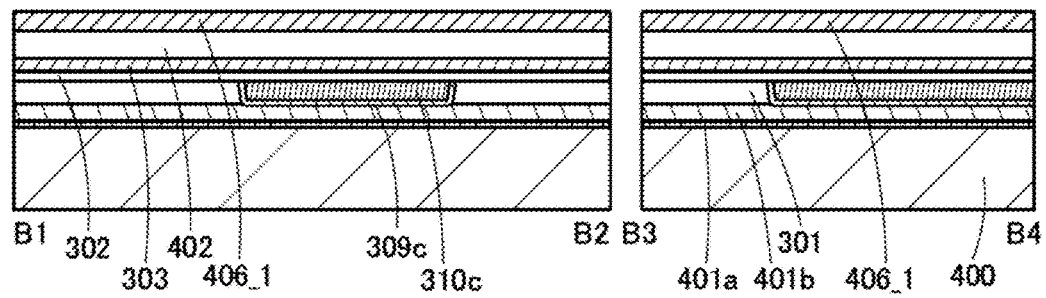

FIG. 7A
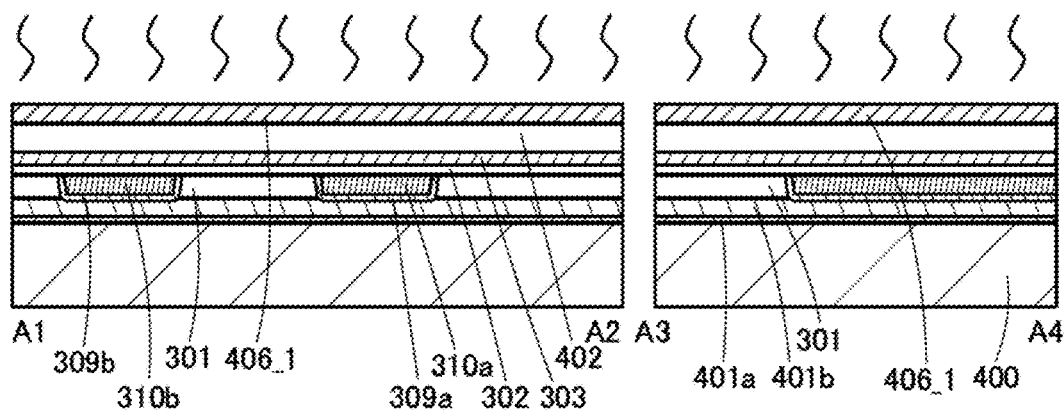
FIG. 7B
FIG. 7C
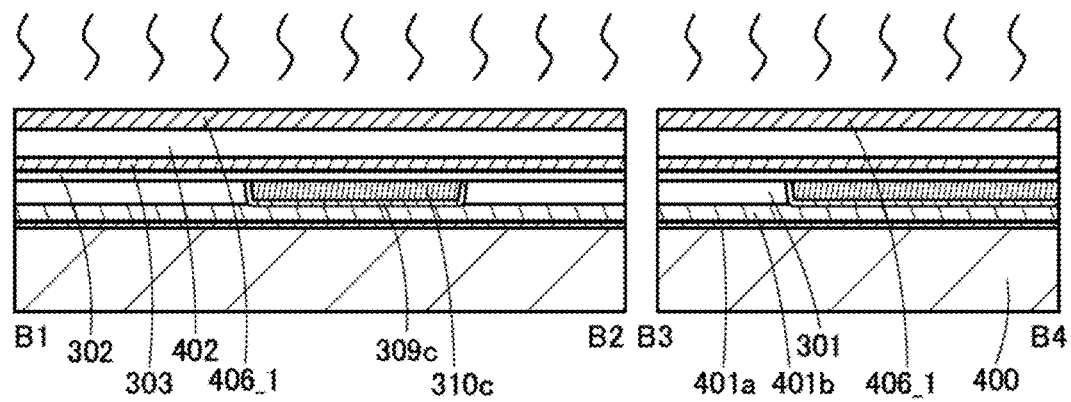
FIG. 7D

FIG. 8A
FIG. 8B
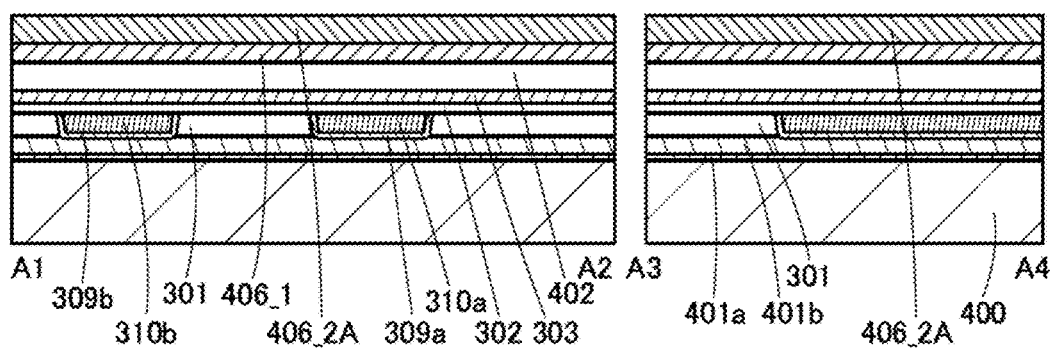
FIG. 8C
FIG. 8D
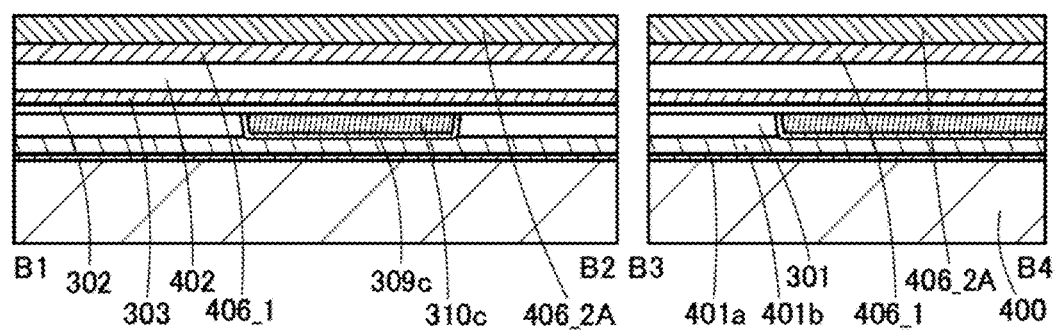

FIG. 9A
100
FIG. 9B
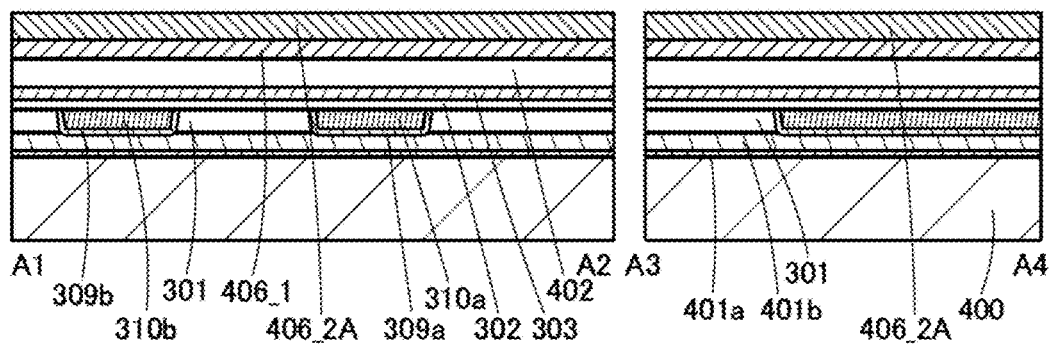
FIG. 9C
200
FIG. 9D
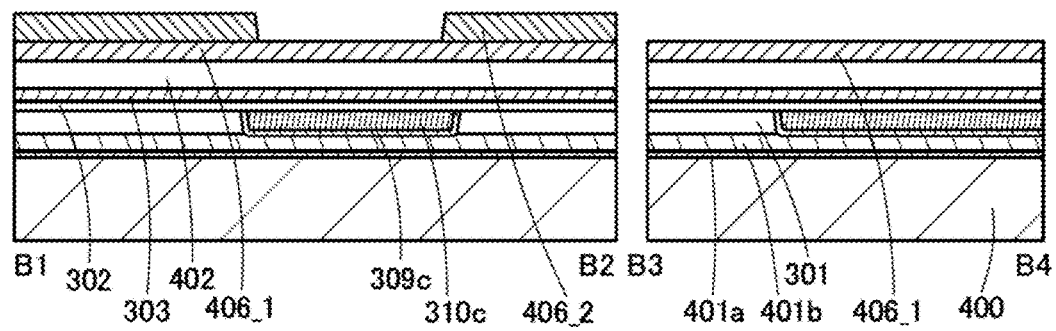

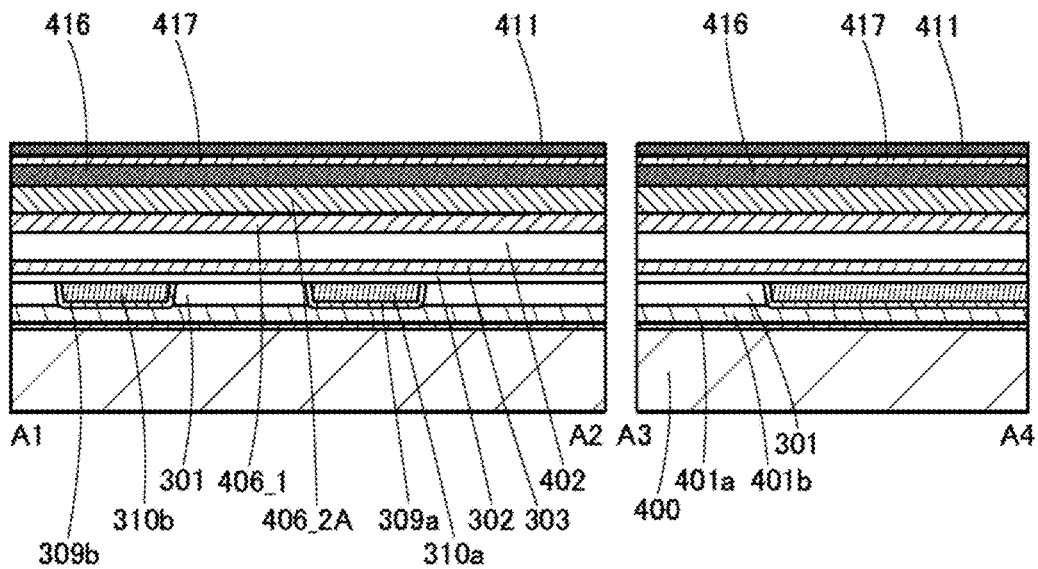
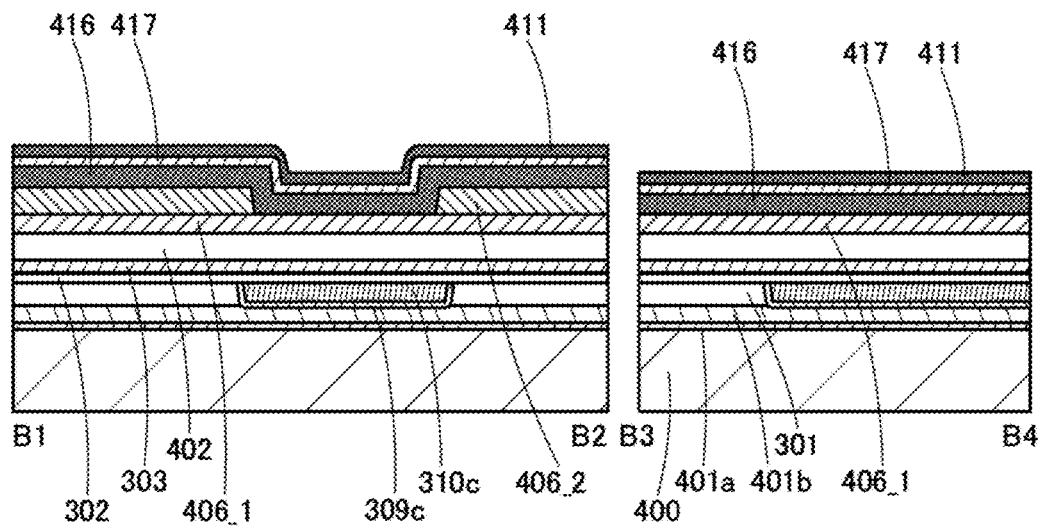

FIG. 11A
FIG. 11B
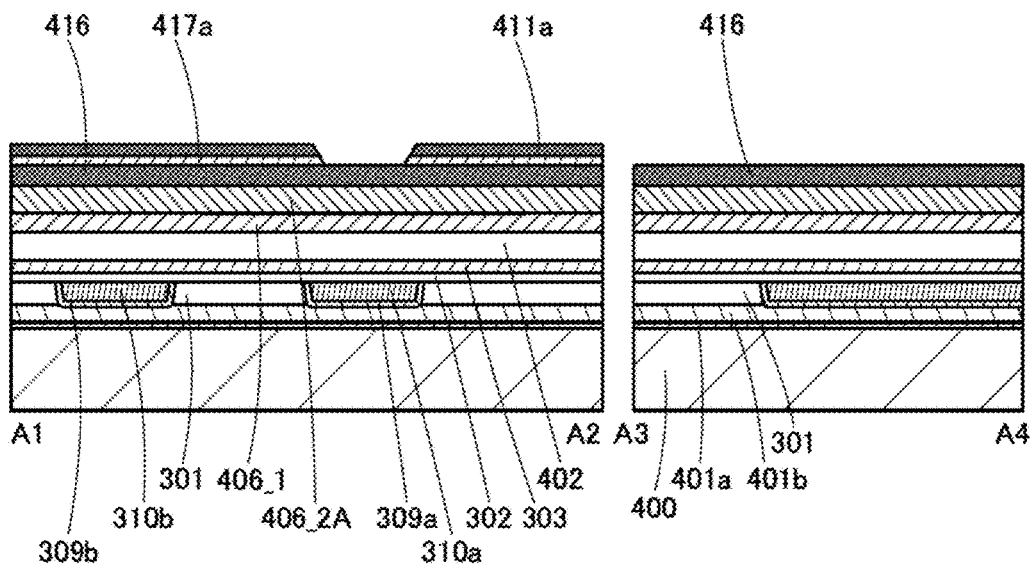
FIG. 11C
FIG. 11D
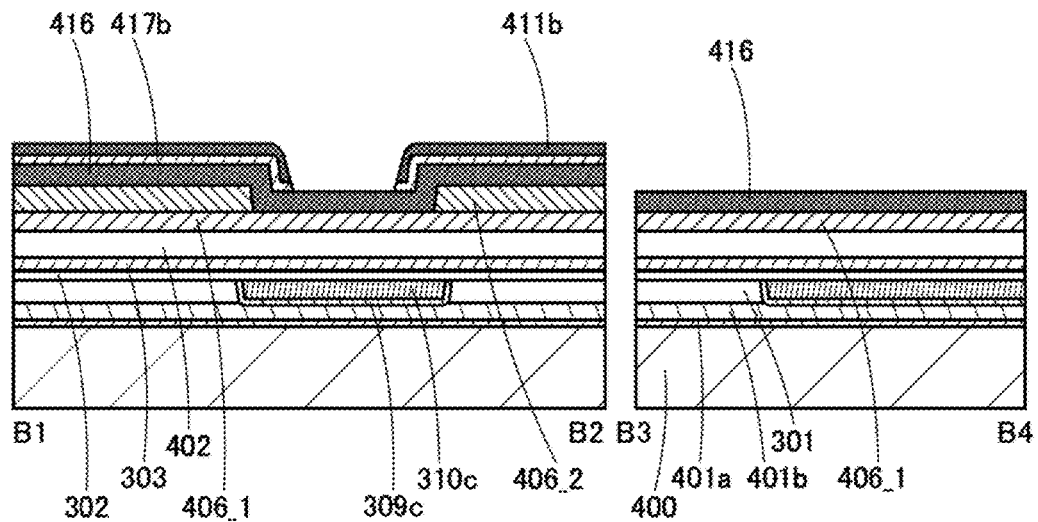

FIG. 12A
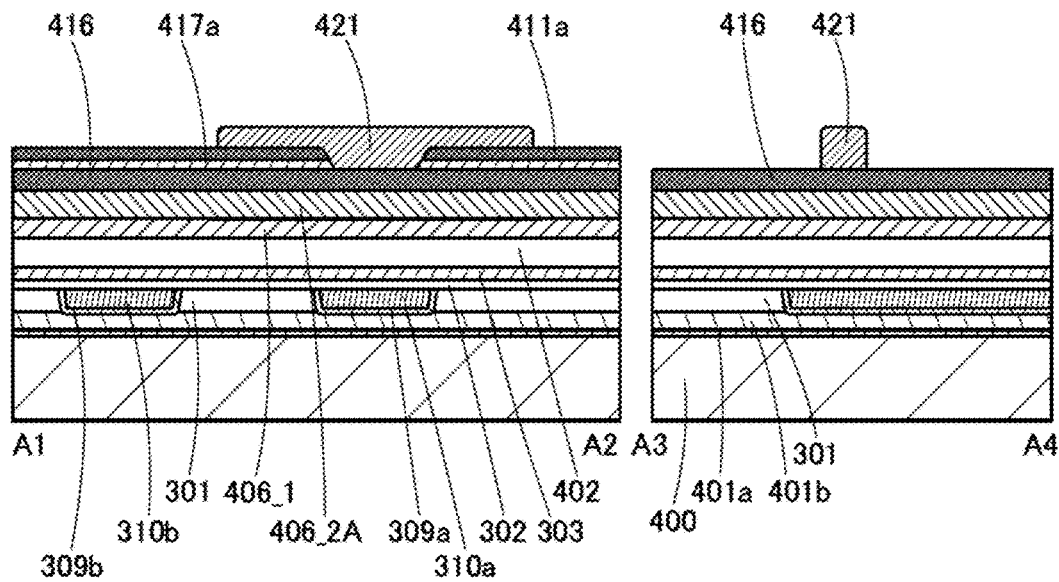
FIG. 12B
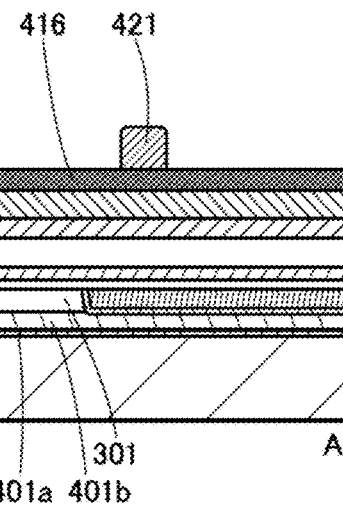
FIG. 12C
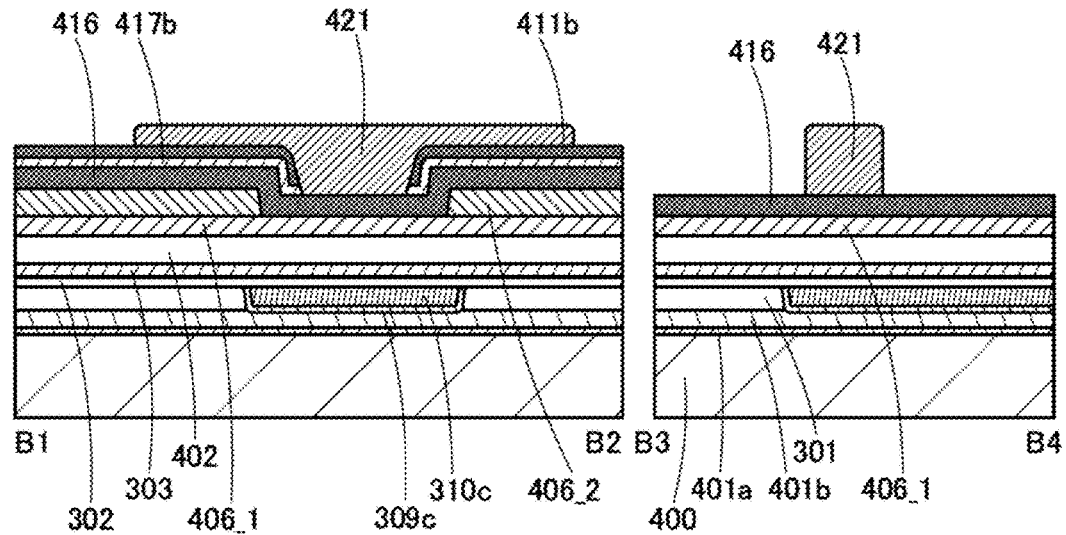
FIG. 12D

FIG. 15A
100
FIG. 15B
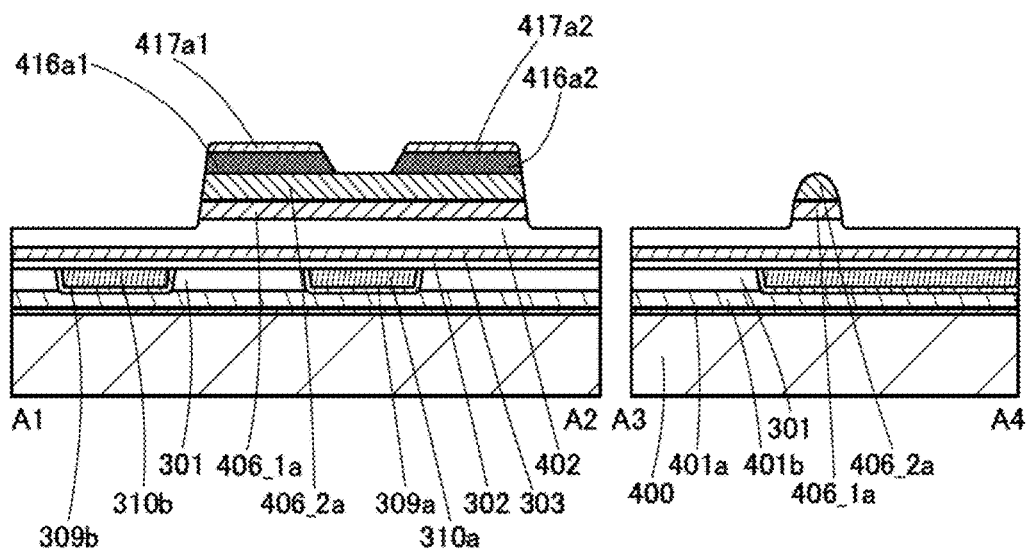
FIG. 15C
200
FIG. 15D
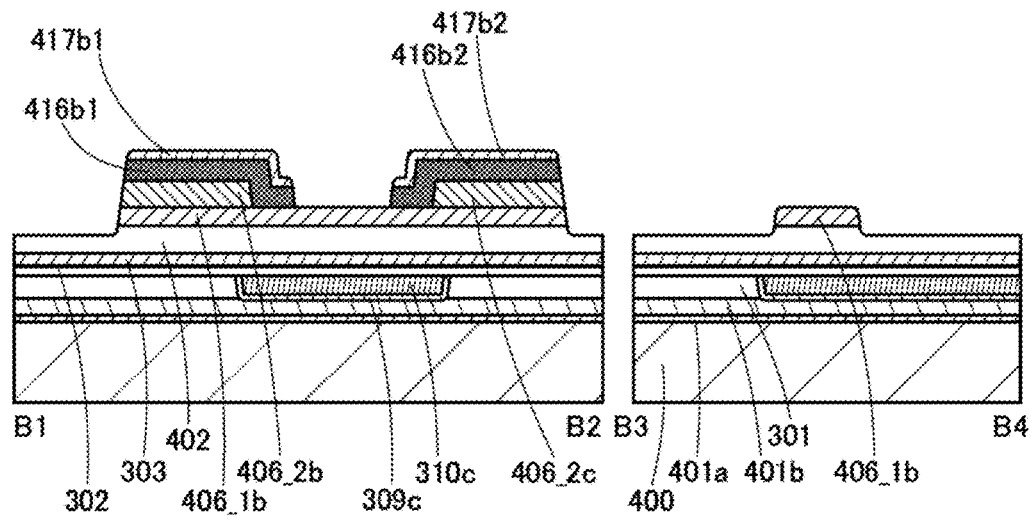

FIG. 16A
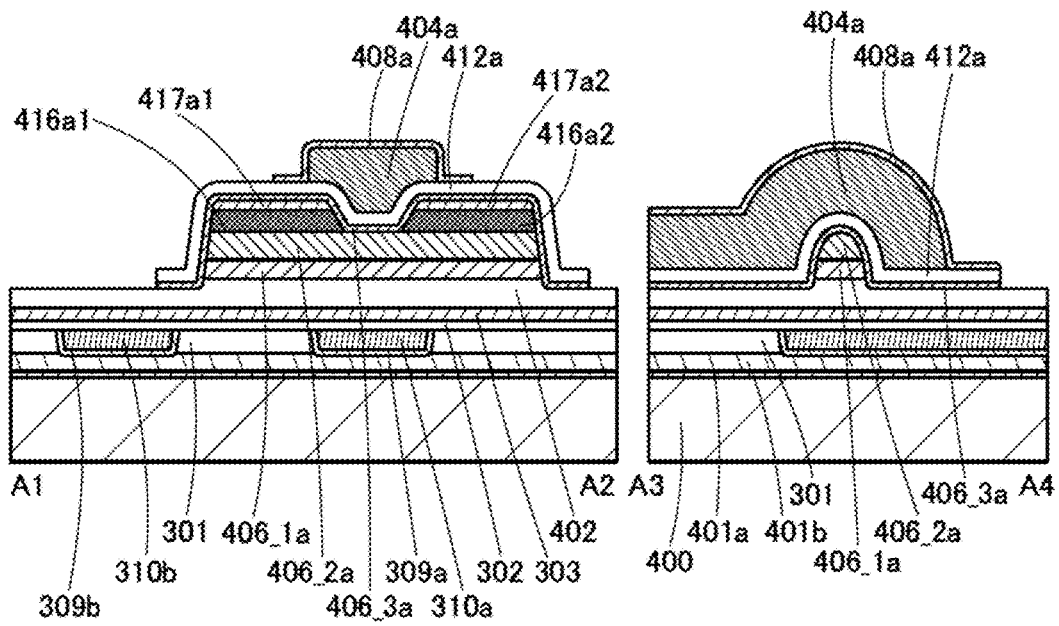
FIG. 16B
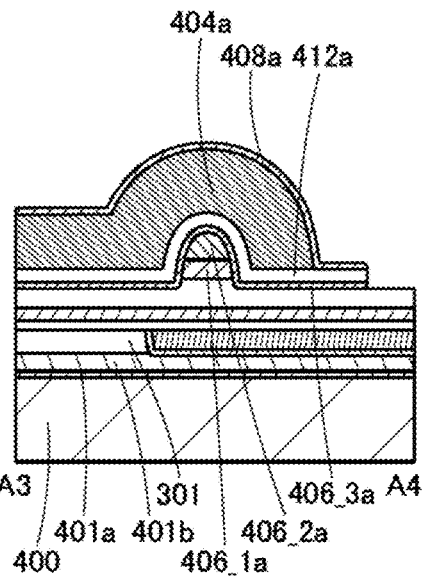
FIG. 16C
FIG. 16D
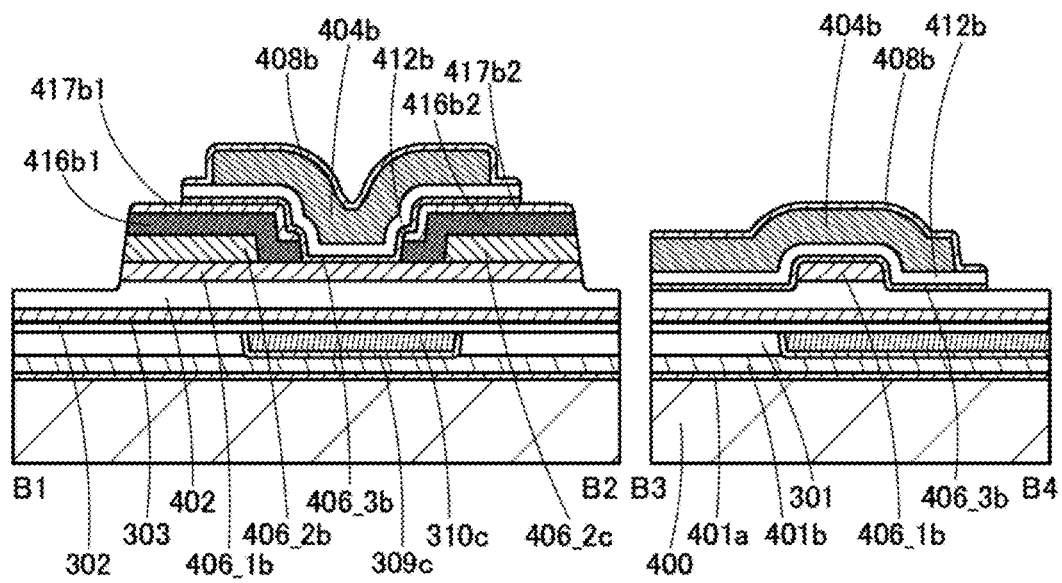

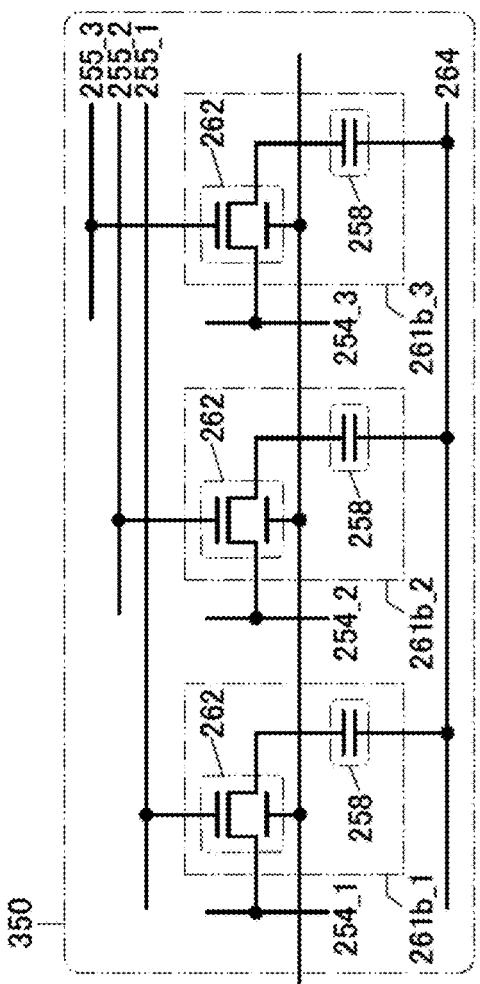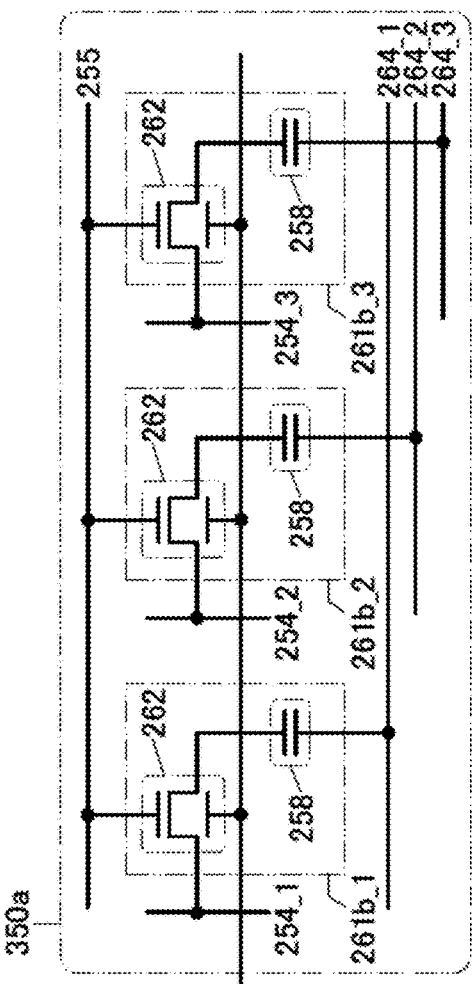
FIG. 20A
FIG. 20B

SEMICONDUCTOR DEVICE AND METHOD FOR MANUFACTURING SEMICONDUCTOR DEVICE

BACKGROUND OF THE INVENTION

1. Field of the Invention

One embodiment of the present invention relates to a semiconductor device and a manufacturing method of the semiconductor device. Alternatively, one embodiment of the present invention relates to an electronic device.

Note that one embodiment of the present invention is not limited to the above technical field. One embodiment of the invention disclosed in this specification and the like relates to an object, a method, or a manufacturing method. In addition, one embodiment of the present invention relates to a process, a machine, manufacture, or a composition of matter.

In this specification and the like, a semiconductor device indicates all the devices that can function by utilizing semiconductor characteristics. It can be said that a display device (e.g., a liquid crystal display device and a light-emitting display device), a projection device, a lighting device, an electro-optical device, a power storage device, a memory device, a semiconductor circuit, an imaging device, an electronic device, and the like include a semiconductor device in some cases.

2. Description of the Related Art

A technique in which a transistor is formed using a semiconductor thin film has been attracting attention. Such a transistor is applied to a wide range of electronic devices such as an integrated circuit (IC) and an image display device (also simply referred to as a display device). A silicon-based semiconductor material is widely known as a material for a semiconductor thin film applicable to a transistor. As another material, an oxide semiconductor has been attracting attention.

A technique in which a transistor is formed using a semiconductor thin film formed over a substrate having an insulating surface has been attracting attention.

It is known that a transistor including an oxide semiconductor has an extremely small leakage current in an off state. For example, a low-power-consumption CPU utilizing a characteristic of small leakage current of the transistor including an oxide semiconductor is disclosed (see Patent Document 1).

In addition, a technique in which oxide semiconductor layers with different electron affinities (or conduction band minimum states) are stacked to increase the carrier mobility of a transistor is disclosed (see Patent Documents 2 and 3).

In recent years, demand for an integrated circuit in which transistors and the like are integrated with high density has risen with reductions in the size and weight of an electronic device. In addition, the producibility of the semiconductor device including an integrated circuit is required to be improved.

REFERENCE

Patent Document

[Patent Document 1] Japanese Published Patent Application No. 2012-257187
[Patent Document 2] Japanese Published Patent Application No. 2011-124360
[Patent Document 3] Japanese Published Patent Application No. 2011-138934

SUMMARY OF THE INVENTION

An object of one embodiment of the present invention is to provide a semiconductor device having favorable electrical characteristics. Another object of one embodiment of the present invention is to provide a semiconductor device having favorable reliability. Another object of one embodiment of the present invention is to provide a semiconductor device that can be miniaturized or highly integrated. Another object of one embodiment of the present invention is to provide a semiconductor device with high producibility.

Another object of one embodiment of the present invention is to provide a semiconductor device capable of retaining data for a long time. Another object of one embodiment of the present invention is to provide a semiconductor device capable of high-speed data writing. Another object of one embodiment of the present invention is to provide a semiconductor device with high design flexibility. Another object of one embodiment of the present invention is to provide a low-power semiconductor device. Another object of one embodiment of the present invention is to provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

A first transistor and a second transistor having different electrical characteristics from those of the first transistor are provided over the same layer. For example, a first transistor having a first threshold voltage and a second transistor having a second threshold voltage are provided over the same layer. An oxide layer where a channel of the first transistor is formed and an oxide layer where a channel of the second transistor is formed are formed using semiconductor materials having different electron affinities.

Providing transistors having different electrical characteristics in one semiconductor device can increase circuit design flexibility. On the other hand, the transistors need to be separately manufactured; thus, the number of manufacturing steps of the semiconductor device is drastically increased. The drastic increase in manufacturing steps easily leads a decrease in yield, and the producibility of the semiconductor device is significantly decreased in some cases. According to one embodiment of the present invention, transistors having different electrical characteristics can be provided in one semiconductor device, without drastic increase in the manufacturing steps.

One embodiment of the present invention is a semiconductor device including a first gate electrode, a first gate insulator over the first gate electrode, a first oxide over the first gate insulator, a second oxide and a third oxide over the first oxide, a first conductor over the second oxide, a second conductor over the third oxide, a fourth oxide over the first oxide, the first conductor, and the second conductor, a second gate insulator over the fourth oxide, and a second gate electrode over the second gate insulator. The first conductor is in contact with a top surface of the second oxide, a side surface of the second oxide that faces the third oxide, and part of a top surface of the first oxide. The second conductor is in contact with a top surface of the third oxide, a side surface of the third oxide that faces the second oxide, and part of the top surface of the first oxide. The fourth oxide is in contact with part of the top surface of the first oxide between the first conductor and the second conductor.

In the above embodiment, the first to fourth oxides may each contain a metal oxide.

In any of the above embodiments, the fourth oxide may have a wider bandgap than the first to third oxides.

In any of the above embodiments, the first to third oxides may each contain In and Zn.

In any of the above embodiments, the fourth oxide may contain Ga.

One embodiment of the present invention is a semiconductor device including a first transistor and a second transistor. The first transistor includes a first gate electrode, a first gate insulator over the first gate electrode, a first oxide over the first gate insulator, a second oxide and a third oxide over the first oxide, a first conductor over the second oxide, a second conductor over the third oxide, a fourth oxide over the first oxide, the first conductor, and the second conductor, a second gate insulator over the fourth oxide, and a second gate electrode over the second gate insulator. The first conductor is in contact with a top surface of the second oxide, a side surface of the second oxide that faces the third oxide, and part of a top surface of the first oxide. The second conductor is in contact with a top surface of the third oxide, a side surface of the third oxide that faces the second oxide, and part of the top surface of the first oxide. The fourth oxide is in contact with part of the top surface of the first oxide between the first conductor and the second conductor. The second transistor includes a third gate electrode, a third gate insulator over the third gate electrode, a fifth oxide over the third gate insulator, a sixth oxide over the fifth oxide, a third conductor and a fourth conductor over the sixth oxide, a seventh oxide over the sixth oxide, the third conductor, and the fourth conductor, a fourth gate insulator over the seventh oxide, and a fourth gate electrode over the fourth gate insulator. The third conductor and the fourth conductor are in contact with part of a top surface of the sixth oxide. The seventh oxide is in contact with part of the top surface of the sixth oxide between the third conductor and the fourth conductor.

In any of the above embodiments, the first to seventh oxides may each contain a metal oxide.

In any of the above embodiments, the fourth oxide may have a wider bandgap than the first to third oxides, the seventh oxide may have a wider bandgap than the fifth and sixth oxides, and the first oxide may have a wider bandgap than the sixth oxide.

In any of the above embodiments, the first and fifth oxides may have the same composition, the second, third, and sixth oxides may have the same composition, and the fourth and seventh oxides may have the same composition.

In any of the above embodiments, the first gate electrode, one of the first conductor and the second conductor, and the third gate electrode may be electrically connected to each other.

In any of the above embodiments, the first gate electrode, one of the first conductor and the second conductor, the second gate electrode, and the third gate electrode may be electrically connected to each other.

In any of the above embodiments, the first transistor may have better normally-off electrical characteristics than the second transistor.

One embodiment of the present invention is a manufacturing method of a semiconductor device, including following steps: forming a first gate electrode and a second gate electrode, forming a first gate insulator over the first gate electrode and the second gate electrode, forming a first oxide over the first gate insulator, performing heat treatment on the first oxide, forming a second oxide over the first oxide, performing wet etching treatment to form an opening in the second oxide such that it reaches a top surface of the first oxide and overlaps with part of the first gate electrode, forming a first conductor over the first oxide and the second oxide, forming a first etching mask over the first conductor such that the first etching mask includes an opening in at least part of a region overlapping with the first gate electrode and forming a second etching mask over the first conductor such that the second etching mask includes an opening in at least part of a region overlapping with the second gate electrode, forming a first resist mask over the opening in the first etching mask such that the first resist mask includes a region overlapping with the first gate electrode and forming a second resist mask over the opening in the second etching mask such that the second resist mask includes a region overlapping with the second gate electrode, performing etching treatment on the first conductor, the first etching mask, and the second etching mask to form a second conductor and a third etching mask under the first resist mask and a third conductor and a fourth etching mask under the second resist mask, performing etching treatment on the first oxide and the second oxide to form a third oxide and a fourth oxide under the second conductor, a fifth oxide under the second conductor, the third oxide, and the fourth oxide, a sixth oxide under the third conductor, and a seventh oxide under the sixth oxide, performing etching treatment on the second conductor using the third etching mask to form a fourth conductor and a fifth conductor and performing etching treatment on the third conductor using the fourth etching mask to form a sixth conductor and a seventh conductor, forming an eighth oxide over the fifth oxide, the fourth conductor, and the fifth conductor and a ninth oxide over the sixth oxide, the sixth conductor, and the seventh conductor, forming a second gate insulator over the eighth oxide and a third gate insulator over the ninth oxide, and forming a third gate electrode over the second gate insulator and a fourth gate electrode over the third gate insulator.

In any of the above embodiments, the first to ninth oxides may each contain a metal oxide.

In any of the above embodiments, the eighth oxide may have a wider bandgap than the third to fifth oxides, the ninth oxide may have a wider bandgap than the sixth and seventh oxides, and the fifth oxide may have a wider bandgap than the sixth oxide.

In any of the above embodiments, the fifth and seventh oxides may have the same composition, the third, fourth, and sixth oxides may have the same composition, and the eighth and ninth oxides may have the same composition.

In any of the above embodiments, the first to seventh oxides may each contain In and Zn.

In any of the above embodiments, the eighth and ninth oxides may each contain Ga.

One embodiment of the present invention can provide a semiconductor device having favorable electrical characteristics. Another embodiment of the present invention can provide a semiconductor device having favorable reliability. Another embodiment of the present invention can provide a semiconductor device that can be miniaturized or highly integrated. Another embodiment of the present invention can provide a semiconductor device with high producibility.

Another embodiment of the present invention can provide a semiconductor device capable of retaining data for a long time. Another embodiment of the present invention can provide a semiconductor device capable of high-speed data writing. Another embodiment of the present invention can provide a semiconductor device with high design flexibility. Another embodiment of the present invention can provide a low-power semiconductor device. Another embodiment of the present invention can provide a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

BRIEF DESCRIPTION OF THE DRAWINGS

In the accompanying drawings:

FIGS. 1A to 1C are a cross-sectional view of transistors of one embodiment of the present invention and graphs showing the electrical characteristics of the transistors;

FIGS. 6A to 6D illustrate a manufacturing method of transistors of one embodiment of the present invention;

FIGS. 7A to 7D illustrate a manufacturing method of transistors of one embodiment of the present invention;

FIGS. 8A to 8D illustrate a manufacturing method of transistors of one embodiment of the present invention;

FIGS. 9A to 9D illustrate a manufacturing method of transistors of one embodiment of the present invention;

FIGS. 10A to 10D illustrate a manufacturing method of transistors of one embodiment of the present invention;

FIGS. 11A to 11D illustrate a manufacturing method of transistors of one embodiment of the present invention;

FIGS. 12A to 12D illustrate a manufacturing method of transistors of one embodiment of the present invention;

FIGS. 15A to 15D illustrate a manufacturing method of transistors of one embodiment of the present invention;

FIGS. 16A to 16D illustrate a manufacturing method of transistors of one embodiment of the present invention;

FIGS. 20A and 20B are each a circuit diagram of a memory device of one embodiment of the present invention;

DETAILED DESCRIPTION OF THE INVENTION

Figure 2A:
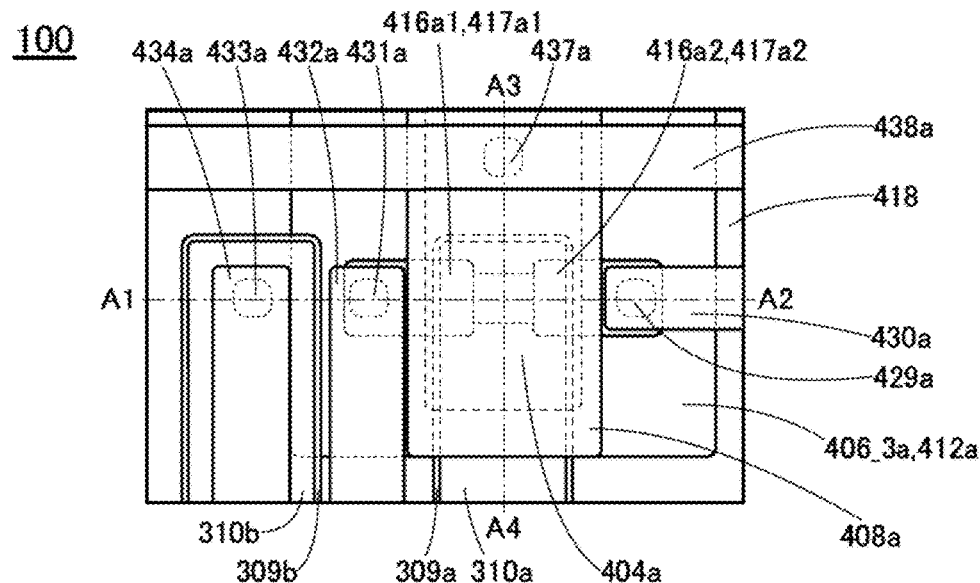
FIGS. 2A to 2C are a top view and cross-sectional views illustrating a transistor of one embodiment of the present invention.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Furthermore, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification and the like, terms for describing arrangement, such as "over", "above", "under", and "below", are used for convenience in describing a positional relationship between components with reference to drawings. Furthermore, the positional relationship between components is changed as appropriate in accordance with a direction in which each component is described. Thus, there is no limitation on terms used in this specification, and description can be made appropriately depending on the situation.

In this specification and the like, a semiconductor device indicates all the devices that can function by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow between the source and the drain through the channel formation region. Note that in this specification and the like, a channel formation region refers to a region where a channel of a transistor is formed and mainly through which current flows.

Furthermore, functions of a source and a drain might be switched when transistors having different polarities are employed or a direction of current flow is changed in circuit operation, for example. Therefore, the terms "source" and "drain" can be switched in this specification and the like.

Note that the channel length refers to, for example, the distance between a source (a source region or a source electrode) and a drain (a drain region or a drain electrode) in a region where a semiconductor (or a portion where current flows in a semiconductor when a transistor is on) and a gate electrode overlap with each other, or a region where a channel is formed, in a top view of the transistor. In one transistor, channel lengths in all regions are not necessarily the same. In other words, the channel length of one transistor is not limited to one value in some cases. Therefore, in this specification, the channel length is any one of values, the maximum value, the minimum value, or the average value in a region where a channel is formed.

The channel width refers to, for example, the length of a portion where a source and a drain face each other in a region where a semiconductor (or a portion where current flows in a semiconductor when a transistor is on) and a gate electrode overlap with each other, or a region where a channel is formed. In one transistor, channel widths in all regions are not necessarily the same. In other words, the channel width of one transistor is not limited to one value in some cases. Therefore, in this specification, the channel width is any one of values, the maximum value, the minimum value, or the average value in a region where a channel is formed.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, for example, the term "insulating film" can be changed into the term "insulating layer" in some cases.

Furthermore, unless otherwise specified, transistors described in this specification and the like are enhancement-type (normally-off-type) field effect transistors. Unless otherwise specified, transistors described in this specification and the like are n-channel transistors. Thus, unless otherwise specified, the threshold voltage (also referred to as "$V_{th}$") is higher than 0 V.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit interposed therebetween), X and Y are functionally connected (i.e., the case where X and Y are functionally connected with another circuit interposed therebetween), and X and Y are directly connected (i.e., the case where X and Y are connected without another element or another circuit interposed therebetween). That is, in this specification and the like, the explicit description "X and Y are electrically connected" is the same as the explicit simple description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

The expressions include, for example, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Note that in this specification, a barrier film refers to a film having a function of inhibiting penetration of oxygen and impurities such as hydrogen and water. The barrier film that has conductivity may be referred to as a conductive barrier film.

In this specification and the like, a metal oxide means an oxide of metal in a broad sense. Metal oxides are classified into an oxide insulator, an oxide conductor (including a transparent oxide conductor), an oxide semiconductor (also simply referred to as an OS), and the like. For example, a metal oxide used in a semiconductor layer of a transistor is called an oxide semiconductor or simply called an oxide in some cases. That is to say, the metal oxide that has at least one of an amplifying function, a rectifying function, and a switching function can be called a metal oxide semiconductor, or OS for short. In addition, an OS FET (OS transistor) is a transistor including a metal oxide, an oxide semiconductor, or an oxide.

In this specification and the like, "c-axis aligned crystal (CAAC)" and "cloud-aligned composite (CAC)" may be stated. CAAC refers to an example of a crystal structure, and CAC refers to an example of a function or a material composition.

In this specification and the like, a CAC-OS or a CAC metal oxide has a conducting function in a part of the material and has an insulating function in another part of the material; as a whole, the CAC-OS or the CAC metal oxide has a function of a semiconductor. In the case where the CAC-OS or the CAC metal oxide is used in a semiconductor layer of a transistor, the conducting function is to allow electrons (or holes) serving as carriers to flow, and the insulating function is to not allow electrons serving as carriers to flow. By the complementary action of the conducting function and the insulating function, the CAC-OS or the CAC metal oxide can have a switching function (on/off function). In the CAC-OS or the CAC-metal oxide, separation of the functions can maximize each function.

In this specification and the like, the CAC-OS or the CAC metal oxide includes conductive regions and insulating regions. The conductive regions have the above-described conducting function, and the insulating regions have the above-described insulating function. In some cases, the conductive regions and the insulating regions in the material are separated at the nanoparticle level. In some cases, the conductive regions and the insulating regions are unevenly distributed in the material. The conductive regions are observed to be coupled in a cloud-like manner with their boundaries blurred, in some cases.

Furthermore, in the CAC-OS or the CAC metal oxide, the conductive regions and the insulating regions each have a size of more than or equal to 0.5 nm and less than or equal to 10 nm, preferably more than or equal to 0.5 nm and less than or equal to 3 nm and are dispersed in the material, in some cases.

The CAC-OS or the CAC metal oxide includes components having different bandgaps. For example, the CAC-OS or the CAC metal oxide includes a component having a wide gap due to the insulating region and a component having a narrow gap due to the conductive region. In the case of such a composition, carriers mainly flow in the component having a narrow gap. The component having a narrow gap complements the component having a wide gap, and carriers also flow in the component having a wide gap in conjunction with the component having a narrow gap. Therefore, in the case where the above-described CAC-OS or the CAC metal oxide is used in a channel formation region of a transistor, high current drive capability in the on state of the transistor, that is, a high on-state current and high field-effect mobility, can be obtained.

In other words, a CAC-OS or a CAC-metal oxide can be called a matrix composite or a metal matrix composite.
(Embodiment 1)

Providing transistors having different electrical characteristics over the same layer can increase the design flexibility of a semiconductor device and the integration degree in the semiconductor device. In this embodiment, an example of an embodiment where transistors having different electrical characteristics are provided over the same layer will be described.

<Structure Example of Semiconductor Device 1000>

FIG. 1A is a cross-sectional view of a semiconductor device 1000. The semiconductor device 1000 includes a transistor 100 and a transistor 200. The transistors 100 and 200 have different structures. FIG. 1A illustrates cross sections of the transistors 100 and 200 over a substrate 400. FIG. 1A corresponds to a cross-sectional view taken along dashed-dotted line A1-A2 in FIG. 2A and dashed-dotted line B1-B2 in FIG. 3A.

Figures 2B, 2C:
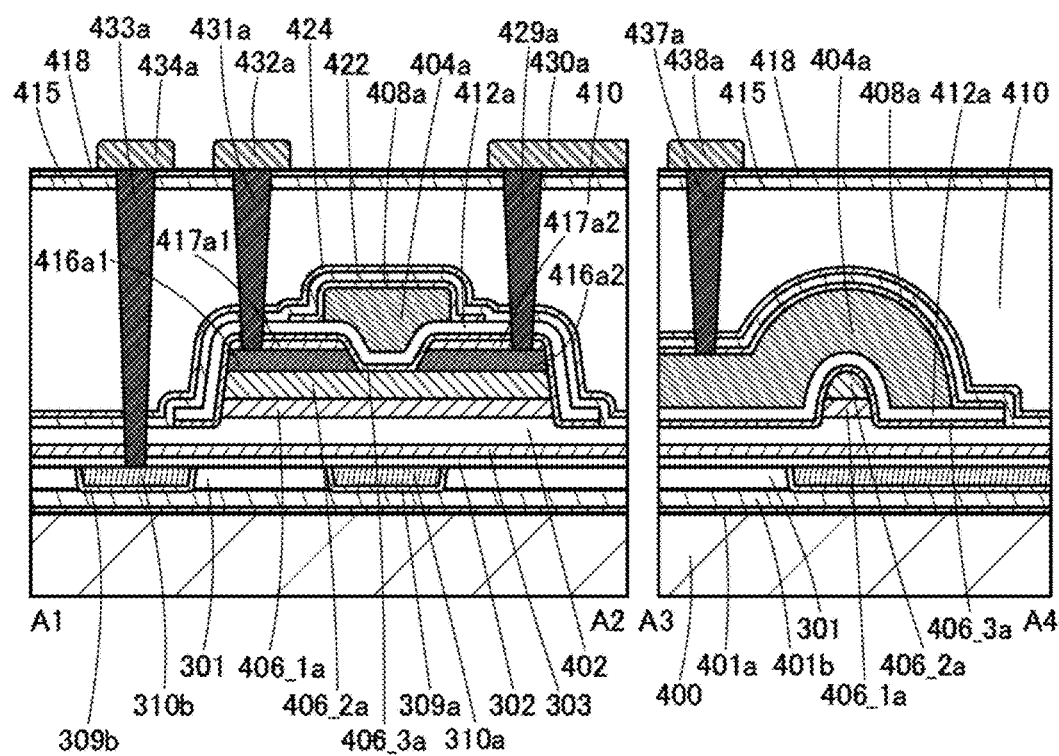

FIG. 2A is a top view of the transistor 100. FIG. 2B is a cross-sectional view taken along dashed-dotted line A1-A2 in FIG. 2A. FIG. 2C is a cross-sectional view taken along dashed-dotted line A3-A4 in FIG. 2A. In FIG. 2B, the cross-sectional view along A1-A2 is taken in the channel length direction of the transistor 100. In FIG. 2C, the cross-sectional view along A3-A4 is taken in the channel width direction of the transistor 100. For simplification of the drawing, some components are not illustrated in the top view in FIG. 2A.

Figure 3A:
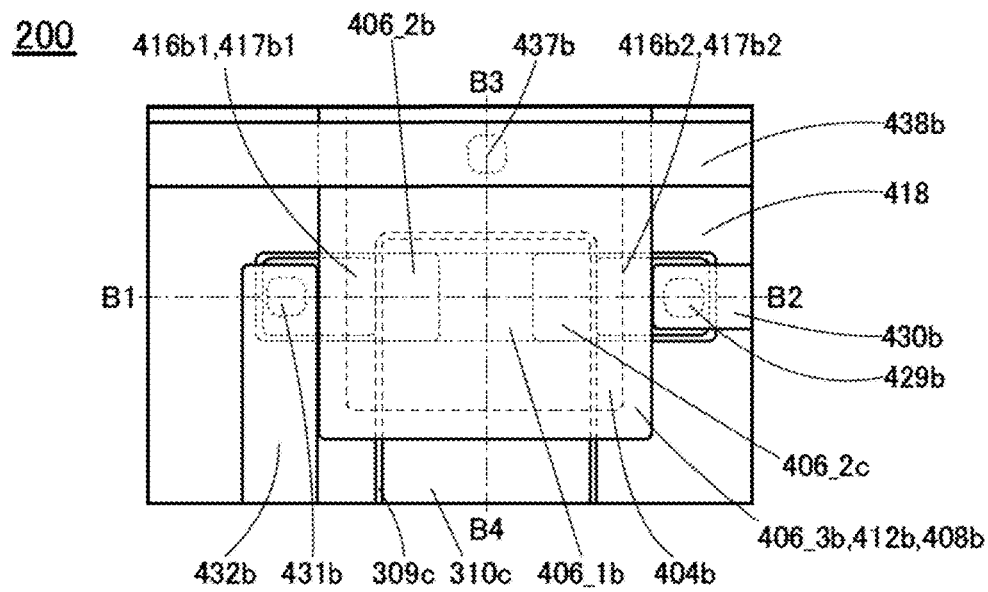
FIGS. 3A to 3C are a top view and cross-sectional views illustrating a transistor of one embodiment of the present invention.
Figures 3B, 3C:
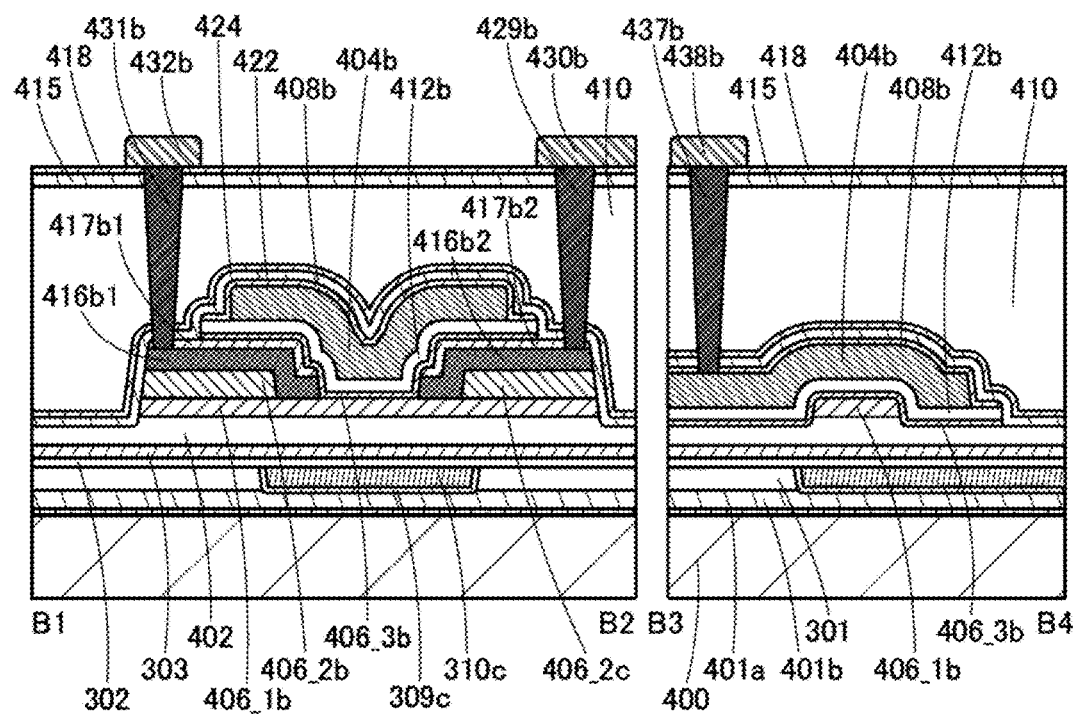

FIG. 3A is a top view of the transistor 200. FIG. 3B is a cross-sectional view taken along dashed-dotted line B1-B2 in FIG. 3A. FIG. 3C is a cross-sectional view taken along dashed-dotted line B3-B4 in FIG. 3A. In FIG. 3B, the cross-sectional view along B1-B2 is taken in the channel length direction of the transistor 200. In FIG. 3C, the cross-sectional view along B3-B4 is taken in the channel width direction of the transistor 200. For simplification of the drawing, some components are not illustrated in the top view in FIG. 3A.

The semiconductor device 1000 illustrated in FIG. 1A can function as a memory device. Data can be written by turning on the transistor 100 and the written data can be retained by turning off the transistor 100. A retention period of the written data can be determined depending on the amount of the off-state current of the transistor 100 (also referred to as $I_d$ when $V_g$ of the $V_g$-$I_d$ curve of the transistor 100 is 0 V). The transistor 200 can have a function of keeping the off-state current of the transistor 100 low for a long time.

FIGS. 1B and 1C each show an example of a $V_g$-$I_d$ curve, which is one of the electrical characteristics of a transistor. In the $V_g$-$I_d$ curve in each of FIGS. 1B and 1C, the horizontal axis represents a voltage ($V_g$) between a gate and a source of a transistor and the vertical axis represents a current ($I_d$) flowing to a drain of the transistor on a logarithmic scale.

FIG. 1B shows the $V_g$-$I_d$ curve of the transistor 100 when the potential of a back gate is set to be the same as that of a source. FIG. 1C shows the $V_g$-$I_d$ curve of the transistor 200 when the potential of a back gate is set to be the same as that of a source. Gates are located over the back gates in the transistors 100 and 200. As shown in FIGS. 1B and 1C, the transistors 100 and 200 have different transistor characteristics. Specifically, the $V_{th}$ in the $V_g$-$I_d$ curve of the transistor 200 is shifted in the positive direction compared with the $V_{th}$ of the transistor 100. That is, the transistor 200 has better normally-off electrical characteristics and a lower off-state current than the transistor 100.

Although not illustrated in FIG. 1A, the transistors 100 and 200 are electrically connected to each other. Specifically, the back gate of the transistor 100 is electrically connected to a drain, the gate, and the back gate of the transistor 200.

The off-state current of the transistor 100 is preferably kept as low as possible so that data can be retained for a long time in the semiconductor device 1000. In the semiconductor device 1000, a negative potential is supplied to the back gate of the transistor 100 through the transistor 200 and the $V_{th}$ of the transistor 100 is shifted in the positive direction as compared with the case where the negative potential is not supplied, whereby the off-state current of the transistor 100 can be reduced. As shown in FIGS. 1B and 1C, the transistors 100 and 200 have different electrical characteristics. When the transistors 100 and 200 are electrically connected to each other in the above-described manner, the off-state current of the transistor 100 can be kept low for a long time. Thus, data can be retained for a long time in the semiconductor device 1000.

<Structure of Transistor>

The structure of the transistor 100 of one embodiment of the present invention will be described below.

In each of FIGS. 2B and 2C, the transistor 100 is provided over an insulator 401b over the substrate 400. The insulator 401b is provided over the substrate 400 with an insulator 401a provided therebetween. The transistor 100 includes a conductor 309a, a conductor 310a, a conductor 309b, a conductor 310b, an insulator 302 over the conductors 309a, 310a, 309b, and 310b and an insulator 301, an insulator 303 over the insulator 302, an insulator 402 over the insulator 303, an oxide 406_1a over the insulator 402, an oxide 406_2a over the oxide 406_1a, a conductor 416a1 and a conductor 416a2 each including a region in contact with part of a top surface of the oxide 406_2a, an oxide 406_3a including a region in contact with a side surface of each of the conductors 416a1 and 416a2 and part of the top surface of the oxide 406_2a, an insulator 412a over the oxide 406_3a, and a conductor 404a including a region overlapping with the oxide 406_3a with the insulator 412a provided therebetween. The conductors 309a and 310a and the conductors 309b and 310b are formed in openings in the insulator 301.

Furthermore, a barrier film 417a1 is provided over the conductor 416a1, and a barrier film 417a2 is provided over the conductor 416a1. An insulator 408a, an insulator 422, an insulator 424, an insulator 410, an insulator 415, and an insulator 418 are provided over the transistor 100.

A first opening reaching the conductor 310b is provided in the insulators 418, 415, 410, 424, 422, 402, 303, and 302, a second opening reaching the conductor 416a1 is provided in the insulators 418, 415, 410, 424, 422, and 412a, the oxide 406_3a, and the barrier film 417a1, a third opening reaching the conductor 416a2 is provided in the insulators 418, 415, 410, 424, 422, and 412a, the oxide 406_3a, and the barrier film 417a2, and a fourth opening reaching the conductor 404a is provided in the insulators 418, 415, 410, 424, 422, and 408a. The semiconductor device 1000 including the transistor 100 includes a conductor 433a, a conductor 431a, a conductor 429a, and a conductor 437a which are embedded in the first opening, the second opening, the third opening, and the fourth opening, respectively, a conductor 434a located over the insulator 418 and including a region in contact with the conductor 433a, a conductor 432a located over the insulator 418 and including a region in contact with the conductor 431a, a conductor 430a located over the insulator 418 and including a region in contact with the conductor 429a, and a conductor 438a located over the insulator 418 and including a region in contact with the conductor 437a.

As described above, the off-state current of the transistor 100 is preferably as low as possible. Thus, a material for the oxide 406_3a in contact with the insulator 412a preferably has a wider bandgap (more excellent insulating property) than that for each of the oxides 406_1a and 406_2a. With such a material, a leakage current between the oxide 406_2a and the conductor 404a can be suppressed and the off-state current of the transistor 100 can be reduced as compared with the case where a material for the oxide 406_3a has a narrower bandgap (higher conductivity) than that for the oxide 406_2a. A material for the oxide 406_2a preferably has a narrower bandgap (higher conductivity) than that for the oxide 406_1a because the oxide 406_2a functions as a channel formation region of the transistor 100. Consequently, the oxide 406_2a has the highest conductivity of the oxides 406_1a, 406_2a, and 406_3a, whereby the oxide 406_2a can function as the channel formation region and a current path of the transistor 100.

An oxide containing In and Zn is preferably used as each of the oxides 406_1a and 406_2a and an oxide containing Ga is preferably used as the oxide 406_3a. Note that the details will be described later.

The conductor 404a functions as a first gate electrode in the transistor 100. Furthermore, the conductor 404a can have a stacked structure including a conductor having a function of inhibiting penetration of oxygen. For example, when the conductor that has a function of inhibiting penetration of oxygen is formed under the conductor 404a, an increase in the electric resistance value due to oxidation of the conductor 404a can be inhibited. The insulator 412a functions as a first gate insulator.

The conductors 416a1 and 416a2 function as a source electrode and a drain electrode. Furthermore, the conductors 416a1 and 416a2 can each have a stacked structure including a conductor having a function of inhibiting penetration of oxygen. For example, when the conductor having a function of inhibiting penetration of oxygen is formed over the conductors 416a1 and 416a2, an increase in the electric resistance value due to oxidation of the conductors 416a1 and 416a2 can be inhibited. Note that the electric resistance values of the conductors can be measured by a two-terminal method or the like.

The barrier films 417a1 and 417a2 each have a function of inhibiting penetration of oxygen and impurities such as hydrogen and water. The barrier film 417a1 is located over the conductor 416a1 and inhibits the diffusion of oxygen from above the barrier film 417a1 into the conductor 416a1. The barrier film 417a2 is located over the conductor 416a2 and inhibits the diffusion of oxygen from above the barrier film 417a2 into the conductor 416a2.

In the transistor 100, the resistance of the oxide 406_2a can be controlled by a potential applied to the conductor 404a. That is, conduction or non-conduction between the conductors 416a1 and 416a2 can be controlled by the potential applied to the conductor 404a.

As illustrated in FIGS. 2B and 2C, part of the top surface of the oxide 406_2a is in contact with the conductors 416a1 and 416a2. At least the oxide 406_2a can be electrically surrounded by an electric field of the conductor 404a functioning as the first gate electrode. Such a transistor structure in which the channel formation region is electrically surrounded by the electric field of the first gate electrode is referred to as a surrounded channel (s-channel) structure. Therefore, a channel is formed in the entire oxide 406_2a in some cases. In the s-channel structure, a large amount of current can flow between a source and a drain of the transistor, so that on-state current can be increased. In addition, since at least the oxide 406_2a is electrically surrounded by the electric field of the conductor 404a, off-state current can be reduced.

In the transistor 100, the conductor 404a functioning as the first gate electrode partly overlaps with each of the conductors 416a1 and 416a2 functioning as a source electrode and a drain electrode, whereby parasitic capacitance between the conductor 404a and the conductor 416a1 and parasitic capacitance between the conductor 404a and the conductor 416a2 are formed.

Since the transistor 100 includes the barrier film 417a1 as well as the insulator 412a and the oxide 406_3a between the conductor 404a and the conductor 416a1, the parasitic capacitance can be reduced. Similarly, since the transistor 100 includes the barrier film 417a2 as well as the insulator 412a and the oxide 406_3a between the conductor 404a and the conductor 416a2, the parasitic capacitance can be reduced. Thus, the transistor 100 has excellent frequency characteristics.

Furthermore, the above structure of the transistor 100 allows reduction or inhibition of generation of a leakage current between the conductor 404a and each of the conductors 416a1 and 416a2 when the transistor 100 operates, for example, when a potential difference is generated between the conductor 404a and each of the conductors 416a1 and 416a2. As described above, when a material having a wide bandgap is used for the oxide 406_3a, a leakage current can be further reduced.

The conductors 309a and 310a function as a second gate electrode. The conductor 309a functions as a conductive barrier film. Since the conductor 309a is provided so as to cover a bottom surface and side surfaces of the conductor 310a, oxidation of the conductor 310a can be inhibited.

The insulator 302, the insulator 303, and the insulator 402 function as a second gate insulator. The threshold voltage of the transistor 100 can be controlled by a potential applied to the conductors 309a and 310a. Moreover, when the first gate and the second gate are electrically connected to each other, the on-state current can be increased as compared with the case where only one of the first gate and the second gate is used for the transistor operation. Note that the function of the first gate and that of the second gate may be interchanged.

The conductors 309b and 310b function as a wiring. The conductor 309b functions as a conductive barrier film. Since the conductor 309b is provided so as to cover a bottom surface and side surfaces of the conductor 310b, oxidation of the conductor 310b can be inhibited.

The structure of the transistor 200 which has different electrical characteristics from those of the transistor 100 will be described below.

In each of FIGS. 3B and 3C, the transistor 200 is provided over the insulator 401b over the substrate 400. The insulator 401b is provided over the substrate 400 with the insulator 401a provided therebetween. The transistor 200 includes a conductor 309c, a conductor 310c, the insulator 302 over the conductors 309c and 310c and the insulator 301, the insulator 303 over the insulator 302, the insulator 402 over the insulator 303, an oxide 406_1b over the insulator 402, an oxide 406_2b and an oxide 406_2c over the oxide 406_1b, a conductor 416b1 including a region in contact with a top surface and a side surface of the oxide 406_2b and part of a top surface of the oxide 406_1b, a conductor 416b2 including a region in contact with a top surface and a side surface of the oxide 406_2b and part of the top surface of the oxide 406_1b, an oxide 406_3b located over the oxide 406_1b, the conductor 416b1, and the conductor 416b2 and including a region in contact with a side surface of each of the conductors 416b1 and 416b2 and part of the top surface of the oxide 406_1b, an insulator 412b over the oxide 406_3b, and a conductor 404b over the insulator 412b. The conductors 309c and 310c are formed in the opening in the insulator 301.

Furthermore, a barrier film 417b1 is provided over the conductor 416b1, and a barrier film 417b2 is provided over the conductor 416b2. An insulator 408b, the insulator 422, the insulator 424, the insulator 410, the insulator 415, and the insulator 418 are provided over the transistor 200.

A fifth opening reaching the conductor 416b1 is provided in the insulators 418, 415, 410, 424, and 422 and the barrier film 417b1, a sixth opening reaching the conductor 416b2 is provided in the insulators 418, 415, 410, 424, and 422 and the barrier film 417b2, and a seventh opening reaching the conductor 404b is provided in the insulators 418, 415, 410, 424, 422, and 408b. The semiconductor device 1000 including the transistor 200 includes a conductor 431b, a conductor 429b, and a conductor 437b which are embedded in the fifth opening, the sixth opening, and the seventh opening, respectively, a conductor 432b located over the insulator 418 and including a region in contact with the conductor 431b, a conductor 430b located over the insulator 418 and including a region in contact with the conductor 429b, and a conductor 438b located over the insulator 418 and including a region in contact with the conductor 437b.

The conductor 404b functions as a first gate electrode in the transistor 200. Furthermore, the conductor 404b can have a stacked structure including a conductor having a function of inhibiting penetration of oxygen. For example, when the conductor that has a function of inhibiting penetration of oxygen is formed under the conductor 404b, an increase in the electric resistance value due to oxidation of the conductor 404b can be inhibited. The insulator 412b functions as a first gate insulator.

The conductors 416b1 and 416b2 function as a source electrode and a drain electrode. Furthermore, the conductors 416b1 and 416b2 can each have a stacked structure including a conductor having a function of inhibiting penetration of oxygen. For example, when the conductor having a function of inhibiting penetration of oxygen is formed over each of the conductors 416b1 and 416b2, an increase in the electric resistance value due to oxidation of the conductors 416b1 and 416b2 can be inhibited. Note that the electric resistance values of the conductors can be measured by a two-terminal method or the like.

The barrier films 417b1 and 417b2 each have a function of inhibiting penetration of oxygen and impurities such as hydrogen and water. The barrier film 417b1 is located over the conductor 416b1 and inhibits the diffusion of oxygen from above the barrier film 417b1 into the conductor 416b1. The barrier film 417b2 is located over the conductor 416b2 and inhibits the diffusion of oxygen from above the barrier film 417b2 into the conductor 416b2.

As illustrated in FIG. 3B, in the transistor 200, a layer including the oxide 406_2b and the conductor 416b1 and a layer including the oxide 406_2c and the conductor 416b2, which are over the oxide 406_1b, are positioned with a region where part of the top surface of the oxide 406_1b and the oxide 406_3b are in contact with each other provided therebetween. Here, a side surface of the layer including the oxide 406_2b and the conductor 416b1 and a side surface of the layer including the oxide 406_2c and the conductor 416b2, which face each other, are each called one side surface, and each of side surfaces of the layers, which do not face each other, is called the other side surface.

The conductor 416b1 is provided to be in contact with the top surface and the one side surface of the oxide 406_2b and part of the top surface of the oxide 406_1b. The conductor 416b2 is provided to be in contact with the top surface and the one side surface of the oxide 406_2c and part of the top surface of the oxide 406_1b.

The oxide 406_3b is provided to be in contact with the one side surface of the conductor 416b1, the one side surface of the conductor 416b2, and part of the top surface of the oxide 406_1b in a region between the one side surface of the conductor 416b1 and the one side surface of the conductor 416b2.

The oxide 406_1b and the oxide 406_3b are stacked in the region between the conductor 416b1 and the conductor 416b2 functioning as a source electrode and a drain electrode of the transistor 200. The oxide 406_3b is in contact with a bottom surface of the insulator 412b functioning as a gate insulator of the transistor 200. Therefore, when a material for the oxide 406_1b has a narrower bandgap (higher conductivity) than that for the oxide 406_3b, the oxide 406_1b in the region between the conductor 416b1 and the conductor 416b2 can function as a channel formation region of the transistor 200.

As described above, the transistor 200 has better normally-off electrical characteristics and a lower off-state current than the transistor 100. Thus, a material for the oxide 406_3b preferably has a wide bandgap (excellent insulating property) as a material for the oxide 406_3a. A material for the oxide 406_1b functioning as the channel formation region of the transistor 200 preferably has a wider bandgap (more excellent insulating property) than that for the oxide 406_2a functioning as the channel formation region of the transistor 100.

The transistor 200 preferably has a channel length longer than that of the transistor 100.

The oxide layer of the transistor 200 may include a layer formed of the same material as that for the oxide layer of the transistor 100. For example, the oxide 406_1a of the transistor 100 and the oxide 406_1b of the transistor 200 may be formed of the same material and the oxide 406_3a of the transistor 100 and the oxide 406_3b of the transistor 200 may be formed of the same material. As described above, since the transistors 100 and 200 include oxide layers formed of the same material, the number of masks and steps can be reduced when the transistor 100 and the transistor 200 are manufactured simultaneously.

In the transistor 200, the conductor 404b functioning as the first gate electrode partly overlaps with each of the conductors 416b1 and 416b2 functioning as a source electrode and a drain electrode, whereby parasitic capacitance between the conductor 404b and the conductor 416b1 and parasitic capacitance between the conductor 404b and the conductor 416b2 are formed.

Since the transistor 200 includes the barrier film 417b1 and the barrier film 417b2 as well as the insulator 412b and the oxide 406_3b between the conductor 404b and each of the conductor 416b1 and the conductor 416b2, the parasitic capacitance can be reduced. Thus, the transistor 200 has higher frequency characteristics than a transistor without the barrier films 417b1 and 417b2.

Furthermore, the structure of the transistor 200 in which the barrier films 417b1 and 417b2 are provided allows reduction or inhibition of generation of a leakage current between the conductor 404b and the conductor 416b1 and/or the conductor 416b2 when the transistor 200 operates, for example, when a potential difference is generated between the conductor 404b and the conductor 416b1 and/or the conductor 416b2. As described above, when a material having a wide bandgap (excellent insulating property) is used for the oxide 406_3b, a leakage current can be further reduced.

The conductors 309c and 310c function as a second gate electrode. The conductor 309c functions as a conductive barrier film. Since the conductor 309c is provided so as to cover a bottom surface and side surfaces of the conductor 310c, oxidation of the conductor 310c can be inhibited.

As described above, the oxide 406_1b functions as the channel formation region of the transistor 200. Meanwhile, the oxide 406_2a functions as the channel formation region of the transistor 100. Thus, the transistors 200 and 100 have different electrical characteristics. Specifically, the transistor 200 has better normally-off electrical characteristics and a lower off-state current than the transistor 100. When the transistors 100 and 200 having different electrical characteristics are electrically connected to each other in the above-described manner, data can be retained for a long time in the semiconductor device 1000.

<Components of the Semiconductor Device 1000>

Components that can be used in the semiconductor device 1000 including the transistors 100 and 200 of one embodiment of the present invention will be described below in detail.

<Substrate>

As the substrate 400, an insulator substrate, a semiconductor substrate, or a conductor substrate may be used, for example. As the insulator substrate, a glass substrate, a quartz substrate, a sapphire substrate, a stabilized zirconia substrate (e.g., an yttria-stabilized zirconia substrate), or a resin substrate is used, for example. As the semiconductor substrate, a semiconductor substrate formed of silicon or germanium, or a compound semiconductor substrate of silicon carbide, silicon germanium, gallium arsenide, indium phosphide, zinc oxide, gallium oxide, or the like is used, for example. A semiconductor substrate in which an insulator region is provided in the above semiconductor substrate, e.g., a silicon on insulator (SOI) substrate or the like is used. As the conductor substrate, a graphite substrate, a metal substrate, an alloy substrate, a conductive resin substrate, or the like is used. A substrate including a metal nitride, a substrate including a metal oxide, or the like is used. An insulator substrate provided with a conductor or a semiconductor, a semiconductor substrate provided with a conductor or an insulator, a conductor substrate provided with a semiconductor or an insulator, or the like is used. Alternatively, any of these substrates over which an element is provided may be used. As the element provided over the substrate, a capacitor, a resistor, a switching element, a light-emitting element, a memory element, or the like is used.

Alternatively, a flexible substrate may be used as the substrate 400. As a method for providing the transistor over a flexible substrate, there is a method in which the transistor is formed over a non-flexible substrate and then the transistor is separated and transferred to the substrate 400 which is a flexible substrate. In that case, a separation layer is preferably provided between the non-flexible substrate and the transistor. As the substrate 400, a sheet, a film, or a foil containing a fiber may be used. The substrate 400 may have elasticity. The substrate 400 may have a property of returning to its original shape when bending or pulling is stopped. Alternatively, the substrate 400 may have a property of not returning to its original shape. The substrate 400 has a region with a thickness of, for example, greater than or equal to 5 μm and less than or equal to 700 μm, preferably greater than or equal to 10 μm and less than or equal to 500 μm, further preferably greater than or equal to 15 μm and less than or equal to 300 μm. When the substrate 400 has a small thickness, the weight of the semiconductor device including the transistor can be reduced. When the substrate 400 has a small thickness, even in the case of using glass or the like, the substrate 400 may have elasticity or a property of returning to its original shape when bending or pulling is stopped. Therefore, an impact applied to the semiconductor device over the substrate 400, which is caused by dropping or the like, can be reduced. That is, a robust semiconductor device can be provided.

For the flexible substrate 400, metal, an alloy, resin, glass, or fiber thereof can be used, for example. The flexible substrate 400 preferably has a lower coefficient of linear expansion because deformation due to an environment is suppressed. The flexible substrate 400 is formed using, for example, a material whose coefficient of linear expansion is lower than or equal to $1\times10^{-3}$/K, lower than or equal to $5\times10^{-5}$/K, or lower than or equal to $1\times10^{-5}$/K. Examples of the resin include polyester, polyolefin, polyamide (e.g., nylon or aramid), polyimide, polycarbonate, and acrylic. In particular, aramid is preferably used for the flexible substrate 400 because of its low coefficient of linear expansion.

<Insulator>

The transistor is surrounded by an insulator that has a function of inhibiting penetration of oxygen and impurities such as hydrogen and water, whereby the transistor can have stable electrical characteristics. For example, an insulator with a function of inhibiting penetration of oxygen and impurities such as hydrogen and water may be used as each of the insulators 401a, 401b, 408a, 408b, and 415.

An insulator with a function of inhibiting penetration of oxygen and impurities such as hydrogen and water may be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum.

Furthermore, for example, the insulators 303, 401a, 401b, 408a, 408b, 415, 418, 422, and 424 may be each formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride. Note that the insulators 303, 401a, 401b, 408a, 408b, 415, 418, 422, and 424 each preferably include aluminum oxide.

For example, when the insulator 422 is formed using plasma containing oxygen, oxygen can be added to the insulator 402 serving as a base layer. The added oxygen serves as excess oxygen in the insulator 402 and is added from the insulator 402 to the oxides 406_1a, 406_2a, 406_3a, 406_1b, and 406_3b by heat treatment or the like, so that oxygen vacancies in the oxides 406_1a, 406_2a, 406_3a, 406_1b, and 406_3b can be repaired.

Furthermore, when the insulators 303, 401a, 408a, 408b, 424, and 418 include aluminum oxide, outward diffusion of the excess oxygen added to the oxides 406_1a, 406_2a, 406_3a, 406_1b, and 406_3b can be reduced.

The insulators 301, 302, 402, 412a, and 412b may each be formed to have a single-layer structure or a stacked-layer structure including an insulator containing, for example, boron, carbon, nitrogen, oxygen, fluorine, magnesium, aluminum, silicon, phosphorus, chlorine, argon, gallium, germanium, yttrium, zirconium, lanthanum, neodymium, hafnium, or tantalum. For example, the insulators 301, 302, 402, 412a, and 412b preferably contain silicon oxide or silicon oxynitride.

In particular, the insulators 402, 412a, and 412b each preferably include an insulator with a high relative permittivity. For example, the insulators 402, 412a, and 412b each preferably include gallium oxide, hafnium oxide, an oxide containing aluminum and hafnium, oxynitride containing aluminum and hafnium, an oxide containing silicon and hafnium, or oxynitride containing silicon and hafnium. Alternatively, the insulators 402, 412a, and 412b each preferably have a stacked-layer structure of silicon oxide or silicon oxynitride and an insulator with a high relative permittivity. When silicon oxide or silicon oxynitride, which is thermally stable, is combined with an insulator with a high relative permittivity, the stacked-layer structure can have thermal stability and high relative permittivity. For example, in the case where the insulator 412a has a stacked-layer structure of an insulator with a high relative permittivity, such as aluminum oxide, gallium oxide, or hafnium oxide, and silicon oxide or silicon oxynitride and the insulator with a high relative permittivity is provided on the oxide 406_3a side, entry of silicon included in silicon oxide or silicon oxynitride through the insulator with a high relative permittivity and the oxide 406_3a into the oxide 406_2a can be inhibited. When silicon oxide or silicon oxynitride is positioned on the oxide 406_3a side, for example, trap centers might be formed at the interface between the insulator with a high relative permittivity and silicon oxide or silicon oxynitride. The trap centers can shift the threshold voltage of the transistor in the positive direction by trapping electrons in some cases.

The insulator 410 preferably includes an insulator with low relative permittivity. For example, the insulator 410 preferably includes silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. Alternatively, the insulator 410 preferably has a stacked-layer structure of a resin and silicon oxide, silicon oxynitride, silicon nitride oxide, silicon nitride, silicon oxide to which fluorine is added, silicon oxide to which carbon is added, silicon oxide to which carbon and nitrogen are added, or porous silicon oxide. When silicon oxide or silicon oxynitride, which is thermally stable, is combined with resin, the stacked-layer structure can have thermal stability and low relative permittivity. Examples of the resin include polyester, polyolefin, polyamide (e.g., nylon or aramid), polyimide, polycarbonate, and acrylic.

An insulator with a function of inhibiting penetration of oxygen and impurities such as hydrogen and water may be used as each of the barrier films 417a1, 417a2, 417b1, and 417b2. The barrier films 417a1, 417a2, 417b1, and 417b2 can inhibit excess oxygen included in the insulator 410 from diffusing to the conductors 416a1, 416a2, 416b1, and 416b2.

The barrier films 417a1, 417a2, 417b1, and 417b2 can be formed using a metal oxide such as aluminum oxide, magnesium oxide, gallium oxide, germanium oxide, yttrium oxide, zirconium oxide, lanthanum oxide, neodymium oxide, hafnium oxide, or tantalum oxide; silicon nitride oxide; or silicon nitride, for example. Note that the barrier films 417a1, 417a2, 417b1, and 417b2 preferably include silicon nitride.

<Conductor>

The conductors 404a, 404b, 309a, 309b, 309c, 310a, 310b, 310c, 416a1, 416a2, 416b1, 416b2, 429a, 429b, 431a, 431b, 433a, 437a, 437b, 430a, 430b, 432a, 432b, 434a, 438a, and 438b can be formed using a material containing one or more metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like. Alternatively, a semiconductor having a high electric conductivity typified by polycrystalline silicon containing an impurity element such as phosphorus, or silicide such as nickel silicide may be used.

A conductive material containing the above metal element and oxygen may be used. A conductive material containing the above metal element and nitrogen may be used. For example, a conductive material containing nitrogen, such as titanium nitride or tantalum nitride, may be used. Indium tin oxide (ITO), indium oxide containing tungsten oxide, indium zinc oxide containing tungsten oxide, indium oxide containing titanium oxide, indium tin oxide containing titanium oxide, indium zinc oxide, or indium tin oxide to which silicon is added may be used. Indium gallium zinc oxide containing nitrogen may be used. With any of such materials, hydrogen contained in the oxides 406_1a, 406_2a, 406_3a, 406_1b, and 406_3b can be captured in some cases. Alternatively, hydrogen entering from an external insulator or the like into the oxides 406_1a, 406_2a, 406_3a, 406_1b, and 406_3b can be captured in some cases.

A stack of a plurality of conductive layers formed with the above materials may be used. For example, a stacked-layer structure formed using a combination of a material including any of the above-described metal elements and a conductive material including oxygen may be used. Alternatively, a stacked-layer structure formed using a combination of a material including any of the above-described metal elements and a conductive material including nitrogen may be used. Alternatively, a stacked-layer structure formed using a combination of a material including any of the above-described metal elements, a conductive material including oxygen, and a conductive material including nitrogen may be used.

When an oxide semiconductor is used for the channel formation region of the transistor, a stacked-layer structure formed using a material containing the above-described metal element and a conductive material containing oxygen is preferably used for the first gate electrode or the second gate electrode. In that case, the conductive material containing oxygen is preferably formed on the channel formation region side. When the conductive material containing oxygen is formed on the channel formation region side, oxygen released from the conductive material is likely to be supplied to the channel formation region.

The conductors 429a, 429b, 431a, 431b, 433a, 437a, and 437b may be formed using, for example, a conductive material with high embeddability, such as tungsten or polysilicon. A conductive material with high embeddability and a conductive barrier film such as a titanium layer, a titanium nitride layer, or a tantalum nitride layer may be used in combination.

<Oxide>

As each of the oxides 406_1a, 406_2a, 406_3a, 406_1b, 406_2b, and 406_3b, a metal oxide is preferably used. However, silicon (including strained silicon), germanium, silicon germanium, silicon carbide, gallium arsenide, aluminum gallium arsenide, indium phosphide, gallium nitride, an organic semiconductor, or the like can be used in some cases.

An oxide that can be used as each of the oxides 406_1a, 406_2a, 406_3a, 406_1b, 406_2b, 406_3b, and the like will be described.

An oxide preferably contains at least indium or zinc. In particular, indium and zinc are preferably contained. In addition, aluminum, gallium, yttrium, tin, or the like is preferably contained. Furthermore, one or more of boron, titanium, iron, nickel, germanium, zirconium, molybdenum, lanthanum, cerium, neodymium, hafnium, tantalum, tungsten, magnesium, and the like may be contained.

Here, the case where an oxide is InMZnO containing indium, an element M, and zinc is considered. The element M is aluminum, gallium, yttrium, tin, or the like. Alternatively, the element M can be boron, titanium, iron, nickel, germanium, zirconium, molybdenum, lanthanum, cerium, neodymium, hafnium, tantalum, tungsten, magnesium, or the like. Note that two or more of the above elements may be used in combination as the element M.

<Structure>

An oxide is classified into a single crystal oxide and a non-single-crystal oxide. Examples of a non-single-crystal oxide include a c-axis-aligned crystalline oxide semiconductor (CAAC-OS), a polycrystalline oxide, a nanocrystalline oxide semiconductor (nc-OS), an amorphous-like oxide semiconductor (a-like OS), and an amorphous oxide.

The CAAC-OS has c-axis alignment, its nanocrystals are connected in the a-b plane direction, and its crystal structure has distortion. Note that distortion refers to a portion where the direction of a lattice arrangement changes between a region with a uniform lattice arrangement and another region with a uniform lattice arrangement in a region where the nanocrystals are connected.

The shape of the nanocrystal is basically a hexagon but is not always a regular hexagon and is a non-regular hexagon in some cases. A pentagonal lattice arrangement, a heptagonal lattice arrangement, or the like is included in the distortion in some cases. Note that it is difficult to observe a clear crystal grain boundary even in the vicinity of distortion in the CAAC-OS. That is, formation of a grain boundary is inhibited due to the distortion of lattice arrangement. This is because the CAAC-OS can tolerate distortion owing to a low density of arrangement of oxygen atoms in an a-b plane direction, a change in interatomic bond distance by substitution of a metal element, and the like.

The CAAC-OS tends to have a layered crystal structure (also referred to as a layered structure) in which a layer containing indium and oxygen (hereinafter, In layer) and a layer containing the element M, zinc, and oxygen (hereinafter, (M,Zn) layer) are stacked. Note that indium and the element M can be replaced with each other, and when the element M of the (M,Zn) layer is replaced with indium, the layer can also be referred to as an (In,M,Zn) layer. When indium of the In layer is replaced with the element M, the layer can also be referred to as an (In,M) layer.

In the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different nanocrystals in the nc-OS. Thus, the orientation of the whole film is not observed. Accordingly, in some cases, the nc-OS cannot be distinguished from an a-like OS or an amorphous oxide, depending on an analysis method.

The a-like OS has a structure between those of the nc-OS and the amorphous oxide. The a-like OS has a void or a low-density region. That is, the a-like OS has low crystallinity as compared with the nc-OS and the CAAC-OS.

An oxide can have various structures which show various different properties. Two or more of the amorphous oxide, the polycrystalline oxide, the a-like OS, the nc-OS, and the CAAC-OS may be included in an oxide of one embodiment of the present invention.

<Atomic Ratio>

Next, preferred ranges of the atomic ratio of indium, the element M, and zinc contained in an oxide of the present invention will be described with reference to FIGS. 4A to 4C. Note that the proportion of oxygen atoms is not shown in FIGS. 4A to 4C. The terms of the atomic ratio of indium, the element M, and zinc contained in the oxide are denoted by [In], [M], and [Zn], respectively.

Figure 4A:
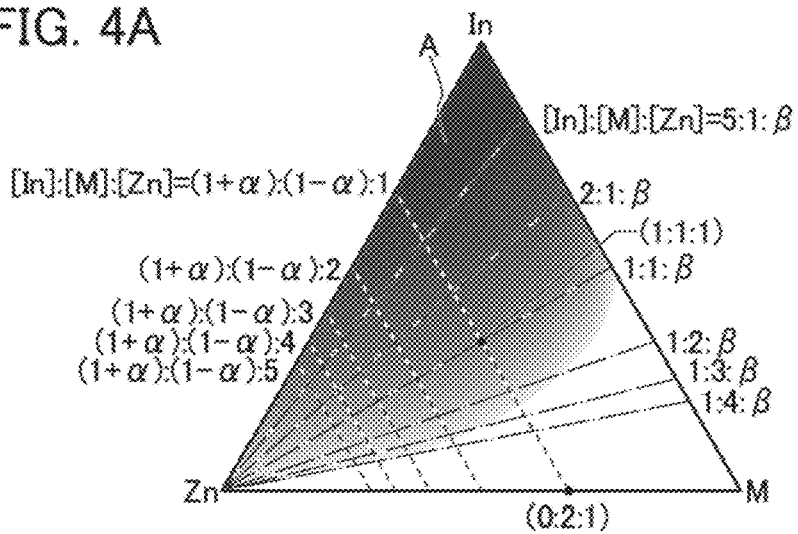
FIGS. 4A to 4C each show the range of the atomic ratio of an oxide of one embodiment of the present invention.
Figure 4B:
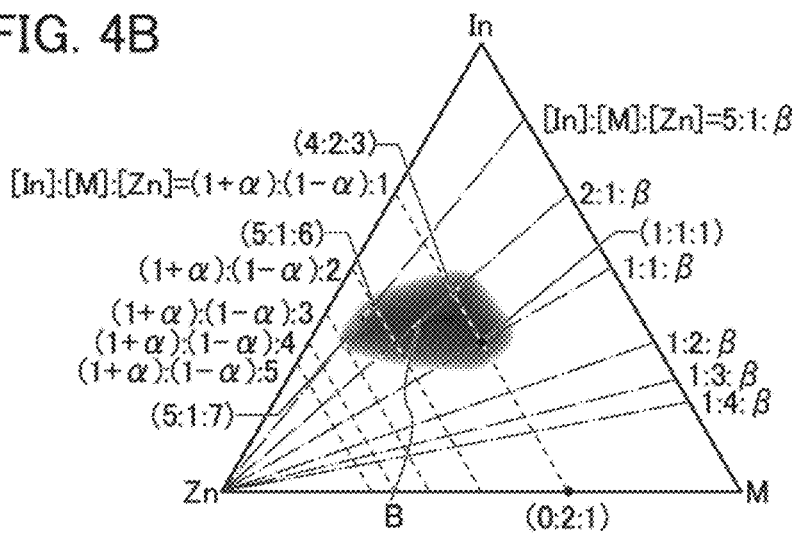
Figure 4C:
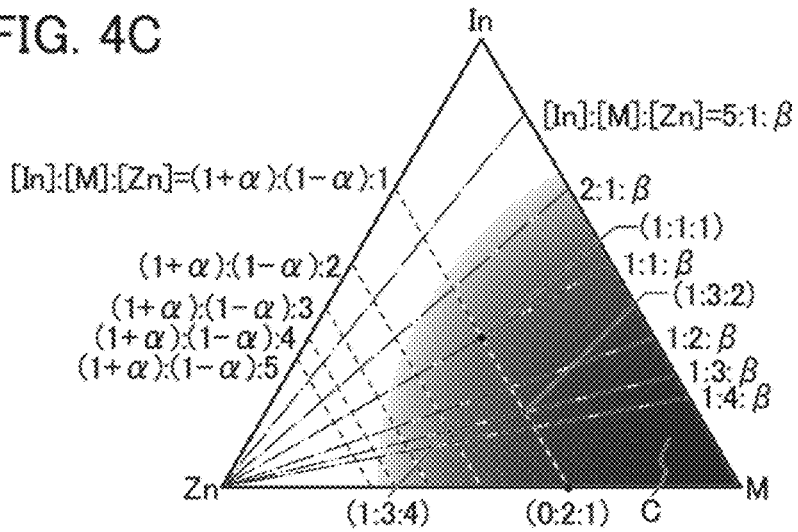

In FIGS. 4A to 4C, broken lines indicate a line where the atomic ratio [In]:[M]:[Zn] is $(1+\alpha):(1-\alpha):1$ (where $-1 \leq \alpha \leq 1$), a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $5:1:\beta$ (where $\beta \geq 0$), a line where the atomic ratio [In]:[M]:[Zn] is $2:1:\beta$, a line where the atomic ratio [In]:[M]:[Zn] is $1:1:\beta$, a line where the atomic ratio [In]:[M]:[Zn] is $1:2:\beta$, a line where the atomic ratio [In]:[M]:[Zn] is $1:3:\beta$, and a line where the atomic ratio [In]:[M]:[Zn] is $1:4:\beta$.

An oxide with the atomic ratio [In]:[M]:[Zn]=0:2:1 and the vicinity thereof in FIGS. 4A to 4C tends to have a spinel crystal structure.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

A region A in FIG. 4A is an example of the preferred ranges of the atomic ratio of indium, the element M, and zinc contained in an oxide.

In addition, the oxide having a high content of indium can have high carrier mobility (electron mobility). Thus, an oxide having a high content of indium has higher carrier mobility than an oxide having a low content of indium.

In contrast, carrier mobility decreases as the indium content and the zinc content in an oxide become lower. Thus, with an atomic ratio of [In]:[M]:[Zn]=0:1:0 and the vicinity thereof (e.g., a region C in FIG. 4C), insulation performance becomes better.

Accordingly, an oxide of one embodiment of the present invention preferably has an atomic ratio represented by the region A in FIG. 4A. With the atomic ratio, a layered structure with high carrier mobility and a few grain boundaries is easily obtained.

In the region A, particularly in a region B in FIG. 4B, an excellent oxide which easily becomes a CAAC-OS and has high carrier mobility can be obtained.

The CAAC-OS is an oxide with high crystallinity. In contrast, in the CAAC-OS, reduction in the electron mobility due to the grain boundary is less likely to occur because it is difficult to observe a clear grain boundary. Entry of impurities, formation of defects, or the like might decrease the crystallinity of an oxide. This means that the CAAC-OS has small amounts of impurities and defects (e.g., oxygen vacancies). Thus, an oxide including a CAAC-OS is physically stable. Therefore, the oxide including a CAAC-OS is resistant to heat and has favorable reliability.

Note that the region B includes an atomic ratio of [In]:[M]:[Zn]=4:2:3 to 4:2:4.1 and the vicinity thereof. The vicinity includes an atomic ratio of [In]:[M]:[Zn]=5:3:4, for example. Note that the region B includes an atomic ratio of [In]:[M]:[Zn]=5:1:6 and the vicinity thereof and an atomic ratio of [In]:[M]:[Zn]=5:1:7 and the vicinity thereof.

Note that the property of an oxide is not uniquely determined by an atomic ratio. Even with the same atomic ratio, the property of an oxide might be different depending on a formation condition. For example, in the case where the oxide is deposited with a sputtering apparatus, a film having an atomic ratio deviated from the atomic ratio of a target is formed. In addition, [Zn] in the film might be smaller than [Zn] in the target depending on the substrate temperature in the film formation. Thus, the illustrated regions each represent an atomic ratio with which an oxide tends to have specific characteristics, and boundaries of the regions A to C are not clear.

<Composition of CAC-OS>

Described below is the composition of a cloud-aligned composite oxide semiconductor (CAC-OS) applicable to a transistor disclosed in one embodiment of the present invention.

The CAC-OS has, for example, a composition in which elements included in an oxide semiconductor are unevenly distributed. Materials including unevenly distributed elements each have a region with a size of greater than or equal to 0.5 nm and less than or equal to 10 nm, preferably greater than or equal to 1 nm and less than or equal to 2 nm, or a similar size. Note that in the following description of an oxide semiconductor, a state in which one or more metal elements are unevenly distributed and regions including the metal element(s) are mixed is referred to as a mosaic pattern or a patch-like pattern. The region has a size of greater than or equal to 0.5 nm and less than or equal to 10 nm, preferably greater than or equal to 1 nm and less than or equal to 2 nm, or a similar size.

An oxide semiconductor preferably contains at least indium. In particular, indium and zinc are preferably contained. In addition, one or more of aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like may be contained.

For example, of the CAC-OS, an In—Ga—Zn oxide with the CAC composition (such an In—Ga—Zn oxide may be particularly referred to as CAC-IGZO) has a composition in which materials are separated into indium oxide (InO$_{X1}$, where X1 is a real number greater than 0) or indium zinc oxide (In$_{X2}$Zn$_{Y2}$O$_{Z2}$, where X2, Y2, and Z2 are real numbers greater than 0), and gallium oxide (GaO$_{X3}$, where X3 is a real number greater than 0), gallium zinc oxide (Ga$_{X4}$Zn$_{Y4}$O$_{Z4}$, where X4, Y4, and Z4 are real numbers greater than 0), or the like, and a mosaic pattern is formed. Then, InO$_{X1}$ or In$_{X2}$Zn$_{Y2}$O$_{Z2}$ forming the mosaic pattern is evenly distributed in the film. Hereinafter, this composition is also referred to as a cloud-like composition.

That is, the CAC-OS is a composite oxide semiconductor with a composition in which a region including GaO$_{X3}$ as a main component and a region including In$_{X2}$Zn$_{Y2}$O$_{Z2}$ or InO$_{X1}$ as a main component are mixed. Note that in this specification, for example, when the atomic ratio of In to an element M in a first region is greater than the atomic ratio of In to an element M in a second region, the first region has higher In concentration than the second region.

Note that a compound including In, Ga, Zn, and O is also known as IGZO. Typical examples of IGZO include a crystalline compound represented by InGaO$_3$(ZnO)$_{m1}$ (m1 is a natural number) and a crystalline compound represented by In$_{(1+x0)}$Ga$_{(1-x0)}$O$_3$(ZnO)$_{m0}$ ($-1 \leq x0 \leq 1$; m0 is a given number).

The above crystalline compounds have a single crystal structure, a polycrystalline structure, or a CAAC structure. Note that the CAAC structure is a crystal structure in which a plurality of IGZO nanocrystals have c-axis alignment and are connected in the a-b plane direction without alignment.

On the other hand, the CAC-OS relates to the material composition of an oxide semiconductor. In a material composition of a CAC-OS including In, Ga, Zn, and O, nanoparticle regions including Ga as a main component are observed in part of the CAC-OS and nanoparticle regions including In as a main component are observed in part thereof. These nanoparticle regions are randomly dispersed to form a mosaic pattern. Therefore, the crystal structure is a secondary element for the CAC-OS.

Note that in the CAC-OS, a stacked-layer structure including two or more films with different atomic ratios is not included. For example, a two-layer structure of a film including In as a main component and a film including Ga as a main component is not included.

It is difficult to observe a clear boundary between the region including GaO$_{X3}$ as a main component and the region including In$_{X2}$Zn$_{Y2}$O$_{Z2}$ or InO$_{X1}$ as a main component in some cases.

In the case where one or more of aluminum, yttrium, copper, vanadium, beryllium, boron, titanium, iron, nickel, germanium, zirconium, molybdenum, lanthanum, cerium, neodymium, hafnium, tantalum, tungsten, magnesium, and the like are contained instead of gallium in a CAC-OS, nanoparticle regions including the metal element(s) as a main component(s) are observed in part of the CAC-OS and nanoparticle regions including In as a main component are observed in part thereof, and these nanoparticle regions are randomly dispersed to form a mosaic pattern in the CAC-OS.

The CAC-OS can be formed by a sputtering method under conditions where a substrate is not heated, for example. In the case where the CAC-OS is formed by a sputtering method, one or more of an inert gas (typically, argon), an oxygen gas, and a nitrogen gas may be used as a deposition gas. The ratio of the flow rate of an oxygen gas to the total flow rate of the deposition gas at the time of film formation is preferably as low as possible, and for example, the flow rate of an oxygen gas is higher than or equal to 0% and less than 30%, preferably higher than or equal to 0% and less than or equal to 10%.

The CAC-OS is characterized in that a clear peak is not observed when measurement is conducted using a θ/2θ scan by an out-of-plane method, which is an X-ray diffraction (XRD) method. That is, X-ray diffraction shows no alignment in the a-b plane direction and the c-axis direction in a measured region.

In the CAC-OS, an electron diffraction pattern that is obtained by irradiation with an electron beam with a probe diameter of 1 nm (also referred to as nanobeam electron beam) has regions with high luminance in a ring pattern and a plurality of bright spots appear in the ring-like pattern. Therefore, the electron diffraction pattern indicates that the crystal structure of the CAC-OS includes a nanocrystal (nc) structure with no alignment in plan-view and cross-sectional directions.

For example, an energy dispersive X-ray spectroscopy (EDX) mapping image indicates that an In—Ga—Zn oxide with the CAC composition has a structure in which a region including $GaO_{X3}$ as a main component and a region including $In_{X2}Zn_{Y2}O_{Z2}$ or $InO_{X1}$ as a main component are unevenly distributed and mixed.

The CAC-OS has a structure different from that of an IGZO compound in which metal elements are evenly distributed, and has characteristics different from those of the IGZO compound. That is, in the CAC-OS, regions including $GaO_{X3}$ or the like as a main component and regions including $In_{X2}Zn_{Y2}O_{Z2}$ or $InO_{X1}$ as a main component are separated to form a mosaic pattern.

The conductivity of a region including $In_{X2}Zn_{Y2}O_{Z2}$ or $InO_{X1}$ as a main component is higher than that of a region including $GaO_{X3}$ or the like as a main component. In other words, when carriers flow through regions including $In_{X2}Zn_{Y2}O_{Z2}$ or $InO_{X1}$ as a main component, the conductivity of an oxide semiconductor is exhibited. Accordingly, when regions including $In_{X2}Zn_{Y2}O_{Z2}$ or $InO_{X1}$ as a main component are distributed in an oxide semiconductor like a cloud, high field-effect mobility ($\mu$) can be achieved.

In contrast, the insulating property of a region including $GaO_{X3}$ or the like as a main component is higher than that of a region including $In_{X2}Zn_{Y2}O_{Z2}$ or $InO_{X1}$ as a main component. In other words, when regions including $GaO_{X3}$ or the like as a main component are distributed in an oxide semiconductor, a leakage current can be suppressed and favorable switching operation can be achieved.

Accordingly, when a CAC-OS is used for a semiconductor element, the insulating property derived from $GaO_{X3}$ or the like and the conductivity derived from $In_{X2}Zn_{Y2}O_{Z2}$ or $InO_{X1}$ complement each other, whereby a high on-state current ($I_{on}$), high field-effect mobility ($\mu$), and a low off-state current ($I_{off}$) can be achieved.

A semiconductor element including a CAC-OS has favorable reliability. Thus, the CAC-OS is suitably used in a variety of semiconductor devices typified by a display.

<Transistor Including Oxide>

Next, the case where the oxide is used for a transistor will be described.

Note that when the oxide is used for a channel formation region of a transistor, carrier scattering or the like at a grain boundary can be reduced as compared with a transistor using silicon or the like in a channel formation region; thus, the transistor having high field-effect mobility and favorable electrical characteristics can be obtained.

An oxide with a low carrier density is preferably used for the transistor. For example, an oxide whose carrier density is lower than $8 \times 10^{11}/cm^3$, preferably lower than $1 \times 10^{11}/cm^3$, or further preferably lower than $1 \times 10^{10}/cm^3$, and greater than or equal to $1 \times 10^{-9}/cm^3$ is used for the transistor.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, the transistor whose channel formation region is formed in the oxide having high density of trap states has unstable electrical characteristics in some cases.

Thus, in order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. As examples of the impurities, hydrogen, nitrogen, alkali metal, alkaline earth metal, iron, nickel, silicon, and the like are given.

<Impurities>

Here, the influence of impurities in the oxide will be described.

When silicon or carbon that is a Group 14 element is contained in the oxide, defect states are formed. Thus, the oxide is formed to have a region where the concentration of silicon or carbon (measured by secondary ion mass spectrometry (SIMS)) is controlled to be lower than or equal to $2 \times 10^{18}$ atoms/$cm^3$, preferably lower than or equal to $2 \times 10^{17}$ atoms/$cm^3$ in the oxide and around an interface between the oxide and another layer.

When alkali metal or alkaline earth metal is contained in the oxide, the metal forms defect states in the oxide and carriers are generated, in some cases. Thus, a transistor including an oxide that contains alkali metal or alkaline earth metal for a channel formation region is likely to be normally on. Therefore, it is preferable to reduce the concentration of alkali metal or alkaline earth metal in the oxide. Specifically, the concentration of alkali metal or alkaline earth metal in the oxide, which is measured by SIMS, is set lower than or equal to $1 \times 10^{18}$ atoms/$cm^3$, and preferably lower than or equal to $2 \times 10^{16}$ atoms/$cm^3$.

When nitrogen is contained in the oxide, the oxide easily becomes n-type by generation of electrons serving as carriers and an increase of carrier density. Thus, a transistor including an oxide that contains nitrogen for a channel formation region is likely to be normally on. Therefore, it is preferable to reduce nitrogen in the oxide as much as possible. The concentration of nitrogen in the oxide, which is measured by SIMS, is set, for example, lower than $5 \times 10^{19}$ atoms/$cm^3$, preferably lower than or equal to $5 \times 10^{18}$ atoms/$cm^3$, further preferably lower than or equal to $1 \times 10^{18}$ atoms/$cm^3$, and still further preferably lower than or equal to $5 \times 10^{17}$ atoms/$cm^3$.

Hydrogen contained in the oxide reacts with oxygen bonded to a metal atom to be water, and thus causes an oxygen vacancy in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen for a channel formation region is likely to be normally on. Therefore, it is preferable to reduce hydrogen in the oxide as much as possible. Specifically, the concentration of hydrogen in the oxide measured by SIMS is set to be lower than $1 \times 10^{20}$ atoms/$cm^3$, preferably lower than $1 \times 10^{19}$ atoms/$cm^3$, more preferably lower than $5 \times 10^{18}$ atoms/$cm^3$, and still more preferably lower than $1 \times 10^{18}$ atoms/$cm^3$.

When an oxide with sufficiently reduced impurity concentration is used for a channel formation region of a transistor, the transistor can have stable electrical characteristics.

<Band Diagram>

Figure 5:
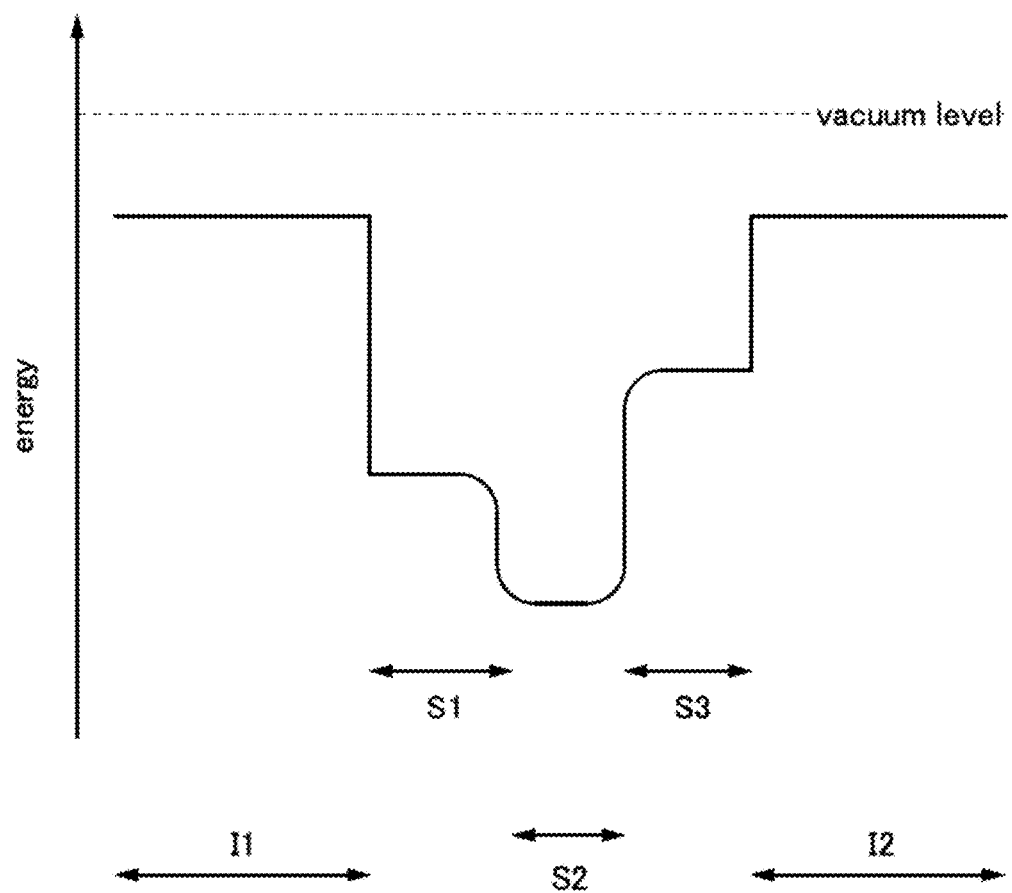
FIG. 5 is a band diagram of a stacked-layer structure of an oxide.
Figure 13A:
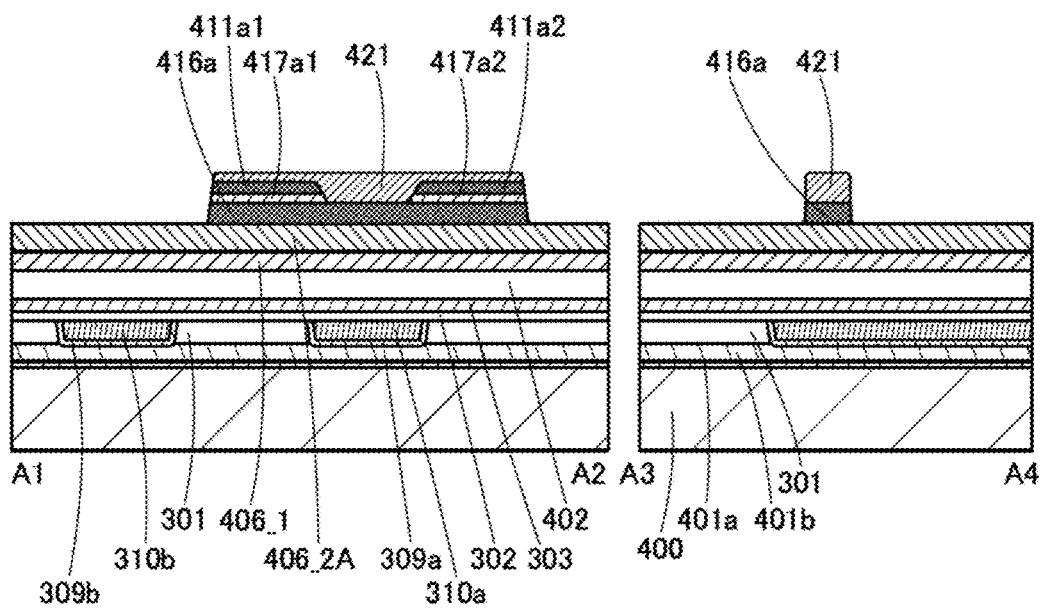
FIGS. 13A to 13D illustrate a manufacturing method of transistors of one embodiment of the present invention.
Figure 13B:
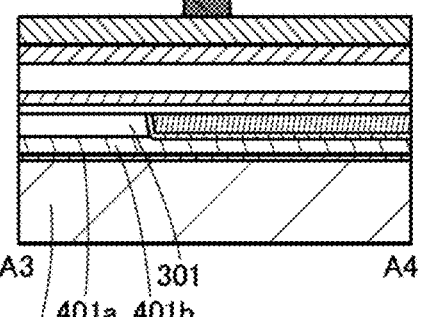
Figure 13C:
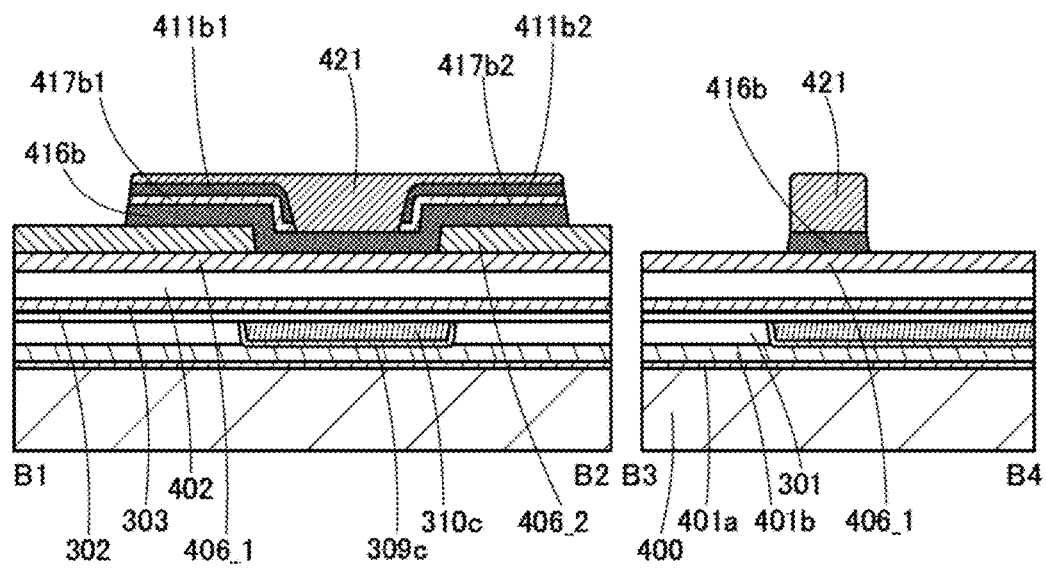
Figure 13D:
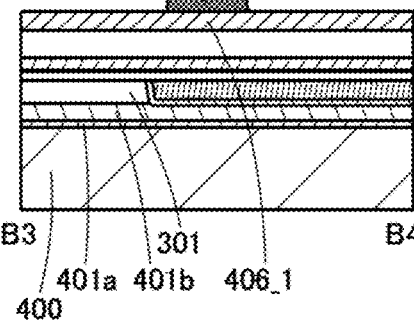
Figure 14A:
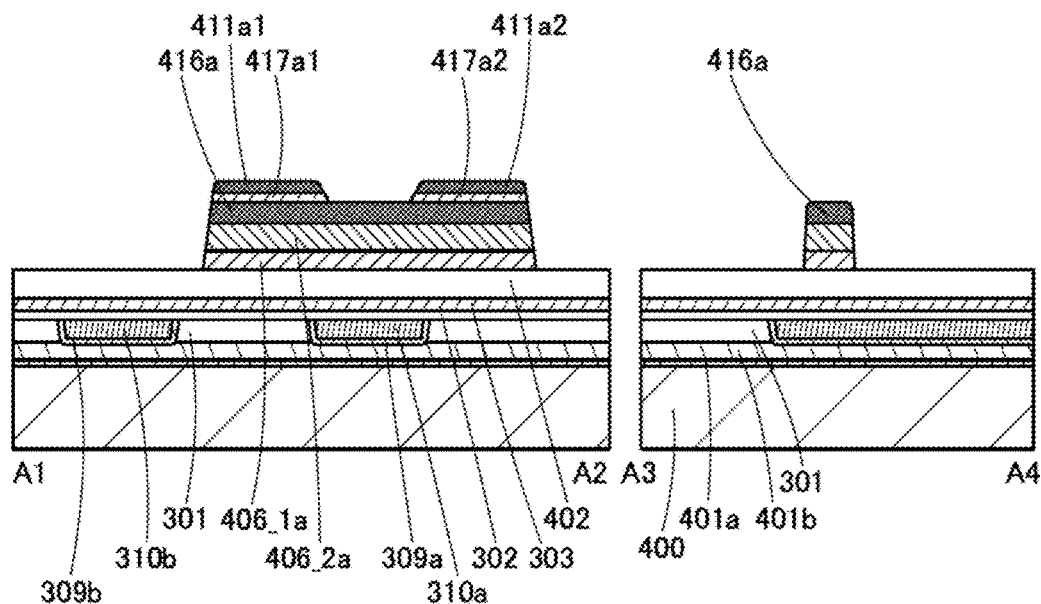
FIGS. 14A to 14D illustrate a manufacturing method of transistors of one embodiment of the present invention.
Figure 14B:
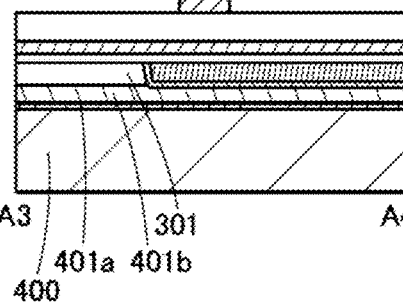
Figure 14C:
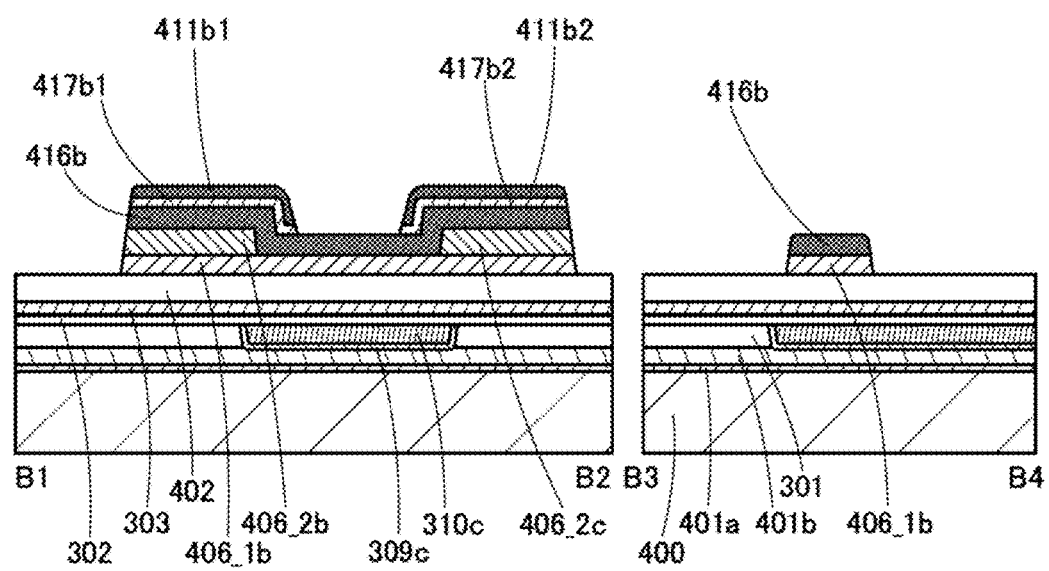
Figure 14D:
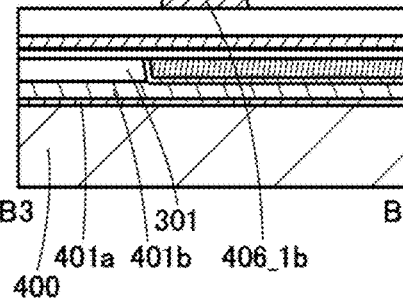
Figure 17A:
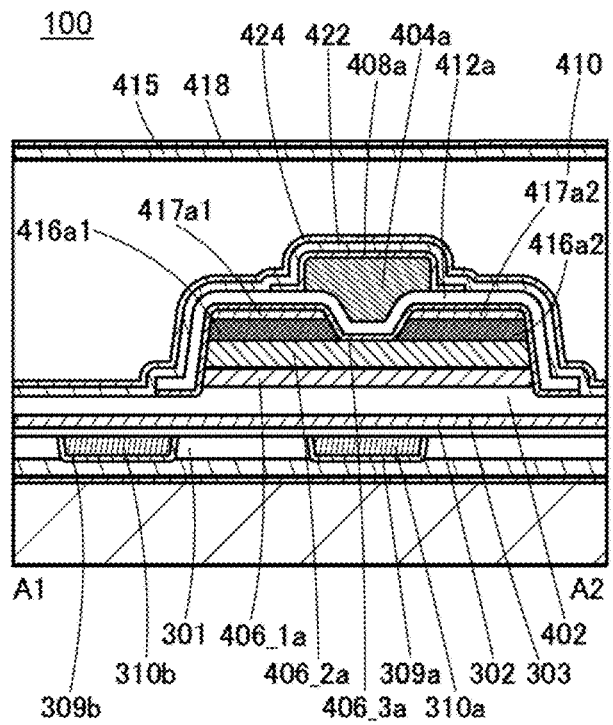
FIGS. 17A to 17D illustrate a manufacturing method of transistors of one embodiment of the present invention.
Figure 17B:
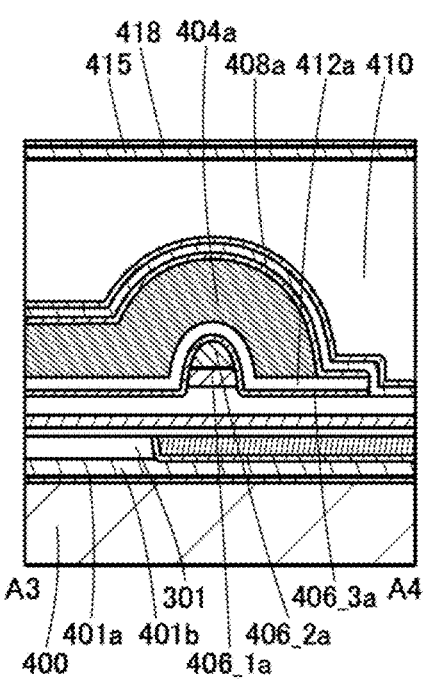
Figure 17C:
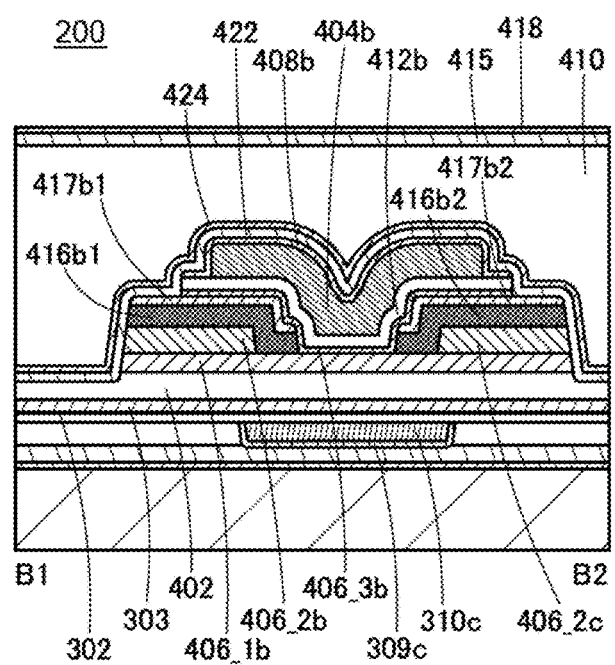
Figure 17D:
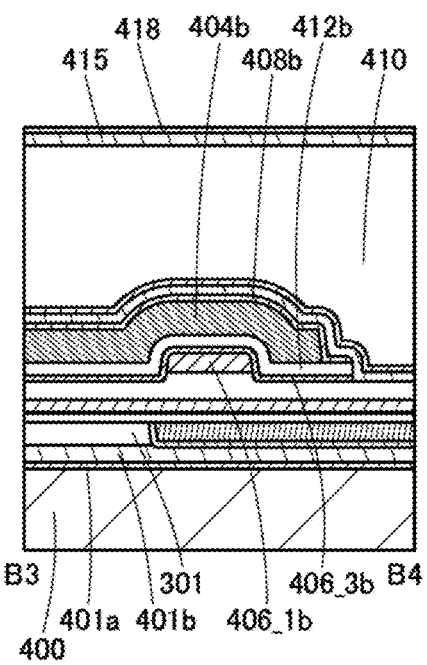

Next, the case where the oxide has a three-layer structure will be described. With reference to FIG. 5, the description is made on a band diagram of a stacked structure of an oxide S1, an oxide S2, and an oxide S3 and insulators that are in contact with the stacked structure.

FIG. 5 is an example of a band diagram of a stacked structure including an insulator I1, the oxide S1, the oxide S2, the oxide S3, and an insulator I2 in a thickness direction. Note that for easy understanding, the band diagram shows the energy level of the conduction band minimum (Ec) of each of the insulator I1, the oxide S1, the oxide S2, the oxide S3, and the insulator I2.

The conduction band minimum of each of the oxides S1 and S3 is closer to the vacuum level than that of the oxide S2. Typically, a difference between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, a difference in the electron affinity between each of the oxides S1 and S3 and the oxide S2 is preferably greater than or equal to 0.15 eV or greater than or equal to 0.5 eV, and less than or equal to 2 eV or less than or equal to 1 eV. As shown in FIG. 5, the electron affinity of the oxide S3 is preferably smaller than that of the oxide S1.

As illustrated in FIG. 5, the energy level of the conduction band minimum gradually varies between. In other words, the energy level of the conduction band minimum of each of the oxides S1 to S3 is continuously varied or continuous junction is formed. In order to obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed at the interface between the oxides S1 and S2 or the interface between the oxides S2 and S3. For example, in the case where the oxide S2 is an In—Ga—Zn oxide, it is preferable to use an In—Ga—Zn oxide, a Ga—Zn oxide, gallium oxide, or the like as each of the oxides S1 and S3.

In this case, the oxide S2 serves as a main carrier path, and the density of defect states at the interface between the oxides S1 and S2 and the interface between the oxides S2 and S3 can be made low. Accordingly, the influence of interface scattering at the interface between the oxides S1 and S2 and the interface between the oxides S2 and S3 on carrier conduction is small, and a high on-state current can be obtained from a transistor including the oxide S2 in a channel formation region.

When an electron is trapped in a trap state at the interface between the oxide and the insulator I1 or the interface between the oxide and the insulator I2, the trapped electron behaves like fixed charge; thus, the threshold voltage of the transistor having a structure in which the oxide S2 is in contact with the insulator I1 or I2 is shifted in the positive direction. In contrast, the oxides S1 and S3 can make the trap state apart from the oxide S2. This structure can suppress the positive shift of the threshold voltage of the transistor.

A material whose conductivity is sufficiently lower than that of the oxide S2 is used for the oxides S1 and S3. Accordingly, the oxide S2, the interface between the oxides S1 and S2, and the interface between the oxides S2 and S3 mainly function as a channel formation region of the transistor. For example, an oxide with high insulation performance and the atomic ratio represented by the region C in FIG. 4C is used as each of the oxides S1 and S3. Note that the region C in FIG. 4C represents the atomic ratio [In]: [M]:[Zn] of 0:1:0, 1:3:2, and 1:3:4 and the vicinities thereof.

In the case where an oxide with the atomic ratio represented by the region A is used as the oxide S2, it is preferable to use an oxide with an atomic ratio where [M]/[In] is greater than or equal to 1, preferably greater than or equal to 2 as each of the oxides S1 and S3. In addition, it is suitable to use an oxide with sufficiently high insulation performance and an atomic ratio where [M]/([Zn]+[In]) is greater than or equal to 1 as the oxide S3.

In one embodiment of the present invention, preferably, a material corresponding to the oxide S3 is used for the oxide 406_3a of the transistor 100, a material corresponding to the oxide S2 is used for the oxide 406_2a including the channel formation region of the transistor 100, and a material corresponding to the oxide S1 is used for the oxide 406_1a of the transistor 100. Accordingly, the transistor 100 can have a low off-state current and a high on-state current.

In one embodiment of the present invention, preferably, a material corresponding to the oxide S3 is used for the oxide 406_3b of the transistor 200, a material corresponding to the oxide S2 is used for each of the oxides 406_2b and 406_2c of the transistor 200, and a material corresponding to the oxide S1 is used for the oxide 406_1b of the transistor 200. Accordingly, the transistor 200 can have a low off-state current.

An oxide containing In and Zn is preferably used as each of the oxides 406_1a and 406_2a of the transistor 100 and the oxides 406_1b, 406_2b, and 406_2c of the transistor 200. An oxide containing Ga is preferably used as each of the oxide 406_3a of the transistor 100 and the oxide 406_3b of the transistor 200. Note that the details will be described later.

The oxide S2 and the oxide S1 can be used for the channel formation region of the transistor 100 and the channel formation region of the transistor 200, respectively. As described above, the oxide S1 is a material whose conductivity is sufficiently lower than that of the oxide S2. Therefore, the transistors 100 and 200 can have different electrical characteristics. Specifically, the transistor 200 can have better normally-off electrical characteristics and a lower off-state current than the transistor 100. When the transistors 100 and 200 having different electrical characteristics are electrically connected to each other in the above-described manner, data can be retained for a long time in the semiconductor device 1000 of one embodiment of the present invention.

As described above, the structures, methods, and the like described in this embodiment can be combined with any of the structures, methods, and the like described in the other embodiments as appropriate.

(Embodiment 2)

<Manufacturing Method of Semiconductor Device 1000>

A manufacturing method of the semiconductor device 1000 including the transistor 100 in FIGS. 2A to 2C and the transistor 200 in FIGS. 3A to 3C of the present invention will be described below with reference to FIGS. 6A to 6D to FIGS. 17A to 17D. FIG. 6A, FIG. 7A, FIG. 8A, FIG. 9A, FIG. 10A, FIG. 11A, FIG. 12A, FIG. 13A, FIG. 14A, FIG. 15A, FIG. 16A, and FIG. 17A are each a cross-sectional view taken along dashed-dotted line A1-A2 in FIG. 2A. FIG.

6B, FIG. 7B, FIG. 8B, FIG. 9B, FIG. 10B, FIG. 11B, FIG. 12B, FIG. 13B, FIG. 14B, FIG. 15B, FIG. 16B, and FIG. 17B are each a cross-sectional view taken along dashed-dotted line A3-A4 in FIG. 2A. FIG. 6C, FIG. 7C, FIG. 8C, FIG. 9C, FIG. 10C, FIG. 11C, FIG. 12C, FIG. 13C, FIG. 14C, FIG. 15C, FIG. 16C, and FIG. 17C are each a cross-sectional view taken along dashed-dotted line B1-B2 in FIG. 3A. FIG. 6D, FIG. 7D, FIG. 8D, FIG. 9D, FIG. 10D, FIG. 11D, FIG. 12D, FIG. 13D, FIG. 14D, FIG. 15D, FIG. 16D, and FIG. 17D are each a cross-sectional view taken along dashed-dotted line B3-B4 in FIG. 3A.

First, the substrate 400 is prepared.

Then, the insulator 401a is formed. The insulator 401a can be formed by a sputtering method, a chemical vapor deposition (CVD) method, a molecular beam epitaxy (MBE) method, a pulsed laser deposition (PLD) method, an atomic layer deposition (ALD) method, or the like.

CVD methods can be classified into a plasma enhanced CVD (PECVD) method using plasma, a thermal CVD (TCVD) method using heat, a photo CVD method using light, and the like. Moreover, the CVD method can be classified into a metal CVD (MCVD) method and a metal organic CVD (MOCVD) method depending on a source gas.

By using the PECVD method, a high-quality film can be formed at a relatively low temperature. Furthermore, a thermal CVD method does not use plasma and thus causes less plasma damage to an object. For example, a wiring, an electrode, an element (e.g., transistor or capacitor), or the like included in a semiconductor device might be charged up by receiving charges from plasma. In that case, accumulated charges might break the wiring, electrode, element, or the like included in the semiconductor device. By contrast, when a thermal CVD method not using plasma is employed, such plasma damage is not caused and the yield of the semiconductor device can be increased. A thermal CVD method does not cause plasma damage during film formation, so that a film with few defects can be obtained.

An ALD method also causes less plasma damage to an object. An ALD method does not cause plasma damage during film formation, so that a film with few defects can be obtained.

Different from a film formation method whereby particles released from a target or the like are deposited, a CVD method and an ALD method are film formation methods whereby a film is formed by a reaction at a surface of an object. Thus, a CVD method and an ALD method enable favorable step coverage almost regardless of the shape of an object. In particular, an ALD method enables excellent step coverage and excellent thickness uniformity and can be favorably used for covering a surface of an opening with a high aspect ratio, for example. On the other hand, an ALD method has a relatively low deposition rate; thus, it is sometimes preferable to combine an ALD method with another film formation method with a high deposition rate such as a CVD method.

By a CVD method and an ALD method, a film with a desired composition can be formed by adjusting the flow rate ratio of the source gases. For example, a film with a certain composition can be formed by adjusting the flow rate ratio of the source gases. Furthermore, by a CVD method and an ALD method, for example, a film with a gradually-changed composition can be formed by changing the flow rate ratio of the source gases during film formation. In the case where the film is formed while changing the flow rate ratio of source gases, as compared to the case where the film is formed using a plurality of deposition chambers, time taken for the film formation can be reduced because time taken for transfer and pressure adjustment is omitted. Thus, semiconductor devices can be manufactured with improved productivity in some cases.

Next, the insulator 401b is formed over the insulator 401a. The insulator 401b can be formed by a sputtering method, a CVD method, an MBE method, a PLD method, an ALD method, or the like. Then, the insulator 301 is formed over the insulator 401b. The insulator 301 can be formed by a sputtering method, a CVD method, an MBE method, a PLD method, an ALD method, or the like.

Then, openings reaching the insulator 401b are formed in the insulator 301. Examples of the opening include a hole and a groove. The openings may be formed by a wet etching method; however, a dry etching method is preferable for microfabrication. The insulator 401b is preferably an insulator functioning as an etching stopper film used in forming the openings by etching the insulator 301. For example, in the case where a silicon oxide film is used as the insulator 301 in which the openings are to be formed, the insulator 401b is preferably formed using a silicon nitride film, an aluminum oxide film, or a hafnium oxide film.

In this embodiment, aluminum oxide is deposited as the insulator 401a by an ALD method, and aluminum oxide is deposited as the insulator 401b by a sputtering method.

After the formation of the openings, a conductor to be the conductors 309a, 309b, and 309c is formed. The conductor to be the conductors 309a, 309b, and 309c preferably includes a conductor with a function of inhibiting penetration of oxygen. For example, tantalum nitride, tungsten nitride, or titanium nitride can be used. Alternatively, a stacked-layer film formed using the conductor and tantalum, tungsten, titanium, molybdenum, aluminum, copper, or a molybdenum-tungsten alloy can be used. The conductor to be the conductors 309a, 309b, and 309c can be formed by a sputtering method, a CVD method, an MBE method, a PLD method, an ALD method, or the like.

In this embodiment, tantalum nitride is deposited by a sputtering method as the conductor to be the conductors 309a, 309b, and 309c.

Next, a conductor to be the conductors 310a, 310b, and 310c is formed over the conductor to be the conductors 309a, 309b, and 309c. The conductor to be the conductors 310a, 310b, and 310c can be formed by a sputtering method, a CVD method, an MBE method, a PLD method, an ALD method, or the like.

In this embodiment, as the conductor to be the conductors 310a, 310b, and 310c, titanium nitride is deposited by an ALD method and tungsten is deposited by a CVD method over the titanium nitride.

Next, chemical mechanical polishing (CMP) is performed to remove the conductor to be the conductors 309a, 309b, and 309c and the conductor to be the conductors 310a, 310b, and 310c that are located over the insulator 301. Consequently, the conductor to be the conductors 309a, 309b, and 309c and the conductor to be the conductors 310a, 310b, and 310c remain only in the openings formed in the insulator 301, whereby the conductors 309a, 310a, 309b, 310b, 309c, and 310c that have flat top surfaces can be formed.

Next, the insulator 302 is formed over the insulator 301 and the conductors 309a, 310a, 309b, 310b, 309c, and 310c. The insulator 302 can be formed by a sputtering method, a CVD method, an MBE method, a PLD method, an ALD method, or the like.

Then, the insulator 303 is formed over the insulator 302. The insulator 303 can be formed by a sputtering method, a CVD method, an MBE method, a PLD method, an ALD method, or the like.

Next, the insulator 402 is formed over the insulator 303. The insulator 402 can be formed by a sputtering method, a CVD method, an MBE method, a PLD method, an ALD method, or the like.

Next, first heat treatment is preferably performed. The first heat treatment is performed at a temperature higher than or equal to 250° C. and lower than or equal to 650° C., preferably higher than or equal to 300° C. and lower than or equal to 500° C. In the case where a wiring or the like formed using copper is formed under the transistor described in this embodiment, the temperature of the first heat treatment is preferably 410° C. or lower. The first heat treatment is performed in an inert gas atmosphere. The first heat treatment may be performed under a reduced pressure. The first heat treatment is preferably performed in a nitrogen gas atmosphere at 400° C. By the first heat treatment, impurities such as hydrogen and water included in the insulator 402 can be removed, for example.

Next, the oxide 406_1 is formed over the insulator 402 (see FIGS. 6A to 6D). The oxide 406_1 can be formed by a sputtering method, a CVD method, an MBE method, a PLD method, an ALD method, or the like.

The oxide 406_1 is preferably formed by a sputtering method. This is because the oxide 406_1 formed by a sputtering method can have higher density. As a sputtering gas, a rare gas (typically argon), oxygen, or a mixed gas of a rare gas and oxygen is used as appropriate. As the sputtering gas, nitrogen may be contained. Film formation may be performed in the state where the substrate is heated.

Increasing the purity of a sputtering gas is preferred. For example, as an oxygen gas or an argon gas used for a sputtering gas, a gas which is highly purified to have a dew point of −40° C. or lower, preferably −80° C. or lower, further preferably −100° C. or lower, or still further preferably −120° C. or lower is used, whereby entry of moisture and the like into the oxide 406_1 can be inhibited as much as possible.

A chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide 406_1 are removed as much as possible. Alternatively, a turbo molecular pump and a cold trap are preferably combined so as to prevent a backflow of a gas, especially a gas containing carbon or hydrogen from an exhaust system to the inside of the chamber.

As a power source of the sputtering apparatus, a DC power source, an AC power source, or an RF power source may be used.

In the sputtering apparatus, a target or a magnet may be rotated or oscillated. For example, the oxide films can be formed while a magnet unit is oscillated vertically and/or horizontally. For example, the target may be rotated or oscillated with a beat (also referred to as rhythm, pulse, frequency, period, cycle, or the like) greater than or equal to 0.1 Hz and less than or equal to 1 kHz. Alternatively, the magnet unit may be oscillated with a beat of greater than or equal to 0.1 Hz and less than or equal to 1 kHz.

The substrate temperature in forming the oxide 406_1 is preferably higher than or equal to room temperature and lower than or equal to 400° C. For example, the substrate temperature is set as appropriate in the above range to a temperature which is higher than or equal to the evaporation temperature of water (e.g., 100° C.) and enables favorable maintainability and throughput of an apparatus.

In forming the oxide 406_1, a rare gas (typically, argon), oxygen, or a mixed gas of a rare gas and oxygen is used as a sputtering gas as appropriate. In the case of a mixed gas, the proportion of an oxygen gas in a whole deposition gas is preferably 70% or higher, further preferably 80% or higher, still further preferably 100%. When an oxide containing excess oxygen is used as the oxide 406_1, oxygen can be supplied to an oxide 406_2A to be formed later.

The oxide 406_1 can be formed using an In-M-Zn oxide target. The atomic ratio of In to the element M in the In-M-Zn oxide target of the oxide 406_1 is preferably lower than that in an In-M-Zn oxide target of the oxide 406_2A described later. For example, a metal oxide target having an atomic ratio of [In]:[M]:[Zn]=1:3:4 or the vicinity thereof is preferably used.

In this embodiment, the oxide 406_1 is formed in an atmosphere containing an oxygen gas at 100% at a substrate temperature of 200° C. with an In—Ga—Zn oxide target having an atomic ratio of [In]:[Ga]:[Zn]=1:3:4 or the vicinity thereof.

Next, treatment for adding oxygen to the oxide 406_1 may be performed. An ion implantation method, a plasma treatment method, or the like can be used for the treatment for adding oxygen. Note that oxygen added to the oxide 406_1 becomes excess oxygen and the excess oxygen can be supplied to the oxide 406_2A to be formed over the oxide 406_1.

Next, second heat treatment is preferably performed (see FIGS. 7A to 7D). For the second heat treatment, the conditions for the first heat treatment can be used. Preferably, treatment at 400° C. in a nitrogen atmosphere for one hour and treatment at 400° C. in an oxygen atmosphere for one hour are successively performed in this order. The second heat treatment allows the oxide 406_1 to have high crystallinity and high density. In the case where the density of the oxide 406_1 is increased by the second heat treatment, only a desired portion of the oxide 406_2A to be formed later can be removed over the oxide 406_1 used as an etching stopper film when selective wet etching is performed on the oxide 406_2A. By the second heat treatment, impurities such as hydrogen and water can be removed from the oxide 406_1.

Next, the oxide 406_2A is formed over the oxide 406_1 (see FIGS. 8A to 8D). The oxide 406_2A can be formed by a sputtering method, a CVD method, an MBE method, a PLD method, an ALD method, or the like.

The oxide 406_2A is preferably formed by a sputtering method. As a sputtering gas, a rare gas (typically argon), oxygen, or a mixed gas of a rare gas and oxygen may be used as appropriate. As the sputtering gas, nitrogen may be contained. Film formation may be performed in the state where the substrate is heated.

Increasing the purity of a sputtering gas is preferred. For example, as an oxygen gas or an argon gas used for a sputtering gas, a gas which is highly purified to have a dew point of −40° C. or lower, preferably −80° C. or lower, further preferably −100° C. or lower, or still further preferably −120° C. or lower is used, whereby entry of moisture and the like into the oxide 406_2A can be inhibited as much as possible.

A chamber of a sputtering apparatus is preferably evacuated to a high vacuum (to the degree of approximately $5 \times 10^{-7}$ Pa to $1 \times 10^{-4}$ Pa) by an adsorption vacuum pump such as a cryopump so that water and the like acting as impurities for the oxide 406_2A are removed as much as possible. Alternatively, a turbo molecular pump and a cold trap are preferably combined so as to prevent a backflow of a gas, especially a gas containing carbon or hydrogen from an exhaust system to the inside of the chamber.

As a power source of the sputtering apparatus, a DC power source, an AC power source, or an RF power source may be used.

In the sputtering apparatus, a target or a magnet may be rotated or oscillated. For example, the oxide films can be formed while a magnet unit is oscillated vertically and/or horizontally. For example, the target may be rotated or oscillated with a beat (also referred to as rhythm, pulse, frequency, period, cycle, or the like) greater than or equal to 0.1 Hz and less than or equal to 1 kHz. Alternatively, the magnet unit may be oscillated with a beat of greater than or equal to 0.1 Hz and less than or equal to 1 kHz.

The substrate temperature in forming the oxide 406_2A is preferably higher than or equal to room temperature and lower than 150° C. For example, the substrate temperature is set as appropriate in the above range to a temperature which is higher than or equal to the evaporation temperature of water (e.g., 100° C.) and enables favorable maintainability and throughput of an apparatus.

In forming the oxide 406_2A, a rare gas (typically, argon), oxygen, or a mixed gas of a rare gas and oxygen is used as a sputtering gas as appropriate. In the case of a mixed gas, the proportion of an oxygen gas in a whole deposition gas is higher than or equal to 0% and lower than or equal to 30%, preferably higher than or equal to 5% and lower than or equal to 20%.

A material for the oxide 406_2A preferably has a narrower bandgap than that for the above-described oxide 406_1. The oxide 406_2A can be formed using an In-M-Zn oxide target. The atomic ratio of In to the element M in the In-M-Zn oxide target of the oxide 406_2A is preferably higher than that in an In-M-Zn oxide target of the oxide 406_1 described above. For example, a metal oxide target having an atomic ratio of [In]:[M]:[Zn]=4:2:4.1 or 5:1:7 or the vicinities thereof is preferably used.

The oxide 406_2A is preferably formed using a mixed gas of a rare gas and oxygen whose proportion is more than or equal to 0% and less than 50% and an In—Ga—Zn oxide target having an atomic ratio of [In]:[Ga]:[Zn]=4:2:4.1 at a substrate temperature of higher than or equal to room temperature and lower than 250° C. Further preferably, the oxide 406_2A is formed using a mixed gas of a rare gas and oxygen whose proportion is approximately 10% and an In—Ga—Zn oxide target having an atomic ratio of [In]:[Ga]:[Zn]=4:2:4.1 at a substrate temperature of higher than or equal to room temperature and lower than 150° C.

Next, only a region of the oxide 406_2A that overlaps with at least part of the conductor 309c and part of the conductor 310c is selectively removed by wet etching treatment to form an opening (see FIGS. 9A to 9D). For the wet etching treatment, a diluted oxalic acid solution, a diluted phosphoric acid solution, or the like can be used. The wet etching treatment is preferably performed with the oxide 406_2A not subjected to heat treatment after the formation of the oxide 406_2A. As described above, the second heat treatment is preferably performed after the formation of the oxide 406_1. In the case where heat treatment is performed after the formation of the oxide 406_1 and heat treatment is not performed after the formation of the oxide 406_2A, the oxide 406_1 can have higher density than the oxide 406_2A. When the wet etching treatment is performed in this state, the etching rate of the oxide 406_2A having lower density than the oxide 406_1 is higher than that of the oxide 406_1, so that only a desired portion of the oxide 406_2A can be removed over the oxide 406_1 used as an etching stopper film. By the wet etching treatment, oxides 406_2 are formed as illustrated in FIG. 9C.

Although the thickness of the oxide 406_1 is the same in a region where the oxide 406_2A is removed and regions where the oxides 406_2 are formed in FIG. 9C, part of a top surface of the oxide 406_1 may be depressed in the region where the oxide 406_2A is removed.

Next, third heat treatment may be performed. For the third heat treatment, the conditions for the first heat treatment can be used. By the third heat treatment, for example, the crystallinity of the oxide 406_2A and the oxide 406_2 can be increased and impurities such as hydrogen and water can be removed from the oxide 406_2A and the oxide 406_2. Preferably, treatment at 400° C. in a nitrogen atmosphere for one hour and treatment at 400° C. in an oxygen atmosphere for one hour are successively performed in this order.

Next, a conductor 416 is formed over the oxide 406_2A and the oxides 406_2. The conductor 416 can be formed by a sputtering method, a CVD method, an MBE method, a PLD method, an ALD method, or the like. As the conductor 416, a conductive oxide such as indium tin oxide (ITO), indium oxide including tungsten oxide, indium zinc oxide including tungsten oxide, indium oxide including titanium oxide, indium tin oxide including titanium oxide, indium zinc oxide, indium tin oxide to which silicon is added, or indium gallium zinc oxide including nitrogen is deposited, and a material including one or more of metal elements selected from aluminum, chromium, copper, silver, gold, platinum, tantalum, nickel, titanium, molybdenum, tungsten, hafnium, vanadium, niobium, manganese, magnesium, zirconium, beryllium, indium, and the like, a semiconductor with high electric conductivity, typified by polycrystalline silicon containing an impurity element such as phosphorus, or a silicide such as nickel silicide may be deposited over the oxide.

The oxide may have a function of absorbing hydrogen in the oxides 406_1, 406_2A, and 406_2 and capturing hydrogen diffused from the outside; thus, the electrical characteristics and reliability of the transistors 100 and 200 are improved in some cases. By using titanium instead of the oxide, an effect similar to the above can be obtained in some cases.

Then, a barrier film 417 is formed over the conductor 416. The barrier film 417 can be formed by a sputtering method, a CVD method, an MBE method, a PLD method, an ALD method, or the like. In this embodiment, aluminum oxide is deposited as the barrier film 417.

Next, a conductor 411 is formed over the barrier film 417 (see FIGS. 10A to 10D). The conductor 411 can be formed by a sputtering method, a CVD method, an MBE method, a PLD method, an ALD method, or the like. In this embodiment, tantalum nitride is deposited as the conductor 411.

Next, the conductor 411 and the barrier film 417 are processed by a lithography method to form conductors 411a and barrier films 417a so that an opening is provided in at least part of a region overlapping with the conductors 309a and 310a, and conductors 411b and barrier films 417b so that an opening is provided in at least part of a region overlapping with the conductors 309c and 310c (see FIGS. 11A to 11D). The barrier films 417b are each formed to have a region overlapping with a top surface and part of a side surface of the oxide 406_2 and part of the top surface of the oxide 406_1 with the conductor 416 provided therebetween as illustrated in FIG. 11C. An end portion of each of the conductors 411a and 411b and the barrier films 417a and 417b is preferably tapered. The taper angle of the end portion between the cross section and a plane parallel to the bottom surface of the substrate is greater than or equal to 30° and less than 75°, preferably greater than or equal to 30° and less than 70°. With such a taper angle of each of the conductors 411a and 411b and the barrier films 417a and 417b, coverage with films to be formed later in the manufacturing process is improved. The processing is preferably performed by a dry etching method. The dry etching method is suitable for microfabrication and formation of the above-described tapered shape.

In the lithography method, first, a resist is exposed to light through a mask. Next, a region exposed to light is removed or left using a developing solution, so that a resist mask is formed. Then, etching through the resist mask is conducted. As a result, a conductor, a semiconductor, an insulator, or the like can be processed into a desired shape. The resist mask is formed by, for example, exposure of the resist to light using KrF excimer laser light, ArF excimer laser light, extreme ultraviolet (EUV) light, or the like. Alternatively, a liquid immersion technique may be employed in which a portion between a substrate and a projection lens is filled with liquid (e.g., water) to perform light exposure. An electron beam or an ion beam may be used instead of the above-mentioned light. Note that a mask for the exposure of the resist to light is not necessary in the case of using an electron beam or an ion beam because direct writing is performed on the resist. To remove the resist mask, for example, dry etching treatment such as ashing or wet etching treatment can be used. Alternatively, wet etching treatment can be performed after dry etching treatment. Still alternatively, dry etching treatment can be performed after wet etching treatment.

As a dry etching apparatus, a capacitively coupled plasma (CCP) etching apparatus including parallel plate type electrodes can be used. The capacitively coupled plasma etching apparatus including the parallel plate type electrodes may have a structure in which a high-frequency power source is applied to one of the parallel plate type electrodes. Alternatively, the capacitively coupled plasma etching apparatus may have a structure in which different high-frequency power sources are applied to one of the parallel plate type electrodes. Alternatively, the capacitively coupled plasma etching apparatus may have a structure in which high-frequency power sources with the same frequency are applied to the parallel-plate electrodes. Alternatively, the capacitively coupled plasma etching apparatus may have a structure in which high-frequency power sources with different frequencies are applied to the parallel-plate electrodes. Alternatively, a dry etching apparatus including a high-density plasma source can be used. As the dry etching apparatus including a high-density plasma source, an inductively coupled plasma (ICP) etching apparatus can be used, for example.

Next, resists 421 are formed by a lithography method. The resists 421 are provided to have a region overlapping with the conductors 309a and 310a and a region overlapping with the conductors 309c and 310c (see FIGS. 12A to 12D).

Next, the conductors 411a and 411b, the barrier films 417a and 417b, and the conductor 416 are etched with the use of the resists 421 as etching masks to form a conductor 411a1, a conductor 411a2, a conductor 411b1, a conductor 411b2, the barrier film 417a1, the barrier film 417a2, the barrier film 417b1, the barrier film 417b2, a conductor 416a, and a conductor 416b (see FIGS. 13A to 13D).

Then, after the resists 421 are removed, with the use of the conductors 411a1, 411a2, 411b1, and 411b2, and portions of the conductors 416a and 416b each of whose surfaces is exposed, as etching masks, the oxides 406_1, 406_2A, and 406_2 are etched to form the oxides 406_1a, 406_2a, 406_1b, 406_2b, and 406_2c (see FIGS. 14A to 14D).

Next, the conductors 411a1, 411a2, 411b1, and 411b2, and the portions of the conductors 416a and 416b each of whose surfaces is exposed are etched to form the conductors 416a1, 416a2, 416b1, and 416b2 (see FIGS. 15A to 15D). By the etching treatment, part of the oxide 406_2a and/or part of the oxide 406_1b are/is removed in some cases.

Then, washing treatment may be performed using an aqueous solution in which hydrofluoric acid is diluted with pure water (diluted hydrogen fluoride solution). A diluted hydrogen fluoride solution refers to a solution in which hydrofluoric acid is mixed into pure water at a concentration of approximately 70 ppm. Next, fourth heat treatment is performed. For the fourth heat treatment, the conditions for the first heat treatment can be used. Preferably, treatment at 400° C. in a nitrogen atmosphere for one hour and treatment at 400° C. in an oxygen atmosphere for one hour are successively performed in this order. Further preferably, treatment at 400° C. in a nitrogen atmosphere for 30 minutes and treatment at 400° C. in an oxygen atmosphere for 30 minutes are successively performed in this order.

Through the above dry etching treatment, impurities derived from the etching gas might be attached to surfaces of the oxides 406_1a, 406_2a, 406_1b, 406_2b, 406_2c, and the like or diffused thereinto. Examples of the impurities include fluorine and chlorine.

The above heat treatment can reduce the impurity concentration. Furthermore, the above heat treatment can reduce the moisture concentration and the hydrogen concentration in the oxides 406_1a, 406_2a, 406_1b, 406_2b, and 406_2c.

Then, an oxide 406_3 to be the oxides 406_3a and 406_3b is formed. The oxide 406_3 can be formed by a sputtering method, a CVD method, an MBE method, a PLD method, an ALD method, or the like. In particular, the oxide 406_3 is preferably formed by a sputtering method. As for sputtering conditions, a mixed gas of argon and oxygen (the proportion of the oxygen gas is more than or equal to 0% and less than or equal to 100%, preferably more than or equal to 30% and less than or equal to 100%) is used and the deposition temperature is higher than or equal to room temperature and lower than 250° C.

As a power source of the sputtering apparatus, a DC power source, an AC power source, or an RF power source may be used, and an RF power source is preferably used.

The oxide 406_3 can be formed using an In-M-Zn oxide target. The atomic ratio of In to the element M and the atomic ratio of Zn to the element M in the In-M-Zn oxide target of the oxide 406_3 are preferably lower than those in an In-M-Zn oxide target of each of the oxides 406_1 and 406_2A described above. For example, a metal oxide target not containing In and Zn but containing a material having a wide bandgap, which contains Ga or the like, as M is preferably used. With the use of the target, the oxide 406_3 having a wider bandgap than each of the above-described oxides 406_1a, 406_2a, and 406_1b can be formed.

The oxide 406_3 is preferably formed in an atmosphere containing an oxygen gas at higher than or equal to 30% and lower than or equal to 100% at a substrate temperature of higher than or equal to room temperature and lower than 250° C. with a metal oxide target that contains Ga as M (e.g., $Ga_2O_3$).

Then, an insulator 412 to be the insulators 412a and 412b is formed over the oxide 406_3. The insulator 412 can be formed by a sputtering method, a CVD method, an MBE method, a PLD method, an ALD method, or the like.

Here, fifth heat treatment may be performed. For the fifth heat treatment, the conditions for the first heat treatment can be used. Preferably, treatment at 400° C. in a nitrogen atmosphere for one hour and treatment at 400° C. in an oxygen atmosphere for one hour are successively performed in this order. Alternatively, the heat treatment is performed at 400° C. only in a nitrogen atmosphere for one hour. By the heat treatment, the moisture concentration and the hydrogen concentration in the insulator 412 can be reduced.

Next, a conductor to be the conductors 404*a* and 404*b* is formed. The conductor to be the conductors 404*a* and 404*b* can be formed by a sputtering method, a CVD method, an MBE method, a PLD method, an ALD method, or the like.

The conductor to be the conductors 404*a* and 404*b* may be a multilayer film. For example, an oxide formed under the conditions similar to those of the oxide 406_3 may be formed as a first layer of the conductor. With such a structure, oxygen can be supplied from the oxide to the insulator 412. Oxygen added to the insulator 412 becomes excess oxygen.

Then, a conductor is formed over the oxide by a sputtering method, whereby the electric resistance value of the oxide can be decreased.

Then, sixth heat treatment may be performed. For the sixth heat treatment, the conditions for the first heat treatment can be used. Preferably, treatment at 400° C. in a nitrogen atmosphere for one hour and treatment at 400° C. in an oxygen atmosphere for one hour are successively performed in this order. Further preferably, the heat treatment is performed at 400° C. only in a nitrogen atmosphere for one hour. By the sixth heat treatment, the oxygen added to the insulator 412 when the conductor to be the conductors 404*a* and 404*b* is formed can be diffused into the oxides 406_1*a*, 406_2*a*, 406_1*b*, and 406_3. In this manner, oxygen vacancies in the oxides 406_1*a*, 406_2*a*, 406_1*b*, and 406_3 can be reduced.

The conductor to be the conductors 404*a* and 404*b* is processed by a lithography method to form the conductors 404*a* and 404*b*.

After that, an insulator to be the insulators 408*a* and 408*b* is formed. The insulator to be the insulators 408*a* and 408*b* can be formed by a sputtering method, a CVD method, an MBE method, a PLD method, an ALD method, or the like. Aluminum oxide is preferably deposited as the insulator to be the insulators 408*a* and 408*b* by an ALD method. The aluminum oxide can be deposited to have an even thickness and few pin holes on the top and side surfaces of the conductors 404*a* and 404*b*, resulting in prevention of oxidation of the conductors 404*a* and 404*b*.

Next, parts of the insulator to be the insulators 408*a* and 408*b* are selectively removed by a lithography method, so that the insulators 408*a* and 408*b* are formed. The insulators 408*a* and 408*b* are preferably formed to cover the conductors 404*a* and 404*b*, respectively. In this way, surrounding excess oxygen can be inhibited from being used for oxidation of the conductors 404*a* and 404*b*.

Then, the insulator 412 and the oxide 406_3 are processed by a lithography method to form the insulators 412*a* and 412*b* and the oxides 406_3*a* and 406_3*b* (see FIGS. 16A to 16D).

Next, the insulator 422 is formed. The insulator 422 can be formed by a sputtering method, a CVD method, an MBE method, a PLD method, an ALD method, or the like. In this embodiment, aluminum oxide is deposited by a sputtering method, in which case oxygen in the aluminum oxide can be added to the insulators 402, 412*a*, 412*b* and the oxides 406_1*a*, 406_2*a*, 406_3*a*, 406_1*b*, and 406_3*b*. After that, heat treatment is performed, whereby hydrogen contained in the insulators 402, 412*a*, and 412*b* and the oxides 406_1*a*, 406_2*a*, 406_3*a*, 406_1*b*, and 406_3*b* can be reduced.

Next, the insulator 424 is formed. The insulator 424 can be formed by a sputtering method, a CVD method, an MBE method, a PLD method, an ALD method, or the like. In this embodiment, aluminum oxide is deposited by an ALD method, whereby entry of hydrogen from above to below the aluminum oxide can be inhibited.

Next, the insulator 410 is formed. The insulator 410 can be formed by a sputtering method, a CVD method, an MBE method, a PLD method, an ALD method, or the like. Alternatively, the insulator 410 can be formed by a spin coating method, a dipping method, a droplet discharging method (such as an ink-jet method), a printing method (such as screen printing or offset printing), a doctor knife method, a roll coater method, a curtain coater method, or the like.

For the formation of the insulator 410, a CVD method is preferably used. More preferably, a plasma CVD method is used. In the case of film formation by a plasma CVD method, a step 1 of forming an insulator and a step 2 of performing treatment using plasma containing oxygen may be repeatedly conducted. By conducting the step 1 and the step 2 more than once, the insulator 410 containing excess oxygen can be formed.

The insulator 410 may be formed to have a flat top surface. For example, the insulator 410 may have a flat top surface immediately after the film formation. Alternatively, for example, the insulator 410 may have flatness by removing the insulator and the like from the top surface after the film formation so that the top surface becomes parallel to a reference surface such as a rear surface of the substrate. Such treatment is referred to as planarization treatment. As the planarization treatment, chemical mechanical polishing (CMP) treatment, dry etching treatment, or the like can be performed. However, the top surface of the insulator 410 is not necessarily flat.

Then, the insulator 415 is formed over the insulator 410. The insulator 415 can be formed by a sputtering method, a CVD method, an MBE method, a PLD method, an ALD method, or the like. For the formation of the insulator 415, a sputtering method is preferably used. The insulator 415 may be formed by a sputtering method successively after heat treatment in vacuum or reverse sputtering is performed.

Then, the insulator 418 is formed over the insulator 415 (see FIGS. 17A to 17D). The insulator 418 can be formed by a sputtering method, a CVD method, an MBE method, a PLD method, an ALD method, or the like. For the formation of the insulator 418, an ALD method is preferably used.

For example, when the insulator 418 contains aluminum oxide, impurities such as hydrogen and water can be inhibited from entering the oxides 406_1*a*, 406_2*a*, 406_3*a*, 406_1*b*, and 406_3*b* from above the insulator 418. Moreover, when the insulators 401*a*, 401*b*, 408*a*, 408*b*, 415, and 418 contain aluminum oxide, diffusion of oxygen added to the above-described oxides 406_1*a*, 406_2*a*, 406_3*a*, 406_1*b*, and 406_3*b* toward the outside of the insulators 401*a*, 401*b*, 408*a*, 408*b*, 415, and 418 can be reduced, for example. That is, oxygen added to the oxides 406_1*a*, 406_2*a*, 406_1*b*, and 406_3*b* can be sealed therein.

Here, seventh heat treatment may be performed. For the seventh heat treatment, the conditions for the first heat treatment can be used. Preferably, treatment at 400° C. in a nitrogen atmosphere for one hour and treatment at 400° C. in an oxygen atmosphere for one hour are successively performed in this order. By the heat treatment, the moisture concentration and the hydrogen concentration in the insulator 410 can be reduced.

Next, an opening that passes through the insulators 418, 415, 410, 424, 422, 402, 303, and 302 and reaches the conductor 310b, an opening that passes through the insulators 418, 415, 410, 424, 422, and 412a, the oxide 406_3a, and the barrier film 417a1 and reaches the conductor 416a1, an opening that passes through the insulators 418, 415, 410, 424, 422, and 412a, the oxide 406_3a, and the barrier film 417a2 and reaches the conductor 416a2, an opening that passes through the insulators 418, 415, 410, 424, 422, and 408a and reaches the conductor 404a, an opening that passes through the insulators 418, 415, 410, 424, and 422 and the barrier film 417b1 and reaches the conductor 416b1, an opening that passes through the insulators 418, 415, 410, 424, and 422 and the barrier film 417b2 and reaches the conductor 416b2, and an opening that passes through the insulators 418, 415, 410, 424, 422, and 408b and reaches the conductor 404b are formed by a lithography method.

As a method other than the above for forming the openings, the following steps may be employed: a conductor is formed over the insulator 418, an insulator is formed over the conductor, the conductor and the insulator are processed by a lithography method to form a hard mask including the conductor and the insulator, and etching is performed with the use of the hard mask as an etching mask, whereby openings are formed. When the hard mask is used as the etching mask, the opening can be prevented from extending laterally or deformation. Note that the hard mask may be a single layer of the insulator or the conductor.

The openings can be formed at once by performance of a lithography step. Alternatively, the openings may be formed separately by performance of lithography steps a plurality of times.

Next, the conductor 429a, the conductor 431a, the conductor 433a, the conductor 437a, the conductor 429b, the conductor 431b, and the conductor 437b are embedded in the openings.

After that, a conductor is formed over the insulator 418 and the conductors 429a, 431a, 433a, 437a, 429b, 431b, and 437b and processed by a lithography method or the like to form the conductor 430a in contact with a top surface of the conductor 429a, the conductor 432a in contact with a top surface of the conductor 431a, the conductor 434a in contact with a top surface of the conductor 433a, the conductor 438a in contact with a top surface of the conductor 437a, the conductor 430b in contact with a top surface of the conductor 429b, the conductor 432b in contact with a top surface of the conductor 431b, and the conductor 438b in contact with a top surface of the conductor 437b. Through the above steps, the semiconductor device 1000 including the transistor 100 illustrated in FIGS. 2A to 2C and the transistor 200 illustrated in FIGS. 3A to 3C can be manufactured (see FIGS. 2A to 2C and FIGS. 3A to 3C).

The structures, methods, and the like described in this embodiment can be combined with any of the structures, methods, and the like described in the other embodiments as appropriate. As described above, in this embodiment, the same material can be used for the oxide layers of the transistors 100 and 200. For example, the oxide 406_1a of the transistor 100 and the oxide 406_1b of the transistor 200 may be formed of the same material and the oxide 406_3a of the transistor 100 and the oxide 406_3b of the transistor 200 may be formed of the same material. As described above, since the transistor 100 and the transistor 200 include oxide layers formed of the same material, the number of masks and steps can be reduced when the transistor 100 and the transistor 200 are manufactured simultaneously.

(Embodiment 3)

<Structure of Semiconductor Device>

In this embodiment, an example of a semiconductor device including any of the transistors disclosed in this specification and the like will be described.

Figure 18:
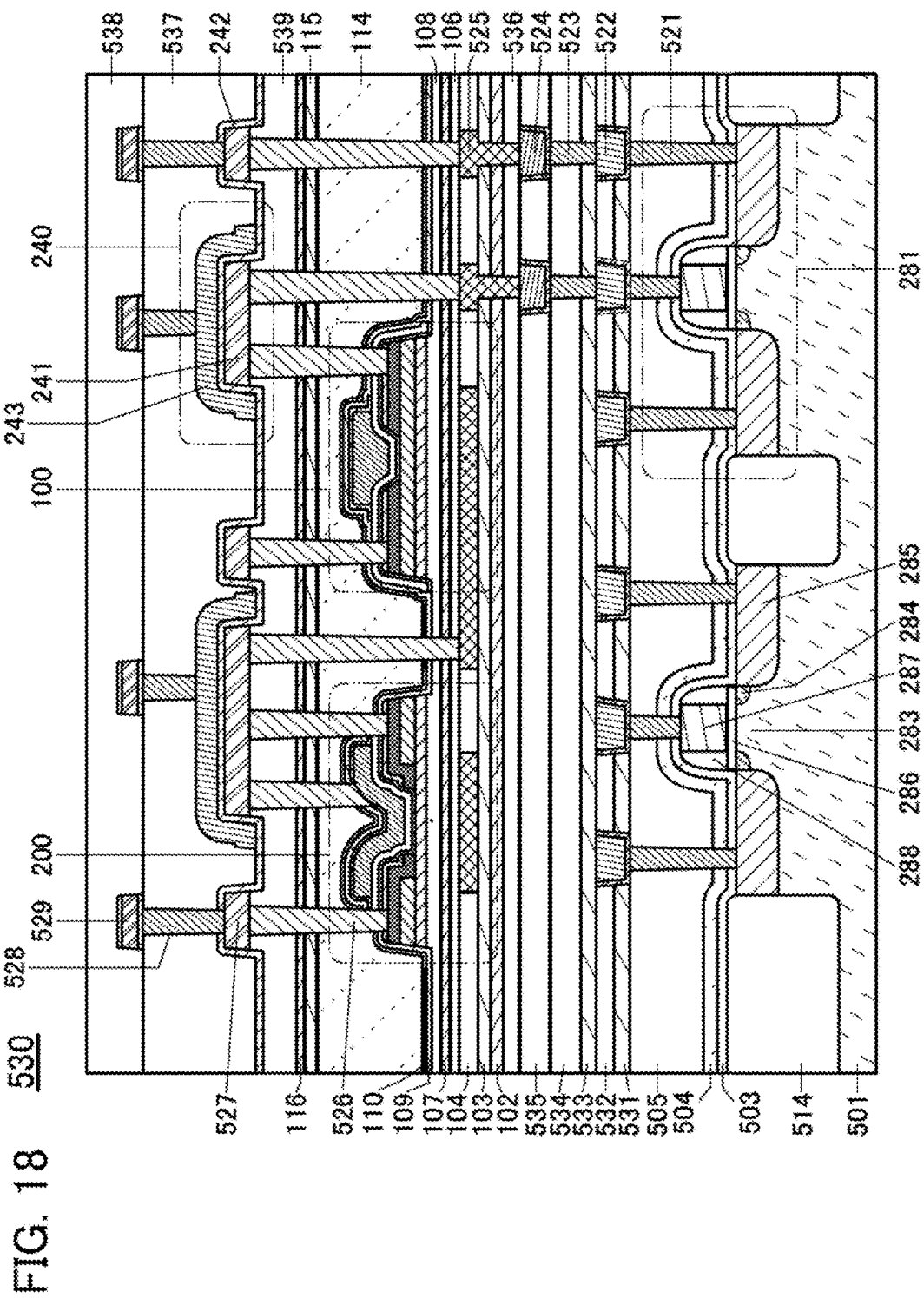
FIG. 18 illustrates a semiconductor device of one embodiment of the present invention.

FIG. 18 is a cross-sectional view of a semiconductor device 530. The semiconductor device 530 includes the transistor 100, the transistor 200, a transistor 281, and a capacitor 240.

In the semiconductor device 530, an n-type semiconductor is used for a substrate 501. The transistor 281 includes a channel formation region 283, high-concentration p-type impurity regions 285, an insulator 286, a conductor 287, and a sidewall 288. In regions overlapping with the sidewall 288 with the insulator 286 located therebetween, low-concentration p-type impurity regions 284 are provided. The insulator 286 can function as a gate insulator. The conductor 287 can function as a gate electrode. The channel formation region 283 of the transistor 281 is formed in part of the substrate 501.

The low-concentration p-type impurity regions 284 can be formed in such a manner that an impurity element is added with the use of the conductor 287 as a mask after formation of the conductor 287 and before the formation of the sidewall 288. In other words, the low-concentration p-type impurity regions 284 can be formed in a self-aligned manner. After the sidewall 288 is formed, the high-concentration p-type impurity regions 285 are formed. Note that the low-concentration p-type impurity regions 284 have the same conductivity type as the high-concentration p-type impurity regions 285, and have a lower concentration of the impurity imparting the conductivity type than the high-concentration p-type impurity regions 285. The low-concentration p-type impurity regions 284 are not necessarily provided depending on circumstances.

The transistor 281 is electrically isolated from other transistors by an element isolation layer 514. The element isolation layer can be formed by a local oxidation of silicon (LOCOS) method, a shallow trench isolation (STI) method, or the like.

In the semiconductor device 530, an insulator 531, an insulator 532, an insulator 533, an insulator 534, an insulator 535, and an insulator 536 are provided over an insulator 505 covering the transistor 281. In addition, the semiconductor device 530 includes a conductor 522 and a conductor 524 over the insulator 505.

The conductor 522 is provided to be embedded in the insulators 531 and 532. The conductor 522 is electrically connected to the transistor 281 through a conductor 521 provided in the insulators 503, 504, and 505.

The conductor 524 is provided to be embedded in the insulator 535. The conductor 524 is electrically connected to the conductor 522 through a conductor 523 provided in the insulators 533 and 534. The conductor 524 is electrically connected to an upper layer through a conductor 525 provided in the insulator 536 and insulators 102, 103, and 104.

The semiconductor device 530 includes the transistors 100 and 200 over the insulator 536 with the insulators 102 and 103 provided therebetween. An insulator 115, an insulator 116, and an insulator 539 are provided over the transistors 100 and 200, and a conductor 527 and a conductor 241 are provided over the insulator 539. An insulator 242 covering the conductors 527 and 241 is provided. Furthermore, a conductor 243 covering the conductor 241 is provided over the insulator 242.

A region where the conductor 241, the insulator 242, and the conductor 243 overlap with each other functions as the capacitor 240. By providing the conductor 243 to cover the conductor 241, not only a top surface but also side surfaces of the conductor 241 can function as the capacitor.

The conductor 527 is electrically connected to a source of the transistor 200 through a conductor 526 provided in part of the insulators 539, 116, 115, 114, 110, and 109, and the barrier film 417.

An insulator 537 is provided over the conductor 243 and the insulator 242, a conductor 529 is provided over the insulator 537, and an insulator 538 is provided over the conductor 529 and the insulator 537. The conductor 529 is electrically connected to the conductor 527 through a conductor 528 provided in part of the insulators 537 and 242.

The insulators 102, 103, 104, 106, 107, 108, 109, 110, 115, 116, 531, 532, 533, 534, 535, 536, 539, 242, 537, and 538 can be formed using a material and a method which are similar to those of the insulators described in the above embodiments and the like. The conductors 521, 522, 523, 524, 525, 526, 527, 241, 243, 528, and 529 can be formed using a material and a method which are similar to those of the conductors described in the above embodiments and the like.

The conductors 521, 522, 523, 524, 525, 526, 527, 528, and 529 may be formed by a damascene method, a dual damascene method, or the like.

<Example of Memory Element>

Figure 19A:
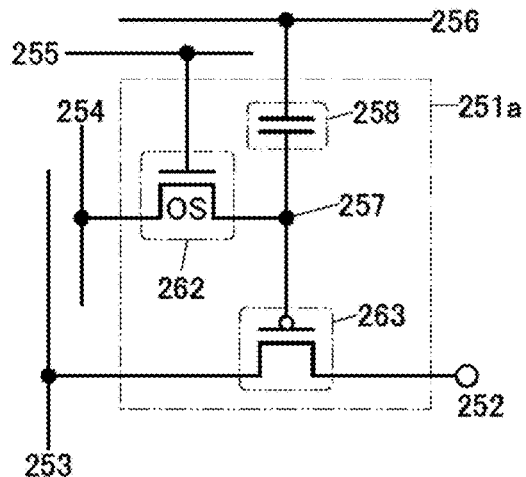
FIGS. 19A to 19D are each a circuit diagram of a semiconductor device of one embodiment of the present invention.

The circuit illustrated in FIG. 19A has a configuration of a memory element 251a in which one of a source and a drain of a transistor 262 is connected to a gate of a transistor 263 and one electrode of a capacitor 258. The circuit illustrated in FIG. 19B has a configuration of a memory element 261a in which one of the source and the drain of the transistor 262 is connected to one electrode of the capacitor 258.

In each of the memory elements 251a and 261a, charges injected through a wiring 254 and the transistor 262 can be retained at a node 257. The transistor 262 is an OS transistor, which enables charges to be retained at the node 257 for a long time.

The memory element 251a includes the transistor 263. Although the transistor 263 is a p-channel transistor in FIG. 19A, the transistor 263 may be an n-channel transistor. For example, the transistor 281 illustrated in FIG. 18 may be used as the transistor 263. The transistor 263 may be an OS transistor.

The memory element 251a illustrated in FIG. 19A and the memory element 261a illustrated in FIG. 19B will be described in detail here.

The memory element 251a includes the transistor 263 using a first semiconductor, the transistor 262 using a second semiconductor, and the capacitor 258.

As the transistor 262, any of the OS transistors disclosed in the above embodiments can be used. When a transistor having a low off-state current is used as the transistor 262, data can be retained at the node 257 for a long time. In other words, power consumption of the memory element 251a can be reduced because refresh operation becomes unnecessary or the frequency of refresh operation can be extremely low.

In FIG. 19A, a wiring 252 is electrically connected to one of a source and a drain of the transistor 263, and a wiring 253 is electrically connected to the other of the source and the drain of the transistor 263. The gate of the transistor 263, the one of the source and the drain of the transistor 262, and the one electrode of the capacitor 258 are electrically connected to the node 257. The wiring 254 is electrically connected to the other of the source and the drain of the transistor 262, and a wiring 255 is electrically connected to a gate of the transistor 262. A wiring 256 is electrically connected to the other electrode of the capacitor 258.

The memory element 251a illustrated in FIG. 19A has a feature that the charges supplied to the node 257 can be retained, and thus enables writing, retaining, and reading of data as follows.

[Writing and Retaining Operations]

Data writing and retaining operations of the memory element 251a will be described. First, the potential of the wiring 255 is set to a potential at which the transistor 262 is on. Accordingly, the potential of the wiring 254 is supplied to the node 257. That is, a predetermined charge is supplied to the node 257 (writing operation). Here, one of two kinds of charges providing different potential levels (hereinafter also referred to as a "low-level charge" and a "high-level charge") is supplied. After that, the potential of the wiring 255 is set to a potential at which the transistor 262 is off. Thus, the charge is retained at the node 257 (retaining operation).

Note that the high-level charge is a charge for supplying a higher potential to the node 257 than the low-level charge. In the case where the transistor 263 is a p-channel transistor, each of the high-level and low-level charges is a charge for supplying a potential higher than the threshold voltage of the transistor 263. In the case where the transistor 263 is an n-channel transistor, each of the high-level and low-level charges is a charge for supplying a potential lower than the threshold voltage of the transistor 263. In other words, each of the high-level and low-level charges is a charge for supplying a potential at which the transistor 263 is off.

[Reading Operation 1]

Next, a data reading operation will be described. A reading potential $V_R$ is supplied to the wiring 256 while a predetermined potential (a constant potential) different from the potential of the wiring 253 is supplied to the wiring 252, whereby data retained at the node 257 can be read.

The reading potential $V_R$ is set to $\{(V_{th}-V_H)+(V_{th}+V_L)\}/2$, where $V_H$ is the potential supplied in the case of the high-level charge and $V_L$ is the potential supplied in the case of the low-level charge. Note that the potential of the wiring 256 in a period during which data is not read is set to be higher than $V_H$ in the case where the transistor 263 is a p-channel transistor, and is set to be lower than $V_L$ in the case where the transistor 263 is an n-channel transistor.

For example, in the case where the transistor 263 is a p-channel transistor, $V_R$ is −2 V when the $V_{th}$ of the transistor 263 is −2 V, $V_H$ is 1 V, and $V_L$ is −1 V. When the potential written to the node 257 is $V_H$ and $V_R$ is applied to the wiring 256, $V_R+V_H$, i.e., −1 V, is applied to the gate of the transistor 263. Since −1 V is higher than $V_{th}$, the transistor 263 is not turned on. Thus, the potential of the wiring 253 is not changed. When the potential written to the node 257 is $V_L$ and $V_R$ is applied to the wiring 256, $V_R+V_L$, i.e., −3 V, is applied to the gate of the transistor 263. Since −3 V is lower than $V_{th}$, the transistor 263 is turned on. Thus, the potential of the wiring 253 is changed.

In the case where the transistor 263 is an n-channel transistor, $V_R$ is 2 V when the $V_{th}$ of the transistor 263 is 2 V, $V_H$ is 1 V, and $V_L$ is −1 V. When the potential written to the node 257 is $V_H$ and $V_R$ is applied to the wiring 256, $V_R+V_H$, i.e., 3 V, is applied to the gate of the transistor 263. Since 3 V is higher than $V_{th}$, the transistor 263 is turned on. Thus, the potential of the wiring 253 is changed. When the potential written to the node 257 is $V_L$ and $V_R$ is applied to the wiring 256, $V_R+V_L$, i.e., 1 V, is applied to the gate of the transistor 263. Since 1 V is lower than $V_{th}$, the transistor 263 is not turned on. Thus, the potential of the wiring 253 is not changed.

Therefore, the data retained in the node 257 can be read by determining the potential of the wiring 253.

Figure 19B:
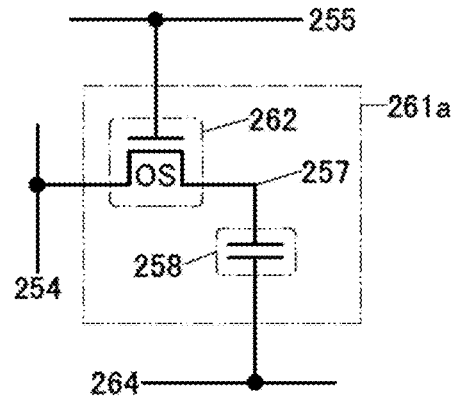

The memory element 261*a* illustrated in FIG. 19B is different from the memory element 251*a* in that the transistor 263 is not provided. The other electrode of the capacitor 258 is electrically connected to a wiring 264. The potential of the wiring 264 may be any potential as long as it is a fixed potential. For example, the wiring 264 may be supplied with GND. Data can be written to the memory element 261*a* in a manner similar to that of the memory element 251*a*.

[Reading Operation 2]

A data reading operation of the memory element 261*a* will be described. When a potential at which the transistor 262 is turned on is supplied to the wiring 255, the wiring 254 which is in a floating state and the capacitor 258 are brought into conduction, and the charge is redistributed between the wiring 254 and the capacitor 258. As a result, the potential of the wiring 254 is changed. The amount of change in the potential of the wiring 254 varies depending on the potential of the node 257 (or the charge accumulated in the node 257).

For example, the potential of the wiring 254 after the charge redistribution is $(C_B \times V_{B0} + C \times V)/(C_B + C)$, where V is the potential of the node 257, C is the capacitance of the capacitor 258, $C_B$ is the capacitance component of the wiring 254, and $V_{B0}$ is the potential of the wiring 254 before the charge redistribution. Thus, it can be found that, assuming that the memory cell is in either of two states in which the potential of the node 257 is $V_1$ and $V_0$ ($V_1 > V_0$), the potential of the wiring 254 in the case of retaining the potential $V_1$ ($=(C_B \times V_{B0} + C \times V_1)/(C_B + C)$) is higher than the potential of the wiring 254 in the case of retaining the potential $V_0$ ($=(C_B \times V_{B0} + C \times V_0)/(C_B + C)$).

Then, the data retained in the node 257 can be read by comparing the potential of the wiring 254 with a predetermined potential.

When a transistor using an oxide semiconductor and having an extremely low off-state current is used in the memory element described above, stored data can be retained for a long time. In other words, power consumption of the semiconductor device can be reduced because refresh operation becomes unnecessary or the frequency of refresh operation can be extremely low. Moreover, stored data can be retained for a long time even when power is not supplied (note that a potential is preferably fixed).

In the memory element, high voltage is not needed for data writing and deterioration of the element is less likely to occur. Unlike in a conventional nonvolatile memory, for example, it is not necessary to inject and extract electrons into and from a floating gate; thus, a problem such as deterioration of an insulator is not caused. That is, the memory element of one embodiment of the present invention does not have a limit on the number of times data can be rewritten, which is a problem of a conventional nonvolatile memory, and the reliability thereof is drastically improved. Furthermore, data is written depending on the state of the transistor (on or off), whereby high-speed operation can be achieved.

Figure 19C:
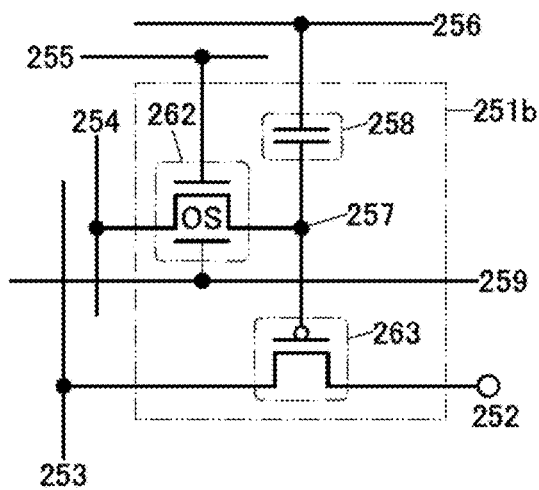
Figure 19D:
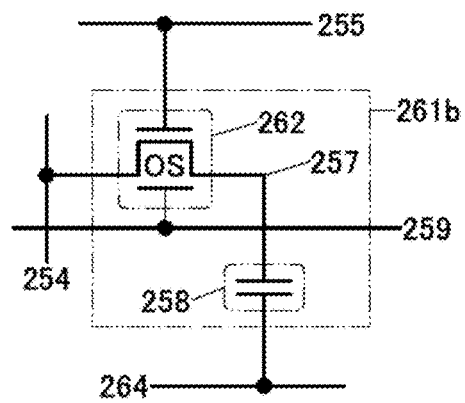

The transistor 262 may be a transistor including a back gate. By controlling the potential supplied to the back gate, the threshold voltage of the transistor 262 can be appropriately changed. A memory element 251*b* illustrated in FIG. 19C has substantially the same circuit configuration as the memory element 251*a*. The memory element 251*b* is different from the memory element 251*a* in that a transistor including a back gate is used as the transistor 262. A memory element 261*b* illustrated in FIG. 19D has substantially the same circuit configuration as the memory element 261*a*. The memory element 261*b* is different from the memory element 261*a* in that a transistor including a back gate is used as the transistor 262.

In each of the memory elements 251*b* and 261*b*, the back gate of the transistor 262 is electrically connected to a wiring 259. By controlling the potential supplied to the wiring 259, the threshold voltage of the transistor 262 can be appropriately changed.

<Examples of Memory Device>

FIGS. 20A and 20B are circuit diagrams showing examples of a memory device including any of the above memory elements. A memory device 300 illustrated in FIG. 20A includes a memory circuit 350 and a voltage retention circuit 320. A memory device 300*a* illustrated in FIG. 20B includes a memory circuit 350*a* and the voltage retention circuit 320. The memory circuits 350 and 350*a* each include a plurality of memory elements. FIGS. 20A and 20B illustrate the case where three memory elements 261*b* (memory elements 261*b*_1 to 261*b*_3) are provided.

In the memory device 300 illustrated in FIG. 20A, the memory element 261*b*_1 included in the memory circuit 350 is electrically connected to a wiring 255_1 and a wiring 254_1. The memory element 261*b*_2 included in the memory circuit 350 is electrically connected to a wiring 255_2 and a wiring 254_2. The memory element 261*b*_3 included in the memory circuit 350 is electrically connected to a wiring 255_3 and a wiring 254_3. The memory elements 261*b*_1 to 261*b*_3 included in the memory circuit 350 are electrically connected to the wiring 264.

In the memory device 300*a* illustrated in FIG. 20B, the memory elements 261*b*_1 to 261*b*_3 included in the memory circuit 350*a* are electrically connected to the wiring 255. The memory element 261*b*_1 included in the memory circuit 350*a* is electrically connected to the wiring 254_1 and a wiring 264_1. The memory element 261*b*_2 included in the memory circuit 350*a* is electrically connected to the wiring 254_2 and a wiring 264_2. The memory element 261*b*_3 included in the memory circuit 350*a* is electrically connected to the wiring 254_3 and a wiring 264_3.

Note that the above description of the memory element 261*b* can be referred to for configurations, operations, and the like of the memory elements 261*b*_1 to 261*b*_3. Thus, detailed description is omitted here.

The voltage retention circuit 320 includes a transistor 323 and a capacitor 324. In FIGS. 20A and 20B, one of a source and a drain of the transistor 323 is electrically connected to a terminal 321. The other of the source and the drain, a gate, and a back gate of the transistor 323 are electrically connected to the wiring 259. One electrode of the capacitor 324 is electrically connected to the wiring 259. The other electrode of the capacitor 324 is electrically connected to a wiring 322.

Although the other of the source and the drain, the gate, and the back gate of the transistor 323 of one embodiment of the present invention are electrically connected to the wiring 259 in FIGS. 20A and 20B, only the other of the source and the drain and the back gate of the transistor 323 may be electrically connected to the wiring 259 and the gate of the transistor 323 may be controlled independently.

The transistor 323 of one embodiment of the present invention is not limited to the above-described structure. For example, the transistor 323 may be a transistor that does not include a gate and operates only with a back gate.

Hereinafter, the one of the source and the drain and the other of the source and the drain of the transistor 323 are referred to as a source and a drain, respectively.

In the memory devices 300 and 300a, the potential of the wiring 259 can be changed by controlling the potential of the wiring 322. In the reading operation and the writing operation of the memory devices 300 and 300a, a potential is supplied to the wiring 322 so that the potential of the wiring 259 is higher than a negative potential (a potential lower than GND) described later and lower than a potential corresponding to the $V_{th}$ of the transistor 262 (a potential at which the transistor 262 is turned on).

In the case where gates of the transistors 262 in the memory elements 261b_1 to 261b_3 are electrically connected to each other as in the memory device 300a, the potential of the wiring 259 may be higher than or equal to a potential corresponding to the $V_{th}$ of the transistor 262.

By controlling the potential of the wiring 259, the operation speed of the transistor 262 can be increased. Furthermore, the apparent $V_{th}$ of the transistor 262 can be decreased. Thus, the data writing speed and the data reading speed can be increased.

In the retention operation of the memory circuit 350 (memory circuit 350a), a fixed potential is supplied to the wiring 322. For example, GND is supplied. After that, a negative potential (a potential lower than GND) is supplied to the terminal 321. When a negative potential is supplied to the terminal 321, the gate potential of the transistor 323 becomes relatively high, so that the transistor 323 is turned on. Consequently, the negative potential is supplied to the wiring 259 through the transistor 323. More accurately, the wiring 259 is supplied with a potential higher than the negative potential by the $V_{th}$ of the transistor 323. Note that the wiring 259 is supplied with the negative potential in this embodiment and the like for easy understanding.

When the wiring 259 is supplied with a negative potential, the back gate potential of the transistor 262 is decreased, and the transistor 262 is turned off; thus, data written to the memory circuit 350 is retained. Furthermore, by supplying the negative potential to the back gate of the transistor 262, the apparent $V_{th}$ of the transistor 262 is increased. Thus, even when the gate potential of the transistor 262 is changed, data written to the memory circuit 350 (memory circuit 350a) can be retained.

Next, a potential higher than or equal to GND is supplied to the terminal 321. For example, GND is supplied. Since the potential of the wiring 259 is a negative potential, the gate potential of the transistor 323 becomes a negative potential. Accordingly, the transistor 323 is turned off. Even when power supply to the memory device 300 (memory device 300a) is stopped after that, the transistors 323 and 262 can remain off.

The voltage retention circuit 320 has a function of suppressing a change in the potential of the wiring 259 in the retention operation of the memory device 300 (memory device 300a). The voltage retention circuit 320 has a function of suppressing a change in the potential of the wiring 259 even when power supply to the memory device 300 (memory device 300a) is stopped. In other words, the voltage retention circuit 320 has a function of retaining the potential of the wiring 259. The transistor 323 is preferably a transistor having a low off-state current because it retains the potential of the wiring 259. For example, when the capacitance of the capacitor 324 is 10 pF and an acceptable increase in the potential of the wiring 259 is 0.5 V, a period during which the potential of the wiring 259 is increased by 0.5 V is an hour in the case where the off-state current of the transistor 323 is $1.39 \times 10^{-15}$ A, a day in the case where the off-state current of the transistor 323 is $5.79 \times 10^{-17}$ A, a year in the case where the off-state current of the transistor 323 is $1.59 \times 10^{-19}$ A, and ten years in the case where the off-state current of the transistor 323 is $1.59 \times 10^{-20}$ A. When the off-state current of the transistor 323 is smaller than or equal to $1.59 \times 10^{-20}$ A, data written to the memory circuit 350 (memory circuit 350a) can be retained for ten years or more.

For example, by using an OS transistor as the transistor 323, a transistor having an extremely low off-state current can be obtained. In order to reduce the off-state current, the transistor 323 preferably has a long channel length. Alternatively, the transistor 323 preferably has a short channel width. Alternatively, the transistor 323 preferably has a channel length longer than a channel width.

The transistor 323 particularly preferably has a low off-state current at $V_g$ of 0 V. Thus, a transistor having high $V_{th}$ is preferably used as the transistor 323. As the transistor having high $V_{th}$, the transistor 200 or the like described above can be used. As the transistor 262, which performs data writing and data reading, a transistor having a low $V_{th}$ is preferably used. Furthermore, as the transistor 262, a transistor having a high on-state current and high field-effect mobility is preferably used. As the transistor 262, the transistor 100 or the like described above can be used.

Figure 21:
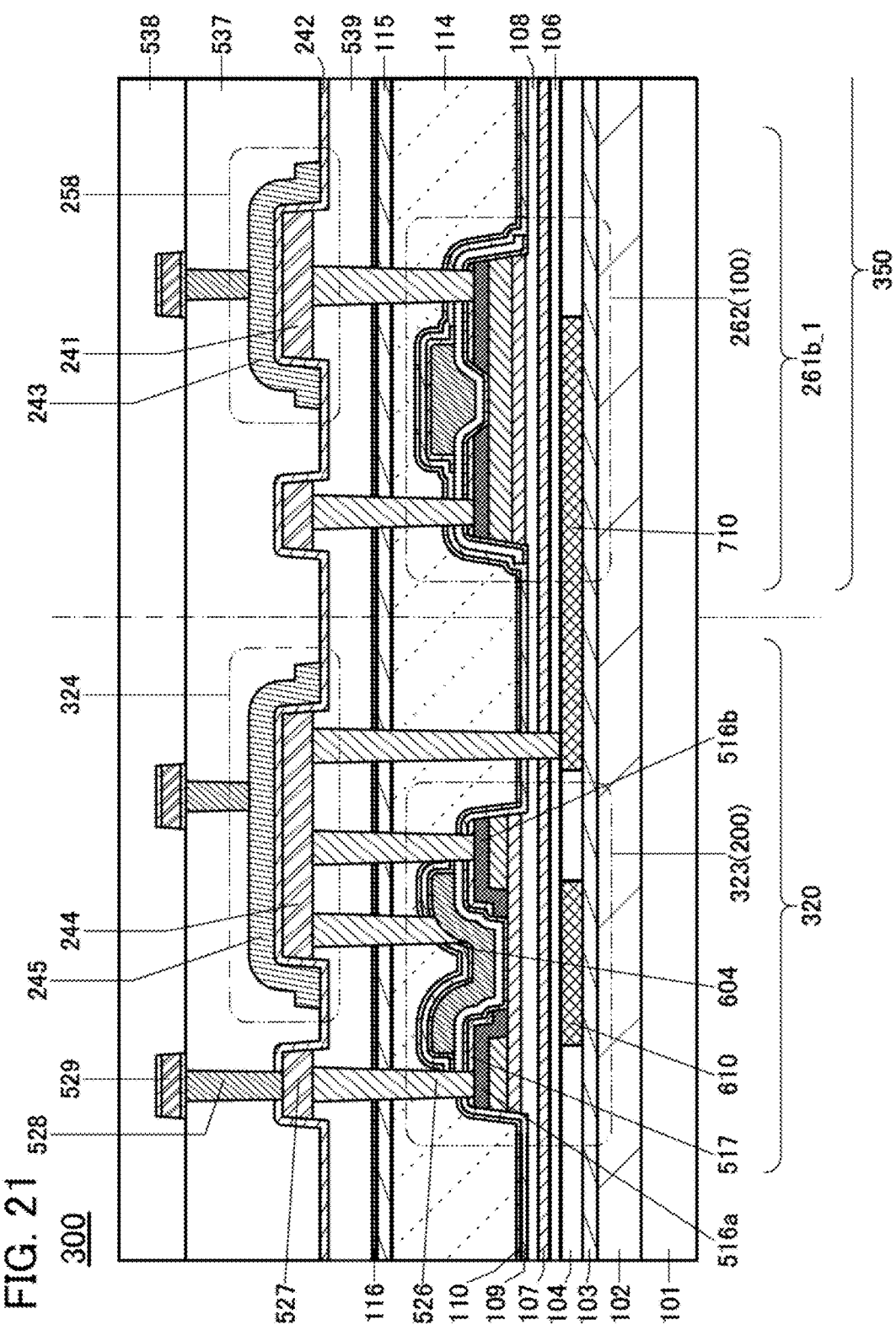
FIG. 21 illustrates a memory device of one embodiment of the present invention.

FIG. 21 is a cross-sectional view illustrating part of a cross-sectional structure of the memory device 300 in the case where the transistor 100 is used as the transistor 262 of the memory circuit 350 and the transistor 200 is used as the transistor 323 of the voltage retention circuit 320.

In FIG. 21, the memory device 300 includes the transistor 262 and the transistor 323 over a substrate 101 with the insulator 102 and the insulator 103 provided therebetween, the insulator 115, the insulator 116, and the insulator 539 over the transistor 262 and the transistor 323, the conductor 241, a conductor 244, and the conductor 527 over the insulator 539, the insulator 242 covering the conductor 241, the conductor 244, and the conductors 527, and the conductor 243 covering the conductor 241 and a conductor 245 covering the conductor 244 over the insulator 242.

A region where the conductor 241, the insulator 242, and the conductor 243 overlap with each other functions as the capacitor 258. By providing the conductor 243 to cover the conductor 241, not only the top surface but also the side surfaces of the conductor 241 can function as the capacitor. A region where the conductor 244, the insulator 242, and the conductor 245 overlap with each other functions as the capacitor 324. By providing the conductor 245 to cover the conductor 244, not only a top surface but also side surfaces of the conductor 244 can function as the capacitor.

The conductor 527 is electrically connected to the source of the transistor 323 (a conductor 516a) through the conductor 526 provided in part of the insulators 539, 116, 115, 114, 110, and 109 and a barrier film 517.

The insulator 537 is provided over the conductors 243 and 245 and the insulator 242, the conductor 529 is provided over the insulator 537, and the insulator 538 is provided over the insulator 537 and the conductor 529. The conductor 529 is electrically connected to the conductor 527 through the conductor 528 provided in part of the insulator 537 and the insulator 242.

The drain (a conductor 516b) of the transistor 323 is electrically connected to the gate (a conductor 604) of the transistor 323 and the back gate (a conductor 710) of the transistor 262. Although not illustrated, the drain (the conductor 516b) and the gate (the conductor 604) of the transistor 323 and are electrically connected also to the back gate (a conductor 610) of the transistor 323.

Although the drain (the conductor 516b) and the gate (the conductor 604) of the transistor 323 are electrically connected to each other in FIG. 21, the gate (the conductor 604) of the transistor 323 may be controlled independently in one embodiment of the present invention. In this case, the drain (the conductor 516b) and the back gate (the conductor 610) of the transistor 323 and the back gate (the conductor 710) of the transistor 262 are electrically connected to each other and the gate (the conductor 604) of the transistor 323 is controlled separately.

Although the transistor 323 includes the gate (the conductor 604) in FIG. 21, the transistor 323 does not necessarily include the gate (the conductor 604) in one embodiment of the present invention. In this case, the drain (the conductor 516b) and the back gate (the conductor 610) of the transistor 323 and the back gate (the conductor 710) of the transistor 262 are electrically connected to each other.

The insulators 102, 103, 104, 106, 107, 108, 109, 110, 115, 116, 242, 539, 537, and 538 can be formed using a material and a method which are similar to those of the insulators described in the above embodiments and the like. The conductors 526, 527, 241, 243, 244, 245, 528, and 529 can be formed using a material and a method which are similar to those of the conductors described in the above embodiments and the like. The conductors 241, 244, and 527 can be formed through the same steps at the same time. The conductors 243 and 245 can be formed through the same steps at the same time.

According to one embodiment of the present invention, transistors having different electrical characteristics can be manufactured through substantially the same process. That is, according to one embodiment of the present invention, a memory device with high producibility can be provided. According to one embodiment of the present invention, a memory device which can retain data for a long time even when power supply is stopped can be provided. For example, a memory device which can retain data for a year or more, ten years or more after power supply is stopped can be provided. Thus, a memory device of one embodiment of the present invention can be regarded as a nonvolatile memory.

As described above, the structures, methods, and the like described in this embodiment can be combined with any of the structures, methods, and the like described in the other embodiments as appropriate.

(Embodiment 4)
<Electronic Device>

A semiconductor device of one embodiment of the present invention can be used for a variety of electronic devices. FIGS. 22A to 22G illustrate specific examples of the electronic devices including the semiconductor device of one embodiment of the present invention.

Figure 22A:
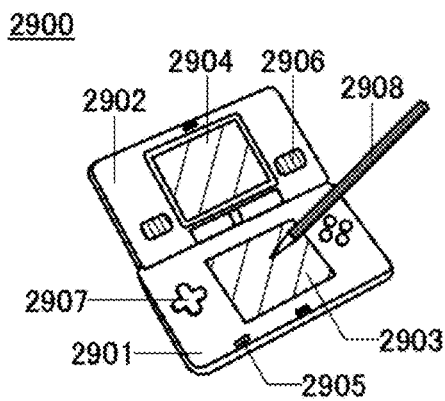
FIGS. 22A to 22G illustrate electronic devices of embodiments of the present invention.

A portable game machine 2900 illustrated in FIG. 22A includes a housing 2901, a housing 2902, a display portion 2903, a display portion 2904, a microphone 2905, a speaker 2906, an operation switch 2907, and the like. In addition, the portable game machine 2900 includes an antenna, a battery, and the like inside the housing 2901. Although the portable game machine in FIG. 22A has the two display portions 2903 and 2904, the number of display portions is not limited to this. The display portion 2903 is provided with a touch screen as an input device, which can be handled with a stylus 2908 or the like.

Figure 22B:
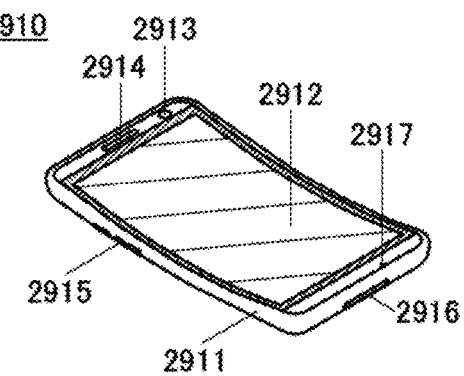

An information terminal 2910 illustrated in FIG. 22B includes a housing 2911, a display portion 2912, a microphone 2917, a speaker portion 2914, a camera 2913, an external connection portion 2916, an operation switch 2915, and the like. A display panel and a touch screen that use a flexible substrate are provided in the display portion 2912. In the housing 2911 of the information terminal 2910, an antenna, a battery, and the like are provided. The information terminal 2910 can be used as, for example, a smartphone, a mobile phone, a tablet information terminal, a tablet personal computer, or an e-book reader.

Figure 22C:
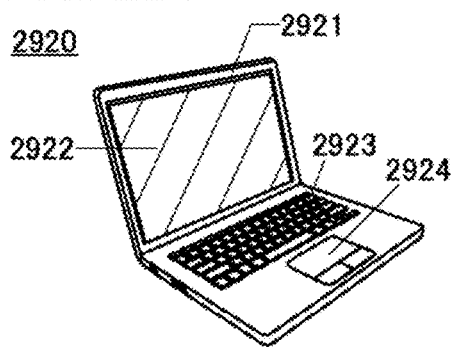

A notebook personal computer 2920 illustrated in FIG. 22C includes a housing 2921, a display portion 2922, a keyboard 2923, a pointing device 2924, and the like. In the housing 2921 of the notebook personal computer 2920, an antenna, a battery, and the like are provided.

Figure 22D:
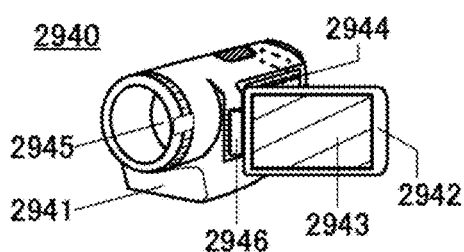

A video camera 2940 illustrated in FIG. 22D includes a housing 2941, a housing 2942, a display portion 2943, operation switches 2944, a lens 2945, a joint 2946, and the like. The operation switches 2944 and the lens 2945 are provided for the housing 2941, and the display portion 2943 is provided for the housing 2942. In the housing 2941 of the video camera 2940, an antenna, a battery, and the like are provided. The housing 2941 and the housing 2942 are connected to each other with the joint 2946, and the angle between the housing 2941 and the housing 2942 can be changed with the joint 2946. The orientation of an image on the display portion 2943 may be changed and display and non-display of an image can be switched depending on the angle between the housings 2941 and 2942.

Figure 22E:
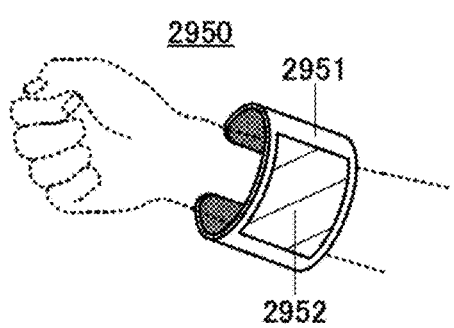

FIG. 22E illustrates an example of a bangle-type information terminal. An information terminal 2950 includes a housing 2951, a display portion 2952, and the like. In the housing 2951 of the information terminal 2950, an antenna, a battery, and the like are provided. The display portion 2952 is supported by the housing 2951 having a curved surface. A display panel formed with a flexible substrate is provided in the display portion 2952, whereby the information terminal 2950 can be a user-friendly information terminal that is flexible and lightweight.

Figure 22F:
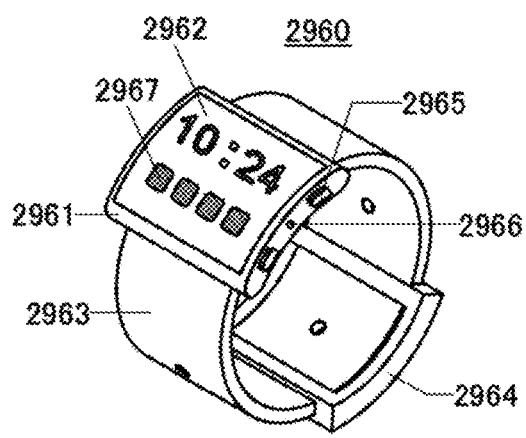

FIG. 22F illustrates an example of a watch-type information terminal. An information terminal 2960 includes a housing 2961, a display portion 2962, a band 2963, a buckle 2964, an operation switch 2965, an input/output terminal 2966, and the like. In the housing 2961 of the information terminal 2960, an antenna, a battery, and the like are provided. The information terminal 2960 is capable of executing a variety of applications such as mobile phone calls, e-mailing, viewing and editing texts, music reproduction, Internet communication, and a computer game.

The display surface of the display portion 2962 is curved, and images can be displayed on the curved display surface. In addition, the display portion 2962 includes a touch sensor, and operation can be performed by touching the screen with a finger, a stylus, or the like. For example, by touching an icon 2967 displayed on the display portion 2962, application can be started. With the operation switch 2965, a variety of functions such as time setting, power on/off, on/off of wireless communication, setting and cancellation of a silent mode, and setting and cancellation of a power saving mode can be performed. For example, the functions of the operation switch 2965 can be set by setting the operation system incorporated in the information terminal 2960.

The information terminal 2960 can employ near field communication that is a communication method based on an existing communication standard. In that case, for example, mutual communication between the information terminal 2960 and a headset capable of wireless communication can be performed, and thus hands-free calling is possible. Moreover, the information terminal 2960 includes the input/output terminal 2966, and data can be directly transmitted to and received from another information terminal via a connector. In addition, charging via the input/output terminal 2966 is possible. Note that the charging operation may be performed by wireless power feeding without using the input/output terminal 2966.

Figure 22G:
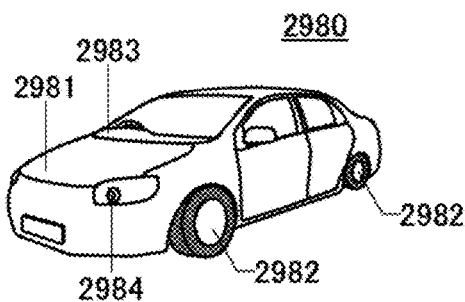

FIG. 22G is an external view illustrating an example of a car. A car 2980 includes a car body 2981, wheels 2982, a dashboard 2983, lights 2984, and the like. The car 2980 also includes an antenna, a battery, and the like.

The above electronic devices each have a storage function of retaining control data, a control program, or the like. Therefore, for example, when a memory device including the semiconductor device of one embodiment of the present invention is included in the above electronic device, the above electronic device can retain control data, a control program, or the like for a long time. With the use of the semiconductor device of one embodiment of the present invention, an electronic device having favorable reliability can be provided.

As described above, the structures, methods, and the like described in this embodiment can be combined with any of the structures, methods, and the like described in the other embodiments as appropriate.

This application is based on Japanese Patent Application Serial No. 2016-155376 filed with Japan Patent Office on Aug. 8, 2016, the entire contents of which are hereby incorporated by reference.

What is claimed is:

1. A semiconductor device, comprising:
    a first transistor comprising:
        a first gate electrode;
        a first gate insulator over the first gate electrode;
        a first oxide over the first gate insulator;
        a second oxide and a third oxide over and in contact with the first oxide;
        a first conductor over the second oxide;
        a second conductor over the third oxide;
        a fourth oxide over the first oxide, the first conductor, and the second conductor;
        a second gate insulator over the fourth oxide; and
        a second gate electrode over the second gate insulator; and
    a second transistor comprising:
        a third gate electrode;
        a third gate insulator over the third gate electrode;
        a fifth oxide over the third gate insulator;
        a sixth oxide over and in contact with the fifth oxide;
        a third conductor and a fourth conductor over and in contact with the sixth oxide;
        a seventh oxide over the sixth oxide, the third conductor, and the fourth conductor;
        a fourth gate insulator over the seventh oxide; and
        a fourth gate electrode over the fourth gate insulator,
    wherein the first conductor is in contact with a first part of a top surface of the first oxide between the second oxide and the third oxide,
    wherein the second conductor is in contact with a second part of the top surface of the first oxide between the second oxide and the third oxide,
    wherein the fourth oxide is in contact with a third part of the top surface of the first oxide between the first conductor and the second conductor,
    wherein the seventh oxide is in contact with a part of the top surface of the sixth oxide between the third conductor and the fourth conductor,
    wherein the first oxide, the second oxide, the third oxide, the fourth oxide, the fifth oxide, the sixth oxide and the seventh oxide each contain a metal oxide,
    wherein composition of the first oxide is different from composition of the sixth oxide,
    wherein a channel formation region of the first transistor is in the first oxide, and
    wherein a channel formation region of the second transistor is in the sixth oxide.

2. The semiconductor device according to claim 1,
    wherein the first conductor is in contact with a top surface of the second oxide and a first side surface of the second oxide,
    wherein the second conductor is in contact with a top surface of the third oxide and a first side surface of the third oxide, and
    wherein the first side surface of the second oxide and the first side surface of the third oxide faces each other.

3. The semiconductor device according to claim 1,
    wherein a bandgap of the fourth oxide is wider than each of a bandgap of the first oxide, a bandgap of the second oxide, and a bandgap of the third oxide,
    wherein a bandgap of the seventh oxide is wider than each of a bandgap of the fifth oxide and a bandgap of sixth oxide, and
    wherein the bandgap of the first oxide is wider than the bandgap of the sixth oxide.

4. The semiconductor device according to claim 1,
    wherein the first oxide and the fifth oxide have a same composition,
    wherein the second oxide, the third oxide, and the sixth oxide have a same composition, and
    wherein the fourth oxide and the seventh oxide have a same composition.

5. The semiconductor device according to claim 1,
    wherein the first oxide, the second oxide, the third oxide, the fifth oxide and the sixth oxide each contain In, Ga and Zn,
    wherein the fourth oxide and the seventh oxide each contain Ga,
    wherein contents of Ga in each of the fourth oxide and the seventh oxide are larger than contents of Ga in each of the first oxide, the second oxide, the third oxide, the fifth oxide, and the sixth oxide.

6. The semiconductor device according to claim 1,
    wherein the first gate electrode, one of the first conductor and the second conductor, and the third gate electrode are electrically connected to each other.

7. The semiconductor device according to claim 1,
    wherein the first gate electrode, one of the first conductor and the second conductor, the second gate electrode, and the third gate electrode are electrically connected to each other.

8. The semiconductor device according to claim 1,
    wherein a threshold voltage of the first transistor is higher than a threshold voltage of the second transistor.

* * * * *